(12) United States Patent
Mikawa et al.

(10) Patent No.: US 9,518,337 B2
(45) Date of Patent: Dec. 13, 2016

(54) METHOD FOR PRODUCING NITRIDE CRYSTAL AND NITRIDE CRYSTAL

(71) Applicant: MITSUBISHI CHEMICAL CORPORATION, Chiyoda-ku (JP)

(72) Inventors: Yutaka Mikawa, Ushiku (JP); Hideo Fujisawa, Ushiku (JP); Kazunori Kamada, Ushiku (JO); Hirobumi Nagaoka, Ushiku (JP); Shinichiro Kawabata, Ushiku (JP); Yuji Kagamitani, Ushiku (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 14/713,894

(22) Filed: May 15, 2015

(65) Prior Publication Data
US 2015/0247256 A1    Sep. 3, 2015

Related U.S. Application Data

(63) Continuation of application No. 13/661,090, filed on Oct. 26, 2012, now Pat. No. 9,096,945.

(Continued)

(30) Foreign Application Priority Data

Feb. 9, 2012  (JP) ................................. 2012-025711
Aug. 28, 2012  (JP) ................................. 2012-188099

(51) Int. Cl.
| | | |
|---|---|---|
| C01B 21/06 | (2006.01) | |
| C30B 29/40 | (2006.01) | |
| C30B 7/10 | (2006.01) | |

(52) U.S. Cl.
CPC ........... C30B 7/105 (2013.01); C01B 21/0632 (2013.01); C30B 29/403 (2013.01); C30B 29/406 (2013.01);

(Continued)

(58) Field of Classification Search
None
See application file for complete search history.

(56) References Cited

U.S. PATENT DOCUMENTS

| | | | |
|---|---|---|---|
| 2003/0086856 A1* | 5/2003 | D'Evelyn et al. | 423/409 |
| 2008/0193363 A1* | 8/2008 | Tsuji | 423/409 |

(Continued)

FOREIGN PATENT DOCUMENTS

| | | |
|---|---|---|
| JP | 2000-44400 A | 2/2000 |
| JP | 2003-277182 A | 10/2003 |

(Continued)

OTHER PUBLICATIONS

Translation of JP2012-144424; Feb. 2016.*

(Continued)

*Primary Examiner* — Guinever S Gregorio
(74) *Attorney, Agent, or Firm* — Oblon, McClelland, Maier & Neustadt, L.L.P.

(57) ABSTRACT

A high-quality nitride crystal can be produced efficiently by charging a nitride crystal starting material that contains tertiary particles having a maximum diameter of from 1 to 120 mm and formed through aggregation of secondary particles having a maximum diameter of from 100 to 1000 μm, in the starting material charging region of a reactor, followed by crystal growth in the presence of a solvent in a supercritical state and/or a subcritical state in the reactor, wherein the nitride crystal starting material is charged in the starting material charging region in a bulk density of from 0.7 to 4.5 g/cm³ for the intended crystal growth.

20 Claims, 5 Drawing Sheets

Related U.S. Application Data

(60) Provisional application No. 61/552,801, filed on Oct. 28, 2011.

(52) U.S. Cl.
CPC ........ *C01P 2004/50* (2013.01); *C01P 2006/90* (2013.01); *Y10T 428/2982* (2015.01)

(56) References Cited

U.S. PATENT DOCUMENTS

| | | |
|---|---|---|
| 2010/0031876 A1 | 2/2010 | D'Evelyn |
| 2010/0111808 A1 | 5/2010 | Pimputkar et al. |
| 2011/0268645 A1 | 11/2011 | Mikawa et al. |
| 2012/0237431 A1 | 9/2012 | Mikawa et al. |
| 2012/0251431 A1 | 10/2012 | Fujisawa et al. |

FOREIGN PATENT DOCUMENTS

| | | |
|---|---|---|
| JP | 2005-508822 A | 4/2005 |
| JP | 2005-289797 A | 10/2005 |
| JP | 2005-530674 A | 10/2005 |
| JP | 2005-531154 A | 10/2005 |
| JP | 2006-83055 A | 3/2006 |
| JP | 2006-509707 A | 3/2006 |
| JP | 2006-103998 A | 4/2006 |
| JP | 2007-169075 A | 7/2007 |
| JP | 2007-238347 A | 9/2007 |
| JP | 2007-238348 A | 9/2007 |
| JP | 2008-174439 A | 7/2008 |
| JP | 2008-297191 A | 12/2008 |
| JP | 2009-500284 A | 1/2009 |
| JP | 2009-234914 A | 10/2009 |
| JP | 2009-263229 A | 11/2009 |
| JP | 2010-13351 A | 1/2010 |
| JP | 2010-509172 A | 3/2010 |
| JP | 2011-132119 A | 7/2011 |
| JP | 2011-153052 A | 8/2011 |
| JP | 2011-153055 A | 8/2011 |
| JP | 2012-136422 A | 7/2012 |
| JP | 2012144424 A * | 8/2012 |
| WO | WO 03/041138 A2 | 5/2003 |
| WO | WO 03/041138 A3 | 5/2003 |
| WO | WO 2004/003261 A1 | 1/2004 |
| WO | WO 2004/004085 A2 | 1/2004 |
| WO | WO 2004/004085 A3 | 1/2004 |
| WO | WO 2004/053208 A1 | 6/2004 |
| WO | WO 2007/008198 A1 | 1/2007 |
| WO | WO 2009/044651 A1 | 4/2009 |
| WO | WO 2010/079814 A1 | 7/2010 |
| WO | WO 2013/063070 A1 | 5/2013 |

OTHER PUBLICATIONS

Tranlation of JP2011-153055; Jul. 25, 2016.*
Office Action issued Jun. 2, 2015 in Japanese Patent Application No. 2012-236354 (with English language translation).
International Search Report and Written Opinion issued Nov. 27, 2012 in PCT/JP2012/077591 filed Oct. 25, 2012 (with English Translation of Category of Cited Documents).
Translation of JP2007-238347; 2014.
Supplementary European Search Report issued Feb. 3, 2015 in EP 12842943.8, filed Oct. 25, 2012.
International Preliminary Report on Patentability and Written Opinion issued Apr. 29, 2014 in PCT/JP2012/077591 (submitting English translation only, Written Opinion previously filed Jan. 18, 2013).
Office Action issued Jan. 12, 2016 in Japanese Patent Application No. 2013-020033 (with partial English language translation).
Office Action issued Jan. 26, 2016 in Japanese Patent Application No. 2013-060287 (with partial English language translation).
Office Action issued Jun. 7, 2016, in Japanese Patent Application No. 2012-236354, filed Oct. 26, 2012 (with English-language Translation).

* cited by examiner

METHOD FOR PRODUCING NITRIDE CRYSTAL AND NITRIDE CRYSTAL

CROSS-REFERENCE TO RELATED APPLICATIONS

This is a continuation of and claims the benefits of priority to U.S. Ser. No. 13/661,090, filed Oct. 26, 2012, the entire contents of which are herein incorporated by reference. U.S. Ser. No. 13/661,090 claims the benefit of priority under 35 U.S.C. 119 from U.S. Provisional Patent Application No. 61/552,801 filed Oct. 28, 2011, Japanese Patent Application No. 25711/2012 filed Feb. 9, 2012 and Japanese Patent Application No. 188099/2012 filed on Aug. 28, 2012, the contents of which are herein incorporated by reference in their entirety.

BACKGROUND OF THE INVENTION

Field of the Invention

The present invention relates to a method for producing a nitride crystal and a nitride crystal. The present invention also relates to a method for producing a nitride crystal to be grown by using a nitride crystal starting material having an oxygen concentration within a specific range and a nitride crystal produced by the method.

Description of the Related Art

As a method for producing a nitride crystal, an ammonothermal process is known. An ammonothermal method is a method for producing a desired material using a nitrogen-containing solvent such as ammonia or the like in a supercritical state and/or a subcritical state and utilizing the dissolution-precipitation reaction of the starting material therein. In the method, when applied to crystal growth, a supersaturation state is generated through the temperature difference based on the temperature dependence of the solubility of the starting material in the ammonia solvent or the like, thereby precipitating a crystal. Concretely, a crystal starting material or a seed crystal is put into a pressure vessel such as an autoclave or the like, sealed up therein and heated with a heater or the like to thereby form a high-temperature region and a low-temperature region in the pressure vessel, while on one hand, the starting material is dissolved and a crystal is grown on the other hand to thereby produce the desired crystal.

The crystal starting material to be used in the ammonothermal method includes a polycrystalline or a single crystal or the like of the same type as that of the nitride crystal to be grown according to the ammonothermal process. Consequently, first, a nitride fine crystal material corresponding to the starting material in the first stage is produced, and then the starting material is grown into a nitride crystal in the second stage (for example, see Patent Reference 1). In this, a massive material could hardly be obtained in the first stage, and therefore, in general, a polycrystalline nitride having smaller particle size, that is, a powdery starting material is used in the second stage. Patent Reference 1 (JP-A 2003-277182) says that it is desirable to use a GaN fine crystal powder having a mean particle size of from 1 to 5 μm or so as the starting material in the second stage to thereby give a GaN crystal through growth (see paragraphs [0009] to [0010]).

Patent Reference 2 (JP-A 2007-238347) describes efficient production of GaN crystal by the use of multistage crucibles each with a powdery GaN crystal starting material put therein, in which the contact area between the starting material and the solvent is enlarged to thereby increase the dissolution rate of the starting material. In this, it is said that use of boxy crucibles each having one opening port only on the top thereof is preferred. In addition, Patent Reference 2 describes use of a crystal starting material having a particle size of from 10 nm to 10 mm, especially recommending use of a powdery crystal starting material having a particle size of from 50 nm to 1 mm for filling up the gap between the material particles (see [0061]).

Patent Reference 3 (JP-A2006-83055) and Patent Reference 4 (JP-T 2005-508822) describe a method for producing a polycrystalline nitride to be a starting material. According to Patent Reference 3, there is obtained a needle-like, columnar or prismatic crystal having a primary particle diameter of from 0.1 μm to tens μm and having a maximum length in the long axis direction of from 0.05 μm to 1 mm, and this is said to be used as the starting material for producing a nitride crystal. Patent Reference 4 describes production of a GaN crystal containing an isometric crystal particle having a mean particle size of from about 0.01 to 50 μm, and use of the crystal as the starting material for producing a nitride crystal. In Example in Patent Reference 4, some crystal particles having a diameter of from about 10 to 20 μm are produced along with a large number of crystal particles having a diameter of at most about 1 μm; and in Example 2, there are produced many crystal particles having a diameter of from about 1 to 3 μm and unstriated crystal particles somewhat larger than these.

A nitride crystal such as gallium nitride (GaN) or the like is used for substrates of various semiconductor devices such as light-emitting devices, electronic devices, semiconductor sensors, etc. In order that a nitride crystal can function as a substrate for semiconductor devices, the nitride crystal must have suitable electroconductivity in accordance with the use of various semiconductor devices. In general, the electroconductivity of a nitride crystal is controlled by the carrier concentration and the carrier mobility in the nitride crystal. In order that a nitride crystal can function as a substrate for semiconductor devices, it is important that the nitride crystal has a suitable carrier concentration.

As a method for producing a nitride crystal, there are known a hydride vapor phase epitaxial growth process (HVPE process), an ammonothermal process, etc. The HVPE process comprises introducing a Ga chloride and a Group V element hydride ($NH_3$) into a furnace in a hydrogen current atmosphere, then thermally decomposing them and depositing the crystal generated through the thermal decomposition on a substrate. It is known that, in case where oxygen is used as an n-type dopant in the nitride crystal to be produced according to the HVPE process, the activation ratio is nearly 100% (for example, see Patent Reference 5 (JP-A 2000-44400)).

On the other hand, the ammonothermal process has advantages in that the starting material utilization efficiency there in is better than that in the HVPE process and that the production cost can be reduced.

As so pointed out in Patent Reference 2, the dissolution rate of a powdery nitride crystal starting material is low and the starting material efficiency lowers, and in case where the powdery nitride crystal starting material is used as a material for crystal growth in an ammonothermal process, a large-size crystal could not be obtained efficiently. Patent Reference 2 describes use of a crystal starting material having a particle size of from 10 nm to 10 mm, which, however, says that when the starting material contains large particles of more than 2 mm, it is especially recommended to use a powdery crystal starting material having a particle size of from 10 nm to 2 mm in an amount of at least 10% by mass to thereby fill up the gap between the starting material particles (see [0061])

CITATION LIST

Patent References

[Patent Reference 1] JP-A 2003-277182
[Patent Reference 2] JP-A 2007-238347
[Patent Reference 3] JP-A 2006-83055
[Patent Reference 4] JP-T 2005-508822
[Patent Reference 5] JP-A 2000-44400

SUMMARY OF THE INVENTION

The present inventors investigated production of a nitride crystal by the use of the nitride crystal starting material obtained according to the method described in Patent Reference 1, but have known that it is not easy to produce the nitride crystal at a high growth rate. In addition, as described in Patent Reference 2, the inventors investigated production of a nitride crystal by charging the starting material so as to fill up the gap between the nitride crystal starting materials, but have known that it is not easy to produce the nitride crystal at a high growth rate and that the material use efficiency is poor. Further, the inventors tried production of a polycrystalline nitride merely by using, as a nitride crystal starting material, the nitride crystal produced according to the method described in Patent Reference 3 and Patent Reference 4, but have known that it is difficult to produce the nitride crystal at a desired growth rate.

In consideration of those heretofore-existing problems, the present inventors have further made assiduous investigations for the purpose of efficiently producing a nitride crystal of good quality by controlling the condition of the crystal starting material for use in producing a nitride crystal according to an ammonothermal process to thereby increase the crystal growth rate and to increase the starting material use efficiency.

For the ammonothermal process, only the condition for basic crystal growth is investigated, and any method for obtaining a high-quality crystal having a desired electroconductivity is not as yet established. As described above, it is known that, in case where oxygen is used as the n-type dopant, the nitride crystal produced according to the HVPE process, the activation ratio is nearly 100%. However, the activation ratio in the case where oxygen is used as the n-type dopant in the nitride crystal produced according to an ammonothermal process has not been clarified. In addition, in an ammonothermal process, used are dopants that are derived from various types of dopant sources, and therefore, it has been impossible to establish the oxygen doping condition for obtaining a nitride crystal having a desired carrier concentration. Accordingly, there has been a problem that it is difficult to obtain a nitride crystal having a desired carrier concentration.

Further, in the ammonothermal process, the oxygen doping condition has not been established for obtaining a nitride crystal having a desired carrier concentration, and consequently, it is impossible to attain accurate oxygen doping therefore providing another problem in that a high-quality nitride crystal could not be obtained. Moreover, in order to obtain a nitride crystal having an intended carrier concentration according to the ammonothermal process, various conditions must be tried and investigated, therefore providing still another problem in that the production efficiency could not increase.

Given the situation and for the purpose of solving the problems in the prior art as mentioned above, the present inventors have further investigated so as to provide a production method for a nitride crystal having a desired carrier concentration.

In addition, in consideration of those problems in the prior art, the present inventors have further made assiduous studies for the purpose of increasing the crystal growth rate in producing a nitride crystal and increasing the utilization efficiency of the nitride crystal starting material to thereby produce a nitride crystal efficiently.

As a result, the inventors have found that the growth rate of a nitride crystal can be readily increased by controlling the bulk density of the crystal starting material to be filled in the reaction vessel for crystal growth therein according to an ammonothermal process, and have provided here the present invention having the constitution mentioned below (the first invention).

In addition, the inventors have found that a nitride crystal having a desired carrier concentration can be obtained by producing a nitride crystal according to an ammonothermal process and using a nitride crystal starting material having an oxygen concentration falling within a specific range. Specifically, the inventors have succeeded in finding out the correlative relationship between the oxygen concentration in the nitride crystal starting material and the carrier concentration in the crystal in an ammonothermal process, and have thereby completed the present invention (the second invention).

Further, the inventors have found out that, when a nitride crystal starting material having an angle of repose in a specific range is used, then the growth rate of the nitride crystal can be increased with ease and the utilization efficiency of the nitride crystal starting material can be thereby increased, and have provided the invention having the constitution mentioned below (the third invention).

[1] A method for producing a nitride crystal, comprising charging a nitride crystal starting material that contains tertiary particles having a maximum diameter of from 1 to 120 mm and formed through aggregation of secondary particles having a maximum diameter of from 100 to 1000 μm in the starting material charging region of a reactor, followed by crystal growth in the presence of a solvent in a supercritical state and/or a subcritical state in the reactor, wherein the nitride crystal starting material is charged in the starting material charging region in a bulk density of from 0.7 to 4.5 g/cm$^3$ for the intended crystal growth.

[2] The method for producing a nitride crystal of [1], wherein the bulk density is from 0.8 to 3.6 g/cm$^3$.

[3] The method for producing a nitride crystal of [1] or [2], wherein the nitride crystal starting material has an angle of repose of less than 45°.

[4] A method for producing a nitride crystal, comprising charging a nitride crystal starting material that has a bulk density of from 0.7 to 4.5 g/cm$^3$ and has an oxygen concentration in the crystal of from 10 to 500 ppm, in the starting material charging region of a reactor, followed by nitride crystal growth in the presence of a solvent in a supercritical state and/or a subcritical state in the reactor.

[5] The method for producing a nitride crystal of [4], wherein the bulk density is from 0.8 to 3.6 g/cm$^3$.

[6] The method for producing a nitride crystal of [4] or [5], wherein the maximum diameter of the nitride crystal starting material is from 0.5 μm to 120 mm.

[7] The method for producing a nitride crystal of any one of [4] to [6], wherein the particles of the nitride crystal starting material are tertiary particles having a maximum diameter of from 1 to 120 mm and formed through aggregation of secondary particles having a maximum diameter of from 100 to 1000 μm.

[8] A method for producing a nitride crystal, comprising charging a nitride crystal starting material having an angle of repose of less than 45° in the starting material charging region of a reactor, followed by nitride crystal growth in the presence of a solvent in a supercritical state and/or a subcritical state in the reactor.

[9] The method for producing a nitride crystal of [8], wherein the nitride crystal starting material has a bulk density of from 0.7 to 4.5 $g/cm^3$.

[10] The method for producing a nitride crystal of [9], wherein the bulk density is from 0.8 to 3.6 $g/cm^3$.

[11] The method for producing a nitride crystal of any one of [8] to [10], wherein the nitride crystal starting material is in the form of particles having a maximum diameter of from 0.5 μm to 120 mm.

[12] The method for producing a nitride crystal of any one of [8] to [11], wherein the nitride crystal starting material is in the form of tertiary particles having a maximum diameter of from 0.5 mm to 120 mm and formed through aggregation of secondary particles having a maximum diameter of from 100 to 1000 μm.

[13] The method for producing a nitride crystal of any one of [1] to [12], wherein a reticulated structure is installed in the starting material charging region.

[14] The method for producing a nitride crystal of [13], wherein the nitride crystal starting material is filled in the reticulated structure and then the reticulated structure is installed in the starting material charging region.

[15] The method for producing a nitride crystal of any one of [1] to [14], wherein the dissolution rate of the nitride crystal starting material is at least 40%.

[16] The method for producing a nitride crystal of any one of [1] to [15], wherein the growth rate of the nitride crystal in the c-axis direction is at least 100 μm/day.

[17] A nitride crystal produced according to the nitride crystal production method of any one of [1] to [16].

According to the first invention, a high-quality nitride crystal can be produced efficiently by controlling the bulk density of the crystal starting material to be charged in crystal growth according to an ammonothermal process. Consequently, according to the invention, the time for crystal growth can be shortened and the crystal starting material can be formed into a nitride crystal efficiently to thereby noticeably reduce the production cost. In addition, the nitride single crystal produced according to the method of the invention can be effectively used in devices as a high-quality crystal.

According to a second invention, a nitride crystal having a desired carrier concentration can be obtained by producing the nitride crystal according to an ammonothermal process and using a nitride crystal starting material having an oxygen concentration to gall within a specific range.

According to the second invention, in addition, the main dopant source is limited to a nitride crystal starting material, and consequently, the inventors have succeeded in finding out the correlative relationship between the oxygen concentration in the starting material and the carrier concentration in the crystal according to an ammonothermal process. Consequently, the inventors have established the oxygen doping condition for obtaining a nitride crystal having a desired carrier concentration. As a result, in the invention, it is possible to attain accurate oxygen doping to give a high-quality nitride crystal.

Further, according to the second invention, it is possible to greatly reduce the time and effort to try and investigate the condition for obtaining a nitride crystal having an intended carrier concentration according to an ammonothermal process, and the production efficiency for the nitride crystal can be thereby increased.

According to the third invention, a nitride crystal is produced by the use of a nitride crystal starting material having an angle of repose falling within a specific range. Therefore in the invention, the solvent convection flow in crystal growth is hardly retarded, the dissolution rate of the starting material can be increased and the crystal growth rate can be increased, and a nitride crystal can be produced efficiently. Consequently, according to the third invention, the growth time can be shortened, the nitride crystal starting material can be efficiently formed into a nitride crystal and the production cost can be noticeably reduced. The nitride crystal produced according to the third invention can be effectively used as a high-quality crystal in devices.

Figure 1:
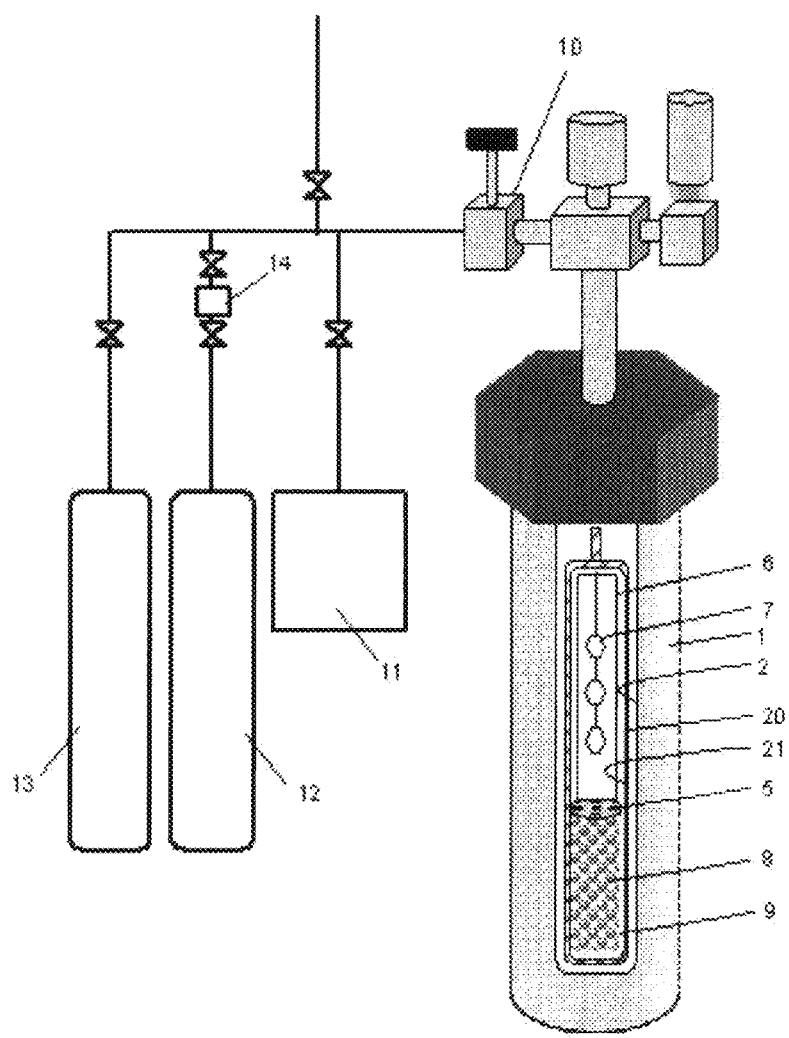
FIG. 1 is a schematic view of a crystal production apparatus according to an ammonothermal process usable in the invention.

In the drawings, 1 is autoclave, 2 is autoclave inner surface, 3 is lining, 4 is lining inner surface, 5 is baffle plate, 6 is crystal growing region, 7 is seed crystal, 8 is starting material, 9 is starting material charging region, 10 is valve, 11 is vacuum pump, 12 is ammonia cylinder, 13 is nitrogen cylinder, 14 is mass flow meter, 20 is capsule, 21 is capsule inner surface, 31 is mound of nitride crystal starting material, 32 is container, 33 is funnel, 34 is measurement plane, a is angle of repose, h is height of mound of nitride crystal starting material, and l is slope length of mound of nitride crystal starting material

MODE FOR CARRYING OUT THE INVENTION (Definition)

In this description, the numerical range expressed by the wording "a number to another number" means the range that falls between the former number indicating the lower limit of the range and the latter number indicating the upper limit thereof.

First described is the relationship between the axis and the plane of a hexagonal-system crystal structure. In this description, the "main plane" of a seed crystal or a nitride crystal is the widest plane in the seed crystal or the nitride crystal and generally indicates the plane for crystal growth thereon. In this description, the "C-plane" is a plane equivalent to the {0001} plane in a hexagonal-system structure (wurtzite-type crystal structure), and is a polar plane. For example, the plane indicates the (0001) plane and its opposite plane, (000-1) plane. In a Group III nitride crystal (Periodic Table Group 13 metal nitride crystal), the C-plane is a Group III (Group 13 metal) plane or a nitride plane, and corresponds to the Ga-plane or the N-plane in gallium nitride (GaN). In this description, the "M-plane" is a nonpolar plane as inclusively expressed as {1-100} plane, {01-10} plane, {-1010} plane, {-1100} plane, {0-110} plane, {10-10} plane, concretely meaning (1-100) plane, (01-10) plane, (-1010) plane, (-1100) plane, (0-110) plane, (10-10) plane. Further, in this description the "A-plane" is a non-polar plane as inclusively expressed as {2-1-10} plane, {-12-10} plane, {-1-120} plane, {-2110} plane, {1-210} plane, {11-20} plane, concretely meaning (11-20) plane, (2-1-10) plane, (-12-10) plane, (-1-120) plane, (-2110) plane, (1-210) plane. In this description, the "c-axis", the "m-axis" and the "a-axis" each mean an axis vertical to the C-plane, the M-plane and the A-plane, respectively.

In this description, the "non-polar plane" means a plane in which both a Group III element and a nitrogen element exist and the abundance ratio thereof is 1/1. Concretely, the M-plane and the A-plane are preferred planes. In this description, the "semipolar plane" means a plane except {0001} plane in which m is not 0 in case where the Group III nitride is a hexagonal crystal and the main plane thereof is expressed as (hklm). Specifically, the plane is a plane that is not a non-polar plane and that is tilted relative to the (0001) plane. The plane means a plane in which where both a Group III element and a nitrogen element or one alone thereof as in the C-plane exists and the abundance ratio thereof is not 1/1. Preferably, h, k, l and m each independently an integer of from -5 to 5, more preferably an integer of from -2 to 2, and the plane is preferably a low-index plane. The semipolar solvent preferably employed as the main plane of a nitride crystal includes, for example, (10-11) plane, (10-1-1) plane, (10-12) plane, (10-1-2) plane, (20-21) plane, (202-1) plane, (20-2-1) plane, (10-12) plane, (10-1-2) plane, (11-21) plane, (11-2-1) plane, (11-22) plane, (11-2-2) plane, (11-24) plane, (11-2-4), etc. Especially mentioned are (10-11) plane and (202-1) plane.

In this description, the "ppm" means the "mass ppm".

(First Invention)

The production method for a nitride crystal of the first invention is described below. The description of the constituent elements given hereinunder is for some typical embodiments of the invention, to which, however, the invention should not be limited.

(Production Method for Nitride Crystal of the First Invention)

The production method for a nitride crystal of the first invention (hereinafter, the production method of the first invention) includes charging a nitride crystal starting material that contains tertiary particles having a maximum diameter of from 1 to 120 mm and formed through aggregation of secondary particles having a maximum diameter of from 100 to 1000 μm, in the starting material charging region of a reactor, followed by crystal growth in the presence of a solvent in a supercritical state and/or a subcritical state in the reactor, wherein the nitride crystal starting material is charged in the starting material charging region in a bulk density of from 0.7 to 4.5 g/cm³ for the intended crystal growth.

In an ammonothermal method, in general, a starting material charging region where a crystal starting material is charged and a crystal growth region where a seed crystal is put are arranged in a reactor, and in the starting material charging region, a starting material is melted and in the crystal growth region, a crystal is grown on the seed crystal. In this, a temperature difference is given to the starting material charging region and the crystal growth region, and the reactor is so controlled that the starting material can be melted more in the starting material charging region and a good crystal can be readily precipitated in the crystal growth region. The "starting material charging region" in the invention is meant to indicate the region sandwiched between the horizontal plane including the lowermost edge of the nitride crystal starting material charged in the reactor and the horizontal plane including the uppermost edge of the charged crystal starting material, in case where the reactor before the start of reaction is so installed that its long axis could be in the vertical direction. The "bulk density" of the nitride crystal starting material in the starting material charging region is the weight per the unit volume of the crystal starting material charged in the starting material charging region, and can be determined by dividing the weight of the nitride crystal starting material by the free volume of the starting material charging region. The free volume of the starting material charging region is the volume as determined by subtracting the solid substances except the nitride crystal starting material existing in the starting material charging region from the inner volume of the starting material charging region of the reactor. Examples of the solid substances include structures such as a baffle plate, a supporting frame for supporting a seed crystal supporting frame, a crucible for keeping a starting material therein, a basket, a reticular structure, etc. By removing the volume of these structures in the starting material charging region, the free volume can be obtained.

A concrete calculation example of determining the bulk density of the nitride crystal starting material in the invention is shown. For example, in case where 100 g of a GaN crystal starting material is put in the lower region of a cylindrical reactor having an inner diameter of 20 mm and where the height from the lowermost edge of the region having the starting material therein (the bottom of the inside of the cylinder) to the uppermost edge thereof is 100 mm, the bulk density is calculated as 100 g/(314 mm²×100 mm), and is about 3.18 g/cm³. Also, the bulk density is analyzed by CT scan (Computed Tomography scan) in a condition of within a reactor together.

The bulk density can be converted into the filling rate of the nitride crystal starting material. Dividing the bulk density by the specific gravity of the nitride crystal starting material following by centuplicating the result gives the filling rate (unit, %). For example, in the above-mentioned case, the specific gravity of GaN crystal is 6.1 g/cm³, and therefore the filling rate is 52%.

When the bulk density of the nitride crystal starting material in the starting material charging region is too large, then the volume of the space to be formed between the nitride crystal starting material particles is small so that the solvent convection flow is thereby retarded and the melting rate of the starting material may lower. Consequently, a good crystal could hardly be grown with high productivity. On the other hand, when the bulk density of the nitride crystal starting material is too small, then the nitride crystal starting material could be well melted but the amount of the starting material to be charged per the volume of the reactor decreases and it would be therefore difficult to efficiently feed a sufficient amount of the melted starting material to the crystal growth region and to rapidly grow a nitride crystal having a sufficient size. In the invention, the bulk density of the nitride crystal starting material in the starting material charging region is controlled to fall within a range of from 0.7 to 4.5 g/cm³ to thereby increase the melting speed of the starting material not detracting from the solvent convection flow, and a good-quality crystal can be thereby produced efficiently.

In the production method of the first invention, the bulk density of the nitride crystal starting material in the starting material charging region is at least 0.8 g/cm³, more preferably at least 0.9 g/cm³, even more preferably at least 1.0 g/cm³, still more preferably at least 1.1 g/cm³. Also preferably the bulk density of the nitride crystal starting material in the starting material charging region is at most 4.0 g/cm³, more preferably at most 3.6 g/cm³, even more preferably at most 3.2 g/cm³, still more preferably at most 3.0 g/cm³. The bulk density of the nitride crystal starting material in the starting material charging region is controlled within a range of the above to thereby increase the melting speed of the starting material not detracting from the solvent convection flow, and a good-quality crystal can be thereby produced efficiently.

(Method for Controlling Bulk Density)

The bulk density of the nitride crystal starting material in the starting material charging region may be controlled by suitably selecting the particle size, the particle size distribution and the shape of the nitride crystal starting material to be used. Specifically, when a nitride crystal starting material is put into the starting material charging region in a reactor and when the particle size and the shape of the nitride crystal starting material are so selected that the nitride crystal starting material particles could readily overlap with each other while kept spaced suitably from each other, then the bulk density of the nitride crystal starting material can be low. For example, when a nitride crystal starting material having a large particle size is used, or a nitride crystal starting material of which the particle shape is asymmetric and amorphous is used, then the bulk density can be kept low. On the contrary, when the nitride crystal starting material is put into the starting material charging region in a reactor and when the particle size and the shape of the nitride crystal starting material are so selected that the nitride crystal starting material particles could readily overlap with each other densely, then the bulk density of the nitride crystal starting material can be high. For example, when a nitride crystal starting material having a small particle size is used, or when a combination of a nitride crystal starting material having a large particle size and a nitride crystal starting material having a small particle size and capable of stepping in the space between the large nitride crystal starting material particles is used, or when a uniform nitride crystal starting material having a crystal shape that can be charged densely in the starting material charging region, then the bulk density can be high.

When the bulk density of the nitride crystal starting material in the starting material charging region is controlled to fall within the above-mentioned range, then the bulk density of the nitride crystal to be used is not specifically defined, but it is desirable to use a nitride crystal starting material having a bulk density that falls within a range of from 0.7 to 4.5 g/cm³. More preferably, the bulk density is at least 1.5 g/cm³, even more preferably at least 1.8 g/cm³, and is more preferably at most 4.0 g/cm³, even more preferably at most 3.0 g/cm³. Preferably, the solubility of the nitride starting material in the starting material charging region is controlled by using one or more such nitride crystal starting materials having a bulk density to fall within the range, either alone or as combined. The "bulk density" of the individual nitride crystal starting materials each having a different bulk density means the weight per unit volume of the nitride crystal starting material charged in a suitable vessel; and this may be obtained by dividing the weight of the charged nitride crystal starting material by the volume of the vessel. In general, the aggregates of nitride crystal starting materials that are said to have the same bulk density have a similar morphology, and the aggregate of which the ratio of the maximum value of the particle size to the minimum value thereof is at most 100/1 is referred to as "one type of nitride crystal starting material" having nearly the same bulk density. Preferably, one type of nitride crystal starting material has a smaller weight fluctuation per one particle. The preferred range of the standard deviation at the weight per one particle may vary depending on the size of the reactor to be used, but is, in general, preferably at most 8.0, more preferably at most 7.0, even more preferably at most 6.0. In particular, when the diameter of the reactor is 26 mm or so, it is desirable that a starting material having a mean weight of from 0.6 to 1.2 g/particle and a standard deviation of from 0.35 to 0.48 is used. When the diameter of the reactor is 60 mm or so, preferably, a starting material having a mean weight of from 5.0 to 8.5 g/particle and a standard deviation of at most 5.4 is used. When the diameter of the reactor is 130 mm or so, preferably, a starting material having a mean weight of from 5.0 to 10.5 g/particle and a standard deviation of at most 7.0 is used.

The bulk density of the nitride crystal starting material in the starting material charging region can be controlled by introducing the nitride crystal starting material into the starting material charging region and then imparting some energy thereto. For example, the bulk density can be controlled by shaking or rotating the reactor after the nitride crystal starting material has been charged in the starting material charging region, or by mixing the charged nitride crystal starting material with a stirring rod or a rotating blade. The charged nitride crystal starting material may be shaken by directly shaking the reactor, or in a mode of non-contact shaking with ultrasonic waves or the like.

The bulk density of the nitride crystal starting material in the starting material charging region can also be controlled by installing some structures in the starting material charging region. For example, a reticulated structure through which a solvent could pass but in which the nitride crystal starting material could not may be favorably employed here. With the reticulated structure of the type, the existing region of the nitride crystal starting material in the starting material charging region can be controlled and the bulk density thereof can be thereby controlled. Specifically, the existing region of the nitride crystal starting material is limited to a narrow region and the region where the nitride crystal starting material could not exist is widely secured, whereby the bulk density can be controlled low. For example, when the nitride crystal starting material is filled in a reticulated structure having a smaller volume than that of the starting material charging region and when this is put in the starting material charging region, then the bulk density can be made low. On the contrary, by installing a hollow reticulated structure not charged with the nitride crystal starting material in the starting material charging region, the bulk density may also be controlled. For example, the reticulated structure of the type is mixed with the nitride crystal starting material and may be charged in the starting material charging region. In this case, by controlling the mixing ratio of the two, the bulk density can be controlled. The reticulated structure may be previously fixed in the starting material charging region. Multiple reticulated structures of those types may be used here. Also employable here is a non-reticulated structure through which the solvent used can pass.

(Nitride Crystal Starting Material)

The nitride crystal starting material for use in the invention contains an element that constitutes the nitride crystal to be grown according to an ammonothermal process. For example, in case where a nitride crystal of a Periodic Table Group 1 metal (hereinafter, alternatively Group 13 nitride crystal) is desired to be grown, a starting material that contains the Periodic Table Group 13 metal is used. Preferred is use of a polycrystalline material or a single-crystal material of a Group 13 nitride crystal, and this may be combined with a Group 13 element metal. The polycrystalline material is not always required to be a complete nitride but may contain a metal component in which the Group 13 atom is in a state of metal (zero-valent), if possible. For example, for the case where the growing nitride crystal is gallium nitride, as a nitride crystal starting material, there is mentioned a mixture of gallium nitride and metal gallium. The Group 13 nitride crystal includes GaN, InN, AlN, InGaN, AlGaN, AlInGaN, etc. Preferred are GaN, AlN, AlGaN, AlInGaN; and more preferred is GaN.

The method for producing the polycrystalline material that may be used as the starting material in the invention is not specifically defined. For example, usable here is a polycrystalline nitride produced through reaction of a metal or its oxide or hydroxide with ammonia in a reactor where ammonia gas is kept running. As a metal compound material having higher reactivity, there may be used here halides, amide compounds, imide compounds, covalent-bonding M-N bond-having compounds such as galazan, etc. Also usable here is a polycrystalline nitride produced through reaction of a metal such as Ga or the like with nitrogen at high temperature and under high pressure.

The amount of water and oxygen to be contained in the polycrystalline material for use in the invention is as small as possible. The oxygen content in the polycrystalline material is generally at most 1.0% by weight but preferably at most 0.1% by weight, more preferably at most 0.0001% by weight. Oxygen penetrability in the polycrystalline material has a relation to the reactivity with water of the material or to the water absorbability thereof. A polycrystalline material having a poorer crystallinity may have a larger amount of an active group such as an NH group and the like on the surface thereof, and the group may react with water thereby partially forming oxides or hydroxides. Accordingly, in general, the crystallinity of the polycrystalline material to be used here is preferably as high as possible. The crystallinity can be estimated based on the half-value width in X-ray diffractiometry, and the half-value width of the diffraction line at (100) (in hexagonal-type gallium nitride, $2\theta$=about) $32.5°$ is generally at $0.25°$ or less, preferably $0.20°$ or less, more preferably $0.17°$ or less.

A nitride crystal starting material of the first invention contains tertiary particles having a maximum diameter of from 1 to 120 mm and formed through aggregation of secondary particles having a maximum diameter of from 100 to 1000 μm. The preferred range of the particle size of the nitride crystal starting material for use in the first invention varies depending on the size of the reactor to be used from the viewpoint of the easiness in controlling the bulk density of the starting material and the easiness in handling the starting material. Concretely, when the size of the reactor is large, then the particle size of the nitride crystal starting material may be large. The maximum diameter as referred to herein is the linear distance of the maximum length of the particle. The maximum diameter of the tertiary particles formed through aggregation of secondary particles corresponds to the "particle size" of the nitride crystal starting material.

For example, in the case where a reactor having a diameter of 26 mm or 30 mm or so is used, then the maximum diameter of the starting material particle is preferably 0.5 μm or more, more preferably 1 μm or more, even more preferably 10 μm or more, but is preferably at most 20 mm, more preferably at most 15 mm, even more preferably at most 10 mm. In the case where a reactor having a diameter of 60 mm or so is used, then the maximum diameter of the starting material particle is preferably 0.5 μm or more, more preferably 1 μm or more, even more preferably 10 μm or more, but is preferably at most 50 mm, more preferably at most 30 mm, even more preferably at most 20 mm.

In the case where a reactor having a diameter of 130 mm or so is used, then the maximum diameter of the starting material particle is preferably 0.5 μm or more, more preferably 1 μm or more, even more preferably 10 μm or more, but is preferably at most 120 mm, more preferably at most 60 mm, even more preferably at most 30 mm.

Preferably, the nitride crystal starting material for use in the first invention has an aggregated structure of nitride crystal starting material particles. Concretely, preferred for use herein are tertiary particles formed through aggregation of secondary particles. Preferably, the particle size of the secondary particles is at least 100 μm, more preferably at least 200 μm, even more preferably at least 300 μm, but is preferably at most 1000 μm, more preferably at most 900 μm, even more preferably at most 800 μm. Preferably, the particle size of the tertiary particles is at least 1 mm, more preferably at least 5 mm, even more preferably at least 10 mm, but is preferably at most 120 mm, more preferably at most 60 mm, even more preferably at most 50 mm, even more preferably at most 30 mm, even more preferably at most 20 mm. The particle size of the secondary particles can be measured with an optical microscope, etc. The tertiary particles of not smaller than 1 mm can be confirmed through visual inspection, and can be therefore measured with a caliper, a ruler or the like. Further, in case where the shape of the nitride crystal starting material for use in the invention is a coral-like one as described below, the maximum diameter of the particles thereof is determined to cover the projections on the surface thereof. Of the nitride crystal having a configuration formed through aggregation of the above-mentioned nitride crystal starting material particles, the primary particle means a nano-level single crystal, and multiple single crystals aggregate together and bond to each other to form polycrystalline secondary particles. In general, primary particles bond to each other and are integrated, and they could not be individually differentiated from each other.

Regarding the particle size distribution of the nitride crystal starting material for use in the first invention, preferably, the nitride crystal starting material having a particle diameter of at least 0.01 μm accounts for at least 20% by volume of the entire nitride crystal starting material, more preferably at least 30%, since the space between the nitride crystal starting material particles could be sufficient to secure the solvent convection therethrough. The nitride crystal starting material having a particle diameter of at least 1.0 mm accounts for at least 10% by volume of the entire nitride crystal starting material, more preferably at least 30%, even more preferably at least 50%, even more preferably at least 80%, since the space between the nitride crystal starting material particles could be sufficient to secure the solvent convection therethrough.

(Shape of Nitride Crystal Starting Material)

The shape of the nitride crystal starting material for use in the invention may be a spherical one, a granular one of which the cross section is oval, a tabular one, a rectangular one, a triangular one or a coral one. (In this description, the coral shape means a shape having projections of which the length is at least 5% of the maximum diameter thereof, on the surface thereof. Preferably, the shape has irregularities on the entire surface thereof to thereby have an increased surface area.) Preferably, the shape is oval granular, rectangular, triangular or coral, as having a given space between the crystal starting material particles so as not to so much interfere with the convection flow of the solvent therearound, and for the reason that the starting material having the preferred shape can control the angle of repose thereof to a desired angle and that the bulk density of the material of the type is easy to control.

In this description, the coral form generally includes a dendritic form and a kompeito-like form (with horn-like prongs on the surface). Examples of the coral form include, for example, the granular form described in JP-A 2001-206866 and the granular form described in JP-A 2011-026665. These references are herein incorporated by reference.

Above all, the nitride crystal starting material preferably has a coral form, as having an increased dissolution rate and capable of efficiently producing a large-size nitride crystal.

The method of obtaining the coral-like nitride crystal starting material of the time is not specifically defined. The material may be obtained commercially, or may be obtained through crystal growth under a specific condition. Regarding the method of commercially obtaining the material, for example, there may be mentioned Poly GaN (product name) available from Kyma. Regarding the method of obtaining a coral-form material through crystal growth, there may be mentioned a generally-known HVPE process in which the starting material supply partial pressure and the growth temperature are so controlled that the crystal growth rate could be high or the crystal growth is attained not using a seed crystal to promote polycrystal growth.

The angle of repose of the nitride crystal starting material to be used in the first invention is preferably less than 45° from the viewpoint of increasing the crystal growth rate, more preferably less than 40°. When the angle of repose of the nitride crystal starting material is less than 45°, then it is expected that suitable friction may occur depending on the shape and the size of the starting material, and it is considered that, when the material is charged in a reactor, there could be formed a suitable space between the nitride crystal starting material particles and the material could be readily brought into contact with the solvent therearound. As a result, the dissolution of the starting material in the solvent can be promoted, and in case where the nitride crystal starting material of the type is used for crystal growth, then a high crystal growth rate can be attained.

Also preferably, the angle of repose of the nitride crystal starting material for use in the first invention is at least 15° from the viewpoint of the handleability thereof in charging it in a reactor, and is more preferably at least 20°, even more preferably at least 25°. When the angle of repose of the nitride crystal starting material is too small, then it is expected that the friction of the material may be low in view of the shape and the size thereof and the material may readily diffuse, and accordingly, it is considered that the material may fly up when handled so as to be charged in a reactor, and would be therefore difficult to handle.

The production method for the nitride crystal starting material having an angle of repose of less than 45°, which is used as the nitride crystal starting material in the first invention, is not specifically defined. Regarding the definition of the angle of repose of the nitride crystal starting material, the measurement method for the angle, and the production method for the material, referred to are the descriptions relating to them that are given hereinunder in the section of the third invention to be mentioned below.

Preferably, the nitride crystal starting material for use in the first invention is so designed that the plane thereof easy to dissolve in solvent appears outside of the surface and the plane thereof difficult to dissolve in solvent does not appear outside. For example, in case where a GaN crystal is grown by the use of an ammonia solvent according to an ammonothermal process, the +C-plane (Ga plane) and the M-plane are relatively difficult to dissolve in the ammonia solvent, and therefore it is desirable to use here the starting material of which the other planes than these appear outside of the surface.

(Crystal Growth Through Ammonothermal Process)

In the production method of the first invention, a nitride crystal starting material is charged in the starting material charging region in a bulk density of from 0.7 to 4.5 g/cm$^3$, and then a nitride crystal is produced from the nitride crystal starting material according to an ammonothermal process.

The ammonothermal process is a method of producing a desired nitride single crystal using a nitrogen-containing solvent such as ammonia or the like in a supercritical state and/or a subcritical state and utilizing the dissolution-precipitation reaction of the nitride crystal starting material therein. In crystal growth in the method, a supersaturation state is generated through the temperature difference based on the temperature dependence of the solubility of the nitride crystal starting material in the solvent such as ammonia or the like, thereby precipitating a crystal.

According to the production method of the first invention, a high-quality nitride crystal can be produced efficiently, at a rapid growth rate and with good starting material utilization efficiency. According to the invention, the growth rate in the c-axis direction could reach at least 100 µm/day, even at least 300 µm/day, still even at least 600 µm/day. The growth rate in the m-axis direction could reach at least 30 µm/day, even at least 100 µm/day, still even at least 300 µm/day. The growth rate in the a-axis direction could reach at least 50 µm/day, even at least 600 µm/day, still even at least 1500 µm/day.

Details of the method for producing a nitride crystal according to the ammonothermal process are explained below.

(Mineralizing Agent)

In nitride crystal growth according to the ammonothermal process in the invention, preferably, a mineralizing agent is used. Since the solubility of the nitride crystal starting material in the nitrogen-containing solvent such as ammonia in the invention is not high, a mineralizing agent is used for increasing the solubility thereof.

The mineralizing agent for use herein may be a basic mineralizing agent or an acidic mineralizing agent. The basic mineralizing agent is a compound containing an alkali metal, an alkaline earth metal or a rare earth metal with a nitrogen atom, concretely including alkaline earth metal amides, rare earth amides, alkali metal nitrides, alkaline earth nitrides, azide compounds and other hydrazine salts. Specific examples of the compounds include sodium amide (NaNH$_2$), potassium amide (KNH$_2$), and lithium amide (LiNH$_2$). The acidic mineralizing agent is preferably a halogen element-containing compound. Examples of the halogen element-containing mineralizing agent include ammonium halides, hydrogen halides, ammonium hexahalosilicates, hydrocarbylammonium fluoride, as well as alkylammonium salts such as tetramethylammonium halides, tetraethylammonium halides, benzyltrimethylammonium halides, dipropylammonium halides, isopropylammonium halides, etc.; alkyl-metal halides such as alkylsodium fluorides; and alkaline earth metal halides, metal halides, etc. Of those, preferred are alkali halides, alkaline earth metal halides, metal halides, ammonium halides and hydrogen halides that are halogen element-containing additives (mineralizing agents); more preferred are alkali halides, ammonium halides, halides of a Group 13 metal of the Periodic Table; and even more preferred are ammonium halides, gallium halides, and gallium halides. Ammonium halides include, for example, ammonium chloride ($NH_4Cl$), ammonium iodide ($NH_4I$), ammonium bromide ($NH_4Br$), ammonium fluoride ($NH_4F$).

In the invention, use of an acidic mineralizing agent including ammonium halides is especially preferred. One type alone or two or more different types of mineralizing agents may be used here either singly or as suitably combined.

The combination and the concentration ratio (molar concentration ratio) of the mineralizing agents to be used in the first invention may be suitably defined depending on the type, the shape and the size of the nitride crystal to be grown, the type, the shape and the size of the seed crystal to be used, the reaction apparatus to be used, and the temperature condition and the pressure condition to be employed, etc.

In the invention, preferably selected is an acidic mineralizing agent, and especially preferred is use of a mineralizing agent containing a fluorine element and any other at least one halogen element selected from chlorine, bromine and iodine. The combination of the halogen elements to be contained in the mineralizing agent may be a combination of two elements of chlorine and bromine, bromine and fluorine, or iodine and chlorine, or may be a combination of three elements of chlorine, bromine and fluorine; chlorine, iodine and fluorine; or bromine, iodine and fluorine, or may be a combination of four elements of chlorine, bromine, iodine and fluorine. Preferred are a combination containing at least chlorine and fluorine; a combination containing at least bromine and fluorine; and a combination containing at least iodine and fluorine. The combination of the halogen elements to be contained in the mineralizing agent for use in the first invention and the concentration ratio (molar concentration ratio) thereof may be suitably defined depending on the type, the shape and the size of the nitride crystal to be grown, the type, the shape and the size of the seed crystal to be used, the reaction apparatus to be used, and the temperature condition and the pressure condition to be employed, etc.

In the production method, also usable is a halogen element-free mineralizing agent along with the halogen element-containing mineralizing agent; and for example, the halogen element-containing mineralizing agent may be combined with an alkali metal halide such as $NaNH_2$, $KNH_2$, $LiNH_2$, etc.

For protecting the nitride crystal to be grown according to the production method from being contaminated with impurities, if desired, the mineralizing agent may be used after purified and dried. The purity of the mineralizing agent is generally at least 95% but preferably at least 99%, more preferably at least 99.99%.

Preferably, the amount of water and oxygen to be contained in the mineralizing agent is as small as possible, and preferably, the content thereof is at most 1000 ppm, more preferably at most 10 ppm, even more preferably at most 1.0 ppm.

In crystal growth according to the invention, an aluminium halide, a phosphorus halide, a silicon halide, a germanium halide, a zinc halide, an arsenic halide, a tin halide, an antimony halide, a bismuth halide or the like may exist in the reactor.

The molar concentration of the halogen element contained in the mineralizing agent is, relative to the solvent, preferably at least 0.1 mol %, more preferably at least 0.3 mol %, even more preferably at least 0.5 mol %. Also preferably, the molar concentration of the halogen element contained in the mineralizing agent is, relative to the solvent, at most 30 mol %, more preferably at most 20 mol %, even more preferably at most 10 mol %. When the concentration is too low, then the solubility may lower and the growth rate may tend to lower. On the other hand, when the concentration is too high, then the solubility may increase too much and the spontaneous nucleation may therefore increase, or the degree of supersaturation may increase too much and the process control may tend to be difficult.

(Solvent)

A nitrogen-containing solvent may be used as the solvent in the production method. The nitrogen-containing solvent may be a solvent not detracting from the stability of the nitride single crystal to be grown, concretely including ammonia, hydrazine, urea, amines (e.g., primary amines such as methylamine, secondary amines such as dimethylamine, tertiary amines such as trimethylamine, diamines such as ethylenediamine), melamine, etc. One or more of these solvents may be used here either singly or as combined.

Preferably, the amount of water and oxygen to be contained in the solvent is as small as possible for reducing the oxygen supply from any other than the nitride crystal starting material, and preferably, the content of these is preferably at most 1000 ppm, more preferably at most 10 ppm, even more preferably at most 0.1 ppm. In case where ammonia is used as the solvent, its purity is generally at least 99.9% but preferably at least 99.99%, more preferably at least 99.999%, even more preferably at least 99.9999%.

(Reactor and Installation Members)

The production method for a nitride crystal of the first invention is carried out in a reactor.

The reactor may be selected from those resistant to high-temperature and high-pressure conditions for growth of nitride crystals. The "reactor" means a vessel in which a crystal nitride is produced in the presence of a solvent in a supercritical and/or subcritical state, and preferred examples thereof include the inner structure itself of a pressure vessel, and a capsule to be installed inside a pressure vessel. The reactor may be provided with a mechanism of controlling the pressure to be applied to the reactor and the contents therein from the outside thereof, as in JP-T 2003-511326 (WO01/024921) or JP-T 2007-509507 (WO2005/043638), or may also be an autoclave not having such a mechanism.

Preferably, the reactor is selected from those resistant to high-temperature and high-pressure conditions for growth of nitride crystals. Preferably, the reactor is composed of a material having high strength at high temperatures and having pressure resistance and corrosion resistance, and more preferably used here are an Ni-based alloy and a Co-based alloy such as Stellite (registered trade mark of Deloro Stellite Company Incorporated) and the like that are excellent in corrosion resistance to solvent such as ammonia, etc. Even more preferred is an Ni-based alloy, concretely including Inconel 625 (Inconel is a registered trade mark of Huntington Alloys Canada Limited—the same shall apply hereinunder), Nimonic 90 (Nimonic is a registered trade mark of Special Metals Wiggin Limited—the same shall apply hereinunder), RENE 41 (registered trade mark of Teledyne Allvac, Inc.), Inconel 718 (Inconel is a registered trade mark of Huntington Alloys Canada Limited), Hastelloy (registered trade mark of Haynes International, Inc.), Waspaloy (registered trade mark of United Technologies, Inc.).

The compositional ratio of these alloys may be suitably selected in accordance with the temperature and pressure conditions of the solvent in the system, and also with the reactivity thereof with the mineralizing agent to be contained in the system or with the reaction products of the agent and/or the oxidation/reduction powder thereof, and the pH condition. In case where the alloy of the type is used as the material to constitute the inner surface of the reactor, the reactor itself may be formed of the alloy, or a cylinder of a thin film of the alloy may be formed and may be installed in a reactor unit in the pressure vessel, or the inner surface of the reactor formed of any desired material may be plated with the alloy.

For enhancing the corrosion resistance of the reactor, the inner surface thereof may be lined or coated with a noble metal, taking advantage of the excellent corrosion resistance of the noble metal. The material of the reactor may be a noble metal. The noble metal as referred to herein includes Pt, Au, Ir, Ru, Rh, Pd, Ag and alloys comprising the noble metal as the main ingredient thereof. Especially preferred are Pt and Pt alloys having excellent corrosion resistance.

FIG. 1 shows a specific example of a crystal production apparatus that contains a reactor usable for the production method for a nitride crystal of the first invention. FIG. 1 is a schematic view of a crystal production apparatus usable in the first invention. In the crystal production apparatus shown in FIG. 1, the crystal is grown in the capsule 20 installed as a cylindrical vessel in the autoclave 1 (pressure vessel). The inner area of the capsule 20 is composed of a starting material charging region 9 to melt the starting material therein and a crystal growing region 6 to grow the crystal therein. In the starting material charging region 9, a solvent and a mineralizing agent may be put along with the starting material 8 therein, and in the crystal growing region 6, a seed crystal 7 may be arranged by hanging it with a wire therein. Between the starting material charging region 9 and the crystal growing region 6, a baffle plate 5 to partition the two regions is arranged. Preferably, the porosity of the baffle plate 5 is from 2 to 60%, more preferably from 3 to 40%. Preferably, the material of the surface of the baffle plate is the same as the material of the reactor, capsule 20. For enhancing the corrosion resistance thereof and for increasing the purity of the crystal to be grown in the reactor, preferably, the surface of the baffle plate is formed of Ni, Ta, Ti, W, Mo, Ru, Nb, Pd, Pt, Au, Ir or pBN, more preferably W, Mo, Ti, Pd, Pt, Au, Ir or pBN, even more preferably Pt, Mo or Ti. The crystal production apparatus of FIG. 1 is so designed that the space between the inner wall of the autoclave 1 and the capsule 20 could be filled with a second solvent. The space may be charged with nitrogen from the nitrogen gas cylinder 13 via the valve 10, or may be charged with ammonia as the second solvent from the ammonia cylinder 12 while the flow rate thereof is confirmed with the mass flow meter 14. The space may be depressurized to the necessary reduced pressure via the vacuum pump 11. The crystal production apparatus to be used in carrying out the production method for a nitride crystal of the first invention does not always require a valve, a mass flow meter and a conduit pipe.

Figure 2:
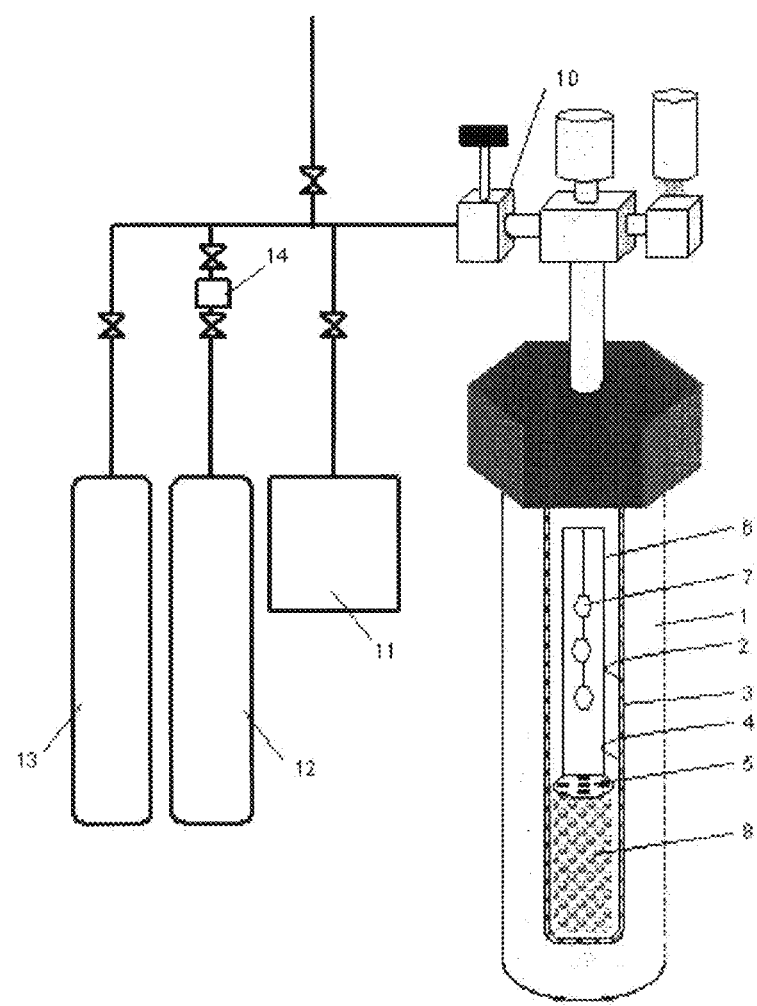
FIG. 2 is a schematic view of another crystal production apparatus according to an ammonothermal process usable in the invention.

The autoclave 1 may have the lining 4 for securing corrosion resistance and may be used as a reactor, not using the capsule, as in the crystal production apparatus of FIG. 2. The lining material is preferably at least one metal or element of Pt, Ir, Ag, Pd, Rh, Cu, Au and C, or an alloy or a compound containing at least one such metal, more preferably at least one metal or element of Pt, Ag, Cu and C, or an alloy or a compound containing at least one such metal for the reason that lining with it is easy. For example, there are mentioned a Pt simple substance, a Pt—Ir alloy, an Ag simple substance, a Cu simple substance, graphite, etc. The case of using a capsule as in FIG. 1 may also be given the lining as above.

(Production Step)

One example of the production method for a nitride crystal of the first invention is described. In carrying out the production method for a nitride crystal of the first invention, first, a seed crystal, a nitrogen-containing solvent, a starting material and a mineralizing agent are put into the reactor and sealed up. In this, as the seed crystal, the plane direction thereof is not specifically defined, but a crystal grown on the C-plane as the main plane is cut in a desired direction to give a substrate of which the main plane is a non-polar plane or a semipolar plane. Accordingly, a seed crystal having a non-polar plane such as M-plane, or a semipolar plane such as (10-11), (20-21) or the like can be prepared.

Prior to introducing these materials, the nitride crystal starting material, the mineralizing agent, the baffle plate or the seed crystal or the like, into the reactor, the reactor may be degassed. In introducing the materials, an inert gas such as nitrogen gas or the like may be made to run in the reactor. In general, the seed crystal is charged in the reactor simultaneously or after charging with the starting material and the mineralizing agent. Preferably, the seed crystal is fixed to the tool made of the same noble metal as the noble metal of constituting the inner surface of the reactor. After the charging, if desired, the container may be degassed under heat.

In case where the production apparatus of FIG. 1 is used, a seed crystal, a nitrogen-containing solvent, a starting material and a mineralizing agent are put into the reactor, capsule 20, and sealed up, and then the capsule 20 is installed in the pressure vessel (autoclave) 1, and preferably, the space between the pressure vessel and the reactor is filled with a second solvent, and then the pressure vessel is sealed up.

Subsequently, the whole is heated so as to make the reactor vessel in a supercritical and/or subcritical state. In the supercritical state, in general, the viscosity of the reaction mixture in the reactor is low and the reaction mixture could be more readily diffused than liquid but has the same solvation power as that of liquid. Subcritical state means a state of a liquid that has nearly the same density as the critical density at around the critical temperature thereof. For example, in the starting material charging region, the starting material charged therein is melted in a supercritical state, and in the crystal growing region, the temperature is changed so as to provide a subcritical state therein, and accordingly crystal growth is possible in the region by utilizing the solubility difference between the starting material in a supercritical state and that in a subcritical state.

In order to make it in a supercritical state, in general, the reaction mixture is kept at a temperature higher than the critical point of the solvent used. When an ammonia solvent is used, the critical point thereof is a critical temperature of 132° C. under a critical pressure of 11.35 MPa; however, in case where the filling rate to the volume of the reactor is high, the pressure may be much higher than the critical pressure even at a temperature lower than the critical temperature. In the invention, "supercritical state" includes a state where the pressure is higher than the critical pressure. The reaction mixture is sealed up in the reactor having a given volume, and therefore the temperature elevation increases the pressure of the fluid. In general, when T>Tc (critical temperature of one solvent) and P>Pc (critical pressure of one solvent), then the fluid could be in a supercritical state.

Under the supercritical condition, a nitride crystal can fully grow at a sufficient growth rate. The reaction time depends especially on the reactivity of the mineralizing agent used and on the thermodynamic parameters, or that is, the values of the temperature and the pressure of the system. During production and growth of a nitride crystal, the pressure inside the reactor is preferably not lower than 120 MPa from the viewpoint of the crystallinity and the productivity of the crystal, more preferably not lower than 150 MPa, even more preferably not lower than 180 MPa. Also preferably, the pressure inside the reactor is not higher than 700 MPa from the viewpoint of safety, more preferably not higher than 500 MPa, even more preferably not higher than 350 MPa, still more preferably not higher than 300 MPa. The pressure can be suitably defined depending on the temperature and on the filling rate of the solvent volume relative to the volume of the reactor. Naturally, the pressure in the reactor is indiscriminately defined depending on the temperature and the filling rate therein, but in fact, varies in some degree depending on the starting material, the additives such as the mineralizing agent and others, the temperature unevenness inside the reactor, and the presence of a free volume therein.

Regarding the temperature range in the reactor, the lower limit is preferably 500° C. or higher from the viewpoint of the crystallinity and the productivity of the crystal, more preferably 515° C. or higher, even more preferably 530° C. or higher. The upper limit is preferably 700° C. or lower from the viewpoint of safety, more preferably 650° C. or lower, even more preferably 630° C. or lower. In the production method for a nitride crystal of the first invention, preferably, the temperature in the starting material charging region inside the reactor is higher than the temperature in the crystal growing region therein.

Preferably, the temperature difference between the two regions (|□T|) is at least 5° C. from the viewpoint of the crystallinity and the productivity of the crystal, more preferably at least 10° C., and also preferably at most 100° C., more preferably at most 90° C., even more preferably at most 80° C. The optimum temperature and pressure inside the reactor may be suitably defined depending on the type and the amount of the mineralizing agent and other additives to be used in crystal growth therein.

The charging ratio, or that is, the filling rate of the solvent in the reactor for attaining the above-mentioned temperature range and pressure range in the reactor may be generally from 20 to 95% but preferably from 30 to 80%, more preferably from 40 to 70%, based on the free volume of the reactor, or that is, in case where a nitride crystal starting material and a seed crystal are put in the reactor, the liquid density at the boiling point of the residual volume to be obtained by subtracting the volume of the seed crystal and that of the structure to hold the seed crystal from the volume of the reactor, and in case where a baffle plate is installed, that of the residual volume obtained by further subtracting the volume of the baffle plate from the volume of the reactor. In case where the capsule 20 as in FIG. 1 is used as the reactor, preferably, the solvent amount is suitably controlled so as to attain a well-balanced pressure inside and outside the capsule 20 in the supercritical state of the solvent.

The nitride crystal in the reactor may be grown by heating the reactor by the use of an electric furnace having a thermocouple, and by keeping reactor in a subcritical state of a supercritical state of the solvent such as ammonia or the like therein. The heating method and the heating rate up to the predetermined reaction temperature are not specifically defined, but in general, the reactor may be heated for from a few hours to a few days. If desired, a multi-stage heating mode may be employed, or the heating speed may be changed in the heating temperature range. Also if desired, the reactor may be heated while partially cooled.

The "reaction temperature" may be measured with a thermocouple arranged to be in contact with the outer surface of the reactor and/or a thermocouple inserted into the hole formed in a predetermined depth from the outer surface of the reactor, and from the found data, the internal temperature of the reactor could be estimated. The data measured with these thermocouples may be averaged to be the mean temperature of the reactor. In general, the temperature in the starting material charging region and the temperature in the crystal growing region may be averaged to give the mean temperature inside the reactor.

In the production method for a nitride crystal of the first invention, the seed crystal may be pretreated. The pretreatment includes, for example, melt-back treatment of the seed crystal, polishing the crystal growing surface of the seed crystal, washing the seed crystal, etc.

In heating the autoclave in the production method for a nitride crystal of the first invention, the crystal growing surface of the seed crystal may be given melt-back treatment by keeping the surface at a predetermined temperature. Through the melt-back treatment, the crystal growing surface of the seed crystal and also the crystal nuclei adhering to the members in the apparatus can be melted. Regarding the melt-back treatment condition, the mean temperature difference between the crystal growing region (the growing region) and the starting material charging region (the starting material region) is preferably at least 0° C., more preferably at least 10° C., even more preferably at least 20° C. and is preferably at most 100° C., more preferably at most 80° C., even more preferably at most 60° C. The temperature in the crystal growing region during the melt-back treatment is preferably not lower than 500° C., more preferably not lower than 550° C., even more preferably not lower than 600° C., and is preferably not higher than 650° C., more preferably not higher than 630° C. The temperature in the starting material charging region is preferably not lower than 500° C., more preferably not lower that 550° C., even more preferably not lower than 590° C., and is preferably not higher than 650° C., more preferably not higher than 630° C.

During the melt-back treatment, the pressure inside the reactor is preferably at least 100 MPa, more preferably at least 150 MPa, even more preferably at least 180 MPa. The treatment time for the melt-back treatment is preferably at least 1 hour, more preferably at least 5 hours, even more preferably at least 10 hours. Also preferably, the time is at most 200 hours, more preferably at most 100 hours, even more preferably at most 50 hours.

In the pretreatment, the surface (on which a nitride crystal is to grow) of the seed crystal may be polished, for example, in a mode of chemical mechanical polishing (CMP) or the like. Regarding the surface roughness of the seed crystal, for example, the root-mean-square roughness (Rms) thereof, as measured with an atomic force microscope, is preferably at most 1.0 nm from the viewpoint of uniformly attaining the melt-back treatment and the subsequent crystal growth, more preferably 0.5 nm, even more preferably 0.3 nm.

The reaction time after having reached the predetermined temperature may vary depending on the type of the nitride crystal, the type of the starting material and the mineralizing agent to be used, and the size and the amount of the crystal to be produced, but may be generally from a few hours to a few hundred days. During the reaction, the reaction temperature may be kept constant or may be gradually elevated or lowered. After the reaction time to form the desired crystal, the system is cooled. The cooling method is not specifically defined. For example, the heating with the heater may be stopped and the reactor may be cooled while left in the furnace, or the reactor may be taken out of the electric furnace and may be cooled in air. If desired, the reactor may be rapidly cooled with a coolant, and the mode is also preferred.

After the temperature of the outer surface of the reactor or the presumed temperature inside the reactor has reached a predetermined temperature, the reactor is opened. In this stage, the predetermined temperature is not specifically defined, but may be generally from −80° C. to 200° C., preferably from −33° C. to 100° C. In this, a duct may be connected to the duct connecting mouth of the valve attached to the reactor, and may be connected to a container filled with water or the like, and the valve may be opened. Further if desired, the system may be kept in vacuum to thereby fully remove the ammonia solvent from the reactor, and then the reactor may be dried and opened to take out the formed nitride crystal and the unreacted starting material and mineralizing agent and other additives.

In case where gallium nitride is produced according to the production method for a nitride crystal of the first invention, JP-A 2009-263229 may be preferably referred to for the other details of the material, the production condition, the production apparatus and the step than those mentioned above. The entire contents of the disclosure in the patent publication are hereby incorporated in this description by reference.

In the production method for a nitride crystal of the first invention, the nitride crystal grown on the seed crystal may be post-treated. The type and the object of the post-treatment are not specifically defined. For example, the crystal surface may be given melt-back treatment in the cooling step after the growing step in order that the crystal defects such as pits, dislocations and the like can be readily detected.

In the production method for a nitride crystal of the first invention, when the nitride crystal starting material is completely dissolved under the condition where the temperature and the pressure are kept under the crystal growth condition, then the grown crystal may dissolve; and accordingly, from the viewpoint that a minor amount of the nitride crystal starting material is preferably kept remaining after the crystal growth step, the dissolution rate of the nitride crystal starting material is preferably at least 40%, more preferably from 40% to 96%, even more preferably from 50% to 85%, still more preferably from 70% to 80%. The dissolution rate can be defined as (starting material put in the reactor before the crystal growth step−starting material having remained in the rector after the crystal growth step)/(starting material put in the reactor before the crystal growth step).

<Second Invention>

In the second invention, a nitride crystal starting material that has a bulk density of from 0.7 to 4.5 g/cm$^3$ and has an oxygen concentration in the crystal of from 10 to 500 ppm is charged in the starting material charging region of a reactor, and processed for nitride crystal growth in the presence of a solvent in a supercritical state and/or a subcritical state in the reactor.

In the production method for a nitride crystal of the second invention (hereinafter this may be referred to as the production method of the second invention), a nitride crystal starting material having an oxygen concentration of from 10 to 500 ppm is used and a nitride crystal is produced from the nitride crystal starting material according to an ammonothermal process. Concretely, the production method of the second invention comprises a step of charging a nitride crystal starting material having an oxygen concentration of from 10 to 500 ppm in the starting material charging region of a reactor, followed by nitride crystal growth in the presence of a nitrogen-containing solvent in a supercritical state and/or in a subcritical state in the reactor.

The nitride crystal starting material for use in the second invention and the method for nitride crystal growth using the nitride crystal starting material are described below.

(Crystal Starting Material)

In the second invention, used is a nitride crystal starting material that contains an atom to constitute the nitride crystal to be grown according to an ammonothermal process. For example, in case where a nitride crystal of a Periodic Table Group 13 metal is desired to be grown, a starting material that contains the Periodic Table Group 13 metal is used. Preferred is use of a polycrystalline starting material or a single-crystal starting material of a Group 13 nitride crystal, and this may be combined with a Group 13 metal (element) to give a starting material for use herein. The polycrystalline starting material is not always required to be a complete nitride but may contain a metal component in which the Group 13 atom is in a state of metal (zero-valent), if possible. For example, for the case where the nitride crystal to be grown is gallium nitride, there is mentioned a mixture of gallium nitride and metal gallium as the nitride crystal starting material. Regarding the type of the nitride crystal to be obtained in the second invention, there are mentioned GaN, InN, AlN, InGaN, AlGaN, AlInGaN, etc. Preferred are GaN, AlN, AlGaN, AlInGaN; and more preferred is GaN. Accordingly, as the nitride crystal starting material, herein usable are the polycrystalline starting material of the above-mentioned crystals and/or a combination thereof with those metals.

(Oxygen Concentration in Crystal Starting Material)

The production method for a nitride crystal of the second invention includes a growth step of nitride crystal growth where a nitride crystal starting material having an oxygen concentration in the crystal of from 10 to 500 ppm is processed for nitride crystal growth in the presence of a nitrogen-containing solvent in a supercritical state and/or a subcritical state in a reactor.

The oxygen concentration in the nitride crystal starting material is at least 10 ppm for securing a sufficient amount of the dopant, preferably at least 15 ppm, more preferably at least 16 ppm, even more preferably at least 20 pm. Also, the oxygen concentration in the nitride crystal starting material is at most 500 ppm for producing a high-quality crystal having few impurities, preferably at most 150 ppm, more preferably at most 120 ppm, even more preferably at most 80 ppm. When the oxygen concentration in the nitride crystal starting material is controlled to fall within the above-mentioned range, the carrier concentration in the nitride crystal to be obtained can be controlled to be from $5 \times 10^{17}$ to $5 \times 10^{19}$ atoms/cm³, and a high-quality nitride crystal can be thereby obtained.

The production method for the nitride crystal starting material having an oxygen concentration of from 10 to 500 ppm is not specifically defined. As the nitride crystal starting material having an oxygen concentration of from 10 to 500 ppm, usable here is one produced according to an ordinary HVPE process, or one produced according to an ammonothermal process. For example, in case where the nitride crystal starting material is produced according to an HVPE process, water vapor is introduced into the reactor and the oxygen concentration is thereby suitably controlled to produce the intended nitride crystal starting material. Preferably, the water vapor to be used here is prepared by mixing diluted oxygen and water in a reactor.

In the second invention, the correlative relationship between the oxygen concentration in the nitride crystal starting material and the carrier concentration in the grown nitride crystal can be clarified according to the relational formula mentioned below. With that, oxygen doping of high reproducibility is realized.

In the second invention, the activation ratio of the nitride crystal formed according to an ammonothermal process can be represented by the following formula. In the second invention, the activation ratio indicates the proportion of the dopant capable of functioning as a carrier inside the nitride crystal.

$$\eta(\%) = [CC]/[D] \times 100$$

In the above formula, $\eta$ means the dopant activation ratio (unit: %); [CC] means the carrier concentration (unit: cm⁻³); and [D] means the dopant concentration (unit: cm⁻³). In general, the carrier concentration can be determined by analyzing the obtained crystal through Hall measurement, Raman spectrometry, C-V characteristic analysis, mobility measurement with eddy current, etc. As the case may be, it is desirable that the obtained nitride crystal is annealed to activate the carrier therein, and then the carrier concentration in the crystal is measured. The dopant concentration can be determined by analyzing the obtained nitride crystal through SIMS followed by summing up the concentration of the atoms capable of acting as an n-type dopant such as oxygen, Si, etc. However, in case where the amount of the other dopant than oxygen such as Si, halogen element and the like as taken in the crystal is extremely small as compared with oxygen therein, the concentration of the typical dopant, oxygen may be considered as the dopant concentration.

As a result of the investigations made by the inventors of the second invention, it has been clarified that the dopant activation ratio to be calculated according to the above-mentioned formula for the nitride crystal obtained according to an ammonothermal process could not be 100%, differing from that of the nitride crystal obtained according to an HVPE process, but is from 10 to 90%, and when the data of the ammonothermal crystals obtained under different growth conditions are averaged, the dopant activation ratio is about 45%. From this, it has been found that the oxygen concentration to be doped in the nitride crystal obtained according to an ammonothermal process falls within a range of from 1.1 to 10 times the intended carrier concentration. Concretely, it is desirable that the oxygen concentration to be doped in the obtained nitride crystal is from $1.5 \times 10^{18}$ to $2.5 \times 10^{19}$ atoms/cm³; and for doping the crystal to such a level, the oxygen concentration in the nitride crystal starting material may be within a range of from 10 to 500 ppm. According to the production method of the second invention, preferably, from 40 to 60% by weight of the oxygen amount contained in the nitride crystal starting material is taken in the obtained nitride crystal, more preferably about 50% by weight is taken therein. The oxygen amount to be taken in the nitride crystal from the nitride crystal starting material can be controlled by suitably controlling the crystal growth condition. Concretely, when the halogen intake amount in the nitride crystal increase, then the oxygen intake amount tends to decrease. Accordingly, the oxygen amount in the nitride crystal may also be controlled by suitably changing the amount of halogen to be used as the mineralizing agent and the ratio of the halogen species.

From the above-mentioned activation ratio calculation formula, the oxygen amount to be doped in order that the nitride crystal can have a desired carrier concentration can be derived, and further from this, the amount of oxygen that the nitride crystal starting material is to contain can be derived.

Figure 4:
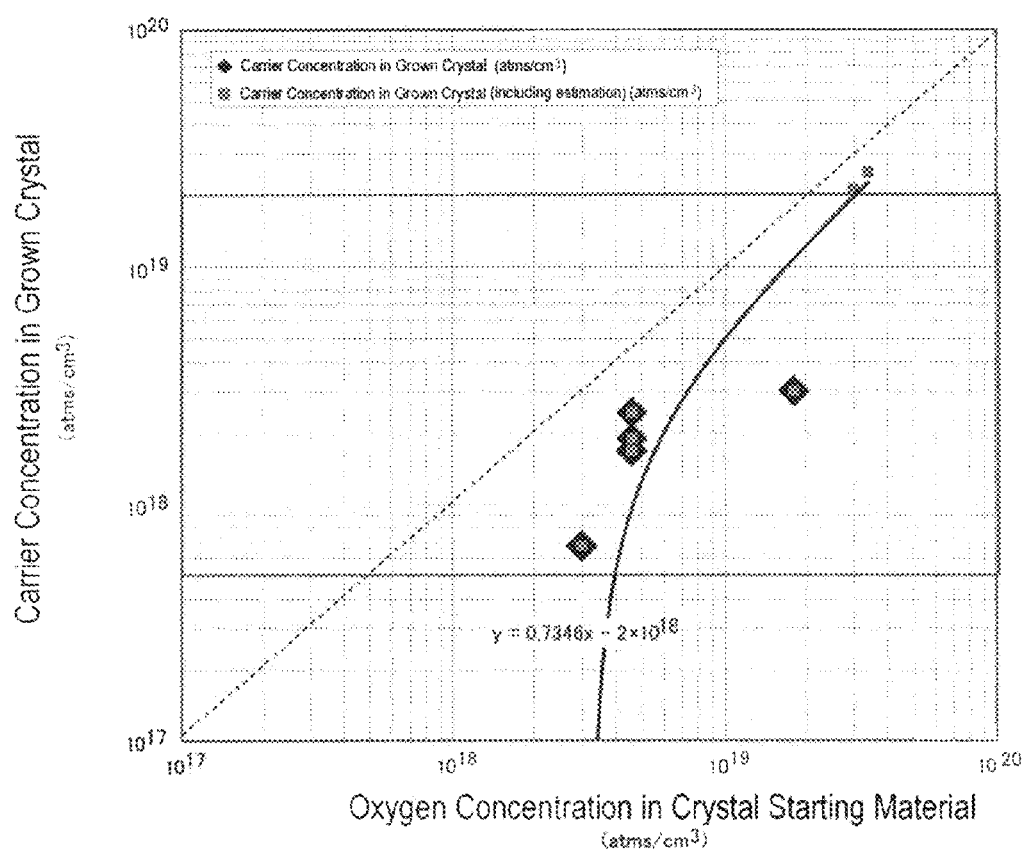
FIG. 4 is a graph showing a relationship between an oxygen concentration in an nitride crystal starting material and a carrier concentration in a growing crystal.

Further, in the second invention, the relationship between the oxygen concentration in the nitride crystal starting material and the carrier concentration in the crystal can be represented by the following formula from the linear approximate equation shown in FIG. 4.

$$Y = 0.7346X - 2 \times 10^{18}$$

In the above formula, X means the oxygen concentration in the nitride crystal starting material; and Y means the carrier concentration in the obtained nitride crystal. The carrier concentration in the obtained crystal can be estimated from the oxygen concentration in the starting material.

In the second invention, oxygen doping with high reproducibility is realized in an ammonothermal process by using the above-mentioned correlative relational formula. Accordingly, a nitride crystal having a different carrier concentration can be produced with ease in accordance with the use of semiconductor devices.

In the second invention, the production condition for the nitride crystal having a desired carrier concentration can be established by using the above-mentioned correlative relational formula. Accordingly, accurate doping is realized in an ammonothermal process, and a high-quality nitride crystal can be thereby obtained.

Further, by using the above-mentioned correlative relational formula, the production efficiency for the nitride crystal having an intended carrier concentration can be increased.

In the production method of the second invention, preferably, the amount of the n-type dopant except oxygen to be contained in the nitride crystal starting material is at most 1000 ppm, more preferably at most 100 ppm, even more preferably at most 10 ppm. In producing the nitride crystal starting material, it is desirable that the n-dopant is not mixed in the nitride crystal starting material in an amount more than a predetermined level. When the amount of the n-dopant except oxygen in the nitride crystal starting material is controlled to be not more than the above-mentioned upper limit, then the condition for obtaining the nitride crystal having a desired carrier concentration can be defined more accurately.

The other n-type dopant than oxygen includes, for example, Si, Ge, Se, S, F, I, Cl, C, etc. The dopant is added to the nitride crystal as an n-type dopant therein, and acts as a carrier in the nitride crystal. Si is the most popular dopant in a gallium crystal nitride.

As having a high activation ratio, oxygen is useful as an n-type dopant. Accordingly, in the second invention, it is desirable that oxygen is doped in the nitride crystal in order that the crystal contains a desired concentration of a carrier. Doping the nitride crystal with oxygen enhances the workability of the nitride crystal, as compared with Si-doping. In the second invention, the nitride crystal is doped with oxygen, and therefore, the content of Si that is also an n-type dopant is preferably less than a predetermined level.

In the second invention, preferably, a nitride crystal starting material mixed uniformly with oxygen is used to thereby secure a uniform carrier concentration in the obtained nitride crystal.

In the crystal growth method of the second invention, the nitride crystal starting material is dissolved in a reactor and at the same time, a nitride crystal is grown therein. Oxygen uniformly mixed in the nitride crystal starting material is gradually released in the reactor while the starting material is dissolved, and then successively taken in the nitride crystal. Oxygen is uniformly mixed in the nitride crystal starting material, and therefore the amount of oxygen to be taken in the nitride crystal during the growth process can be constant, and the carrier concentration in the nitride crystal can be uniform. In that manner, in the second invention, the dopant source is mainly limited to the nitride crystal starting material, and therefore the oxygen dopant can be uniformly added to the nitride crystal. Since the nitride crystal can have a uniform carrier concentration as a whole, the electroconductivity of the crystal can be stabilized and the quality of the nitride crystal can be enhanced favorably.

It is desirable that the nitride crystal obtained according to an ammonothermal process is annealed so that the dopant is activated. The annealed dopant to be contained in the nitride single crystal is activated, thereby the carrier activation rate can be from 10 to 90%, and also the mobility can be increased fully. The annealed time is not specifically defined, but it is preferably at least 5.5 hours, more preferably at least 8 hours, even more preferably at least 10 hours, still more preferably at least 12 hours and is preferably at most 300 hours, more preferably at most 150 hours, even more preferably at most 120 hours, still more preferably at most 100 hours.

The annealed temperature is preferably at least 750° C., more preferably at least 800° C., even more preferably at least 850° C., still more preferably at least 900° C. and is preferably at most 1250° C., more preferably at most 1200° C., even more preferably at most 1100° C., still more preferably at most 1050° C. In case at most 1250° C., the annealed mass depletion may be prevented. The annealed temperature may be kept constant or may be gradually changed or continuously changed. Preferably, these processes may be suitably combined.

Preferably, annealed processes are attained in an atmosphere containing one or more group selected with ammonia, nitrogen, oxygen or hydrogen. Preferred are attained in the atmosphere containing nitrogen at least. The proportion of nitrogen is preferably at least 50%, more preferably at least 60%, even more preferably at least 70%. Still more preferably, annealed processes are attained in the atmosphere of 100% nitrogen.

(Bulk Density of Crystal Starting Material)

In an ammonothermal process, in general, a starting material charging region where a nitride crystal starting material is charged and a crystal growing region where a seed crystal is put are arranged in a reactor, and in the starting material charging region, a nitride crystal starting material is dissolved and in the crystal growing region, a nitride crystal is grown on the seed crystal. In this, a temperature difference is given to the starting material charging region and the crystal growing region, and the reactor is preferably so controlled that the nitride crystal starting material can be dissolved more in the starting material charging region and a good nitride crystal can be readily precipitated in the crystal growing region. Therefore, the nitride crystal starting material of which the bulk density falls within a range of from 0.7 to 4.5 g/cm$^3$ is used. More preferably, the bulk density is at least 1.5 g/cm$^3$, even more preferably at least 1.8 g/cm$^3$, and is more preferably at most 4.0 g/cm$^3$, even more preferably at most 3.0 g/cm$^3$. Preferably, the solubility of the nitride crystal starting material in the starting material charging region to be mentioned below is controlled by using one or more such nitride crystal starting materials having a bulk density to fall within the range, either alone or as combined. In addition, the solubility of the nitride crystal starting material can be increased to secure uniform dissolution, and therefore, oxygen contained in the nitride crystal starting material can be uniformly and efficiently doped in the obtained nitride crystal, and a good-quality nitride catalyst is obtained favorably.

The "bulk density" of the individual nitride crystal starting materials each having a different bulk density means the weight per unit volume of the nitride crystal starting material charged in a suitable vessel; and this may be obtained by dividing the weight of the charged nitride crystal starting material by the volume of the vessel. In general, the aggregates of nitride crystal starting materials that are said to have the same bulk density have a similar morphology, and the aggregate of which the ratio of the maximum value of the particle size to the minimum value thereof is at most 100/1 is referred to as "one type of nitride crystal starting material" having nearly the same bulk density. Preferably, one type of nitride crystal starting material has a smaller weight fluctuation per one particle. The preferred range of the standard deviation at the weight per one particle may vary depending on the size of the reactor to be used, but is, in general, preferably at most 8.0, more preferably at most 7.0, even more preferably at most 6.0. In particular, when the diameter of the reactor is 26 mm or so, it is desirable that a starting material having a mean weight of from 0.6 to 1.2 g/particle and a standard deviation of from 0.35 to 0.48 is used. When the diameter of the reactor is 60 mm or so, preferably, a starting material having a mean weight of from 5.0 to 8.5 g/particle and a standard deviation of at most 5.4 is used. When the diameter of the reactor is 130 mm or so, preferably, a starting material having a mean weight of from 5.0 to 10.5 g/particle and a standard deviation of at most 2.1 is used.

In the production method of the second invention, so far as the nitride crystal starting material of which the bulk density falls within a range of from 0.7 to 4.5 g/cm$^3$, one type of nitride crystal starting material may be used alone or two or more different types of nitride crystal starting materials each having a different bulk density may be used as combined. Preferably, however, one type of nitride crystal starting material is used as capable of attaining uniform dissolution and capable of obtaining a uniform nitride crystal.

One concrete calculation example for the bulk density of the nitride crystal starting material in the second invention is shown. For example, in a case where 100 g of a GaN crystal starting material is installed in the lower region of a cylindrical vessel having an inner diameter of 20 mm and the height from the lowermost side of the region where the starting material is put (the bottom of cylinder inside) to the uppermost side thereof is 100 mm, the bulk density is calculated as 100 g/(314 mm$^2$×100 mm), and is about 3.18 g/cm$^3$. While kept in a vessel, the starting material may be analyzed through CT scanning (computed tomography scanning). For example, the void ratio in the container filled with the starting material, as measured through CT scanning, was 70%. Accordingly, the bulk density corresponds to the weight of the solid having a volume of about 30%, and can be calculated according to the following equation in which the density of gallium nitride is 6.1 g/cm$^3$.

6.1 g/cm$^3$×0.3=1.83 g/cm$^3$ (bulk density)

In the production method of the second invention, the nitride crystal starting material is charged in the starting material charging region in the reactor in such a controlled manner that the bulk density of the starting material in the region could be fall within a range of from 0.7 to 4.5 g/cm$^3$, and this is favorable since the solvent convection flow is not retarded and the dissolution rate of the starting material can be increased to thereby efficiently grow a good-quality crystal.

The "starting material charging region" as referred to in the second invention is meant to indicate the region inside the reactor sandwiched between the horizontal plane including the lowermost edge of the crystal starting material charged in the reactor and the horizontal plane including the uppermost edge of the charged crystal starting material, in case where the reactor before the start of reaction is so installed that its long axis could be in the vertical direction.

The "bulk density" of the nitride crystal starting material in the starting material charging region is the weight per the unit volume of the nitride crystal starting material charged in the starting material charging region, and can be determined by dividing the weight of the nitride crystal starting material by the free volume of the starting material charging region. The free volume of the starting material charging region as referred to herein is the volume as determined by subtracting the solid except the crystal starting material existing in the starting material charging region from the inner volume of the starting material charging region of the reactor. Examples of the solid include structures such as a baffle plate, a supporting frame for supporting a seed crystal supporting frame, a crucible for keeping a nitride crystal starting material therein, a basket, a reticulated structure, etc. By removing the volume of these structures in the starting material charging region, the free volume can be obtained.

The bulk density of the nitride crystal starting material in the starting material charging region can be converted into the filling rate of the nitride crystal starting material in the region. Dividing the bulk density by the specific gravity of the nitride crystal starting material followed by centuplication gives the filling rate (unit %).

When the bulk density of the nitride crystal starting material in the starting material charging region is too large, the volume of the space to exist between the crystal starting material particles may reduce, whereby the solvent convection flow is retarded and the solubility rate of the starting material lowers. In that condition, it would difficult to grow a good-quality crystal with good productivity. On the other hand, when the bulk density of the nitride crystal starting material is too small, then the crystal starting material could well dissolve but the amount of the starting material per volume capable of being put into the reactor may reduce. In that condition, therefore, it would be difficult to efficiently supply a sufficient amount of the dissolved starting material to the crystal growing region to rapidly grow a nitride crystal having a sufficient size. Preferably, the bulk density of the nitride crystal starting material in the starting material charging region is at least 0.7 g/cm$^3$, more preferably at least 0.8 g/cm$^3$, even more preferably at least 0.9 g/cm$^3$, still more preferably at least 1.0 g/cm$^3$, furthermore preferably at least 1.1 g/cm$^3$. Also preferably, the bulk density of the nitride crystal starting material in the starting material charging region is at most 4.5 g/cm$^3$, more preferably at most 4.0 g/cm$^3$, furthermore preferably at most 3.6 g/cm$^3$, even more preferably at most 3.2 g/cm$^3$, still more preferably at most 3.0 g/cm$^3$. When the bulk density of the nitride crystal starting material in the starting material charging region is controlled to fall within the above range, then the solvent convection flow is not retarded and the dissolution rate of the starting material can be increased to efficiently grow a good-quality crystal.

The bulk density of the nitride crystal starting material in the starting material charging region can be controlled, for example, by suitably selecting the particle size, the particle size distribution and the shape of the nitride crystal starting material to be used. Specifically, when the nitride crystal starting material is put into the starting material charging region in the reactor and when the nitride crystal starting material is so selected as to have a suitable particle size and a suitable shape in order that the individual nitride crystal starting material particles could readily be stacked up while suitably spaced from each other, then the bulk density of the starting material may be low. For example, by using a nitride crystal starting material having a large particle size or by using a nitride crystal starting material that is amorphous and has an asymmetric particle shape, the bulk density can be lowered. On the contrary, when the nitride crystal starting material is put into the starting material charging region in the reactor and when the nitride crystal starting material is so selected as to have a suitable particle size and a suitable shape in order that the individual nitride crystal starting material particles could be densely stacked up, then the bulk density of the starting material can be high. For example, by using a nitride crystal starting material having a small particle size, or by using a nitride crystal starting material having a large particle size and, as combined, a nitride crystal starting material having a small particle size so that the latter could step into the space between the particles of the former, or by using a uniform nitride crystal starting material having a crystal shape that can be charged densely in the starting material charging region, the bulk density can be low.

The bulk density of the nitride crystal starting material in the starting material charging region can be controlled by imparting some energy to the crystal starting material having been charged in the starting material charging region. For example, the bulk density can be controlled by shaking or rotating the reactor after the crystal starting material has been charged in the starting material charging region, or by mixing the charged crystal starting material with a stirring rod or a rotating blade. The charged crystal starting material may be shaken by directly shaking the reactor, or in a mode of non-contact shaking with ultrasonic waves or the like.

The bulk density of the crystal starting material in the starting material charging region can also be controlled by installing some structures in the starting material charging region. As the structure, for example, a reticulated structure through which a solvent could pass but in which the crystal starting material could not may be favorably employed here. With the reticulated structure of the type, the existing region of the crystal starting material in the starting material charging region can be controlled and the bulk density thereof can be thereby controlled. Specifically, the existing region of the crystal starting material is limited to a narrow region and the region where the crystal starting material could not exist is widely secured, whereby the bulk density can be controlled low. For example, when the crystal starting material is filled in a reticulated structure having a smaller volume than that of the starting material charging region and when this is put in the starting material charging region, then the bulk density can be made low.

On the contrary, by installing a hollow reticulated structure not charged with the crystal starting material in the starting material charging region, the bulk density may also be controlled. For example, the reticulated structure of the type is mixed with the crystal starting material and may be charged in the starting material charging region. In this case, by controlling the mixing ratio of the two, the bulk density can be controlled. The reticulated structure may be previously fixed in the starting material charging region. Multiple reticulated structures of those types may be used here. Also employable here is a non-reticulated structure through which the solvent used can pass.

(Particle Size of Nitride Crystal Starting Material)

The preferred range of the particle size of the nitride crystal starting material for use in the second invention varies depending on the size of the reactor to be used from the viewpoint of the easiness in controlling the bulk density of the starting material and the easiness in handling the starting material. Concretely, when the size of the reactor is large, then the particle size of the nitride crystal starting material may be large. For example, in the case where a reactor having a diameter of 26 mm or 30 mm or so is used, then the maximum diameter of the starting material particle is preferably 0.5 µm or more, more preferably 1 µm or more, even more preferably 10 µm or more, but is preferably at most 20 mm, more preferably at most 15 mm, even more preferably at most 10 mm. In the case where a reactor having a diameter of 60 mm or so is used, then the maximum diameter of the starting material particle is preferably 0.5 µm or more, more preferably 1 µm or more, even more preferably 10 µm or more, but is preferably at most 50 mm, more preferably at most 30 mm, even more preferably at most 20 mm.

In the case where a reactor having a diameter of 130 mm or so is used, then the maximum diameter of the starting material particle is preferably 0.5 µm or more, more preferably 1 µm or more, even more preferably 10 µm or more, but is preferably at most 120 mm, more preferably at most 60 mm, even more preferably at most 30 mm.

Preferably, the nitride crystal starting material for use in the second invention has an aggregated structure of nitride crystal starting material particles. Concretely, preferred for use herein are tertiary particles formed through aggregation of secondary particles. Preferably, the particle size of the secondary particles is at least 100 µm, more preferably at least 200 µm, even more preferably at least 300 µm, but is preferably at most 1000 µm, more preferably at most 900 µm, even more preferably at most 800 µm. Preferably, the particle size of the tertiary particles is at least 1 mm, more preferably at least 5 mm, even more preferably at least 10 mm, but is preferably at most 120 mm, more preferably at most 60 mm, even more preferably at most 50 mm, even more preferably at most 30 mm, even more preferably at most 20 mm. The particle size of the secondary particles can be measured with an optical microscope, etc. The tertiary particles of not smaller than 1 mm can be confirmed through visual inspection, and can be therefore measured with a caliper, a ruler or the like. The maximum diameter of the tertiary particles formed through aggregation of secondary particles corresponds to the above-mentioned "particle size" of the nitride crystal starting material.

Of the nitride crystal having a configuration formed through aggregation of the above-mentioned nitride crystal starting material particles, the primary particle means a nano-level single crystal, and multiple single crystals aggregate together and bond to each other to form polycrystalline secondary particles. In general, primary particles bond to each other and are integrated, and they could not be individually differentiated from each other. Further, in case where the shape of the nitride crystal starting material for use in the invention is a coral-like one as described below, the maximum diameter of the particles thereof is determined to cover the projections on the surface thereof.

Regarding the particle size distribution of the nitride crystal starting material for use in the second invention, preferably, the crystal starting material having a particle diameter of at least 0.01 µm accounts for at least 20% by volume of the entire crystal starting material, more preferably at least 30%, since the space between the crystal starting material particles could be sufficient to secure the solvent convection therethrough. The crystal starting material having a particle diameter of at least 1.0 mm accounts for at least 10% by volume of the entire crystal starting material, more preferably at least 30%, even more preferably at least 50%, even more preferably at least 80%, since the space between the crystal starting material particles could be sufficient to secure the solvent convection therethrough.

(Shape of Nitride Crystal Starting Material)

The shape of the nitride crystal starting material for use in the second invention may be a spherical one, a granular one of which the cross section is oval, a tabular one, a rectangular one, a triangular one or a coral one. (The coral shape means a shape having projections on the surface thereof, and therefore has an increased surface area.) Preferably, a space is given between the crystal starting material particles so as not too much retard the solvent convection flow therearound. Also preferably, the shape is an oval granular, rectangular, triangular or coral one, or a compeito-like one (with horn-like prongs on the surface), as facilitating the bulk density control. The shape of the nitride crystal starting material for use in the second invention may be the same as that in the first invention.

Preferably, the nitride crystal starting material for use in the second invention is so designed that the plane thereof easy to dissolve in solvent appears outside and the plane thereof difficult to dissolve in solvent does not appear outside. For example, in case where a GaN crystal is grown by the use of an ammonia solvent according to an ammonothermal process, the +C-plane (Ga plane) and the M-plane are relatively difficult to dissolve in the ammonia solvent, and therefore it is desirable to use here the starting material of which the other planes than these appear outside.

(Angle of repose of Nitride Crystal Starting Material)

Preferably, the nitride crystal starting material for use in the second invention is one having an angle of repose of less than 45°. Concretely, of the nitride crystal starting material containing an atom that constitutes the nitride crystal to be grown, those of which the angle of repose falls within a specific range are usable.

The angle of repose of the nitride crystal starting material for use in the second invention is preferably not smaller than 15° from the viewpoint of the handleability thereof in charging in a reactor, more preferably not smaller than 20°, even more preferably not smaller than 25°. When the angle of repose of the nitride crystal starting material is too small, then the friction of the material may be low in view of the shape and the size thereof and the material may readily diffuse, and accordingly, it is considered that the material may fly up when handled so as to be charged in a reactor, and would be therefore difficult to handle. The production method for the nitride crystal starting material having an angle of repose of less than 45°, which is used in the second invention, is not specifically defined. Regarding the definition of the angle of repose of the nitride crystal starting material, the method for measuring it, and the production method for the material, those described in the section of the third invention to be given hereinunder shall apply to the second invention.

(Crystal Growth through Ammonothermal Process)

In the production method of the second invention, a crystal starting material is charged in the starting material charging region, and then a nitride crystal is produced according to an ammonothermal process.

The ammonothermal process is a method of producing a desired nitride single crystal using a nitrogen-containing solvent such as ammonia or the like in a supercritical state and/or a subcritical state and utilizing the dissolution-precipitation reaction of the crystal starting material therein. In crystal growth in the method, a supersaturation state is generated through the temperature difference based on the temperature dependence of the solubility of the crystal starting material in the solvent such as ammonia or the like, thereby precipitating a crystal.

According to the production method of the second invention, a high-quality nitride crystal can be produced efficiently, at a rapid growth rate and with good starting material utilization efficiency. According to the second invention, the growth rate in the c-axis direction could reach at least 100 µm/day, even at least 300 µm/day, still even at least 600 µm/day. The growth rate in them-axis direction could reach at least 30 µm/day, even at least 100 µm/day, still even at least 300 µm/day. The growth rate in the a-axis direction could reach at least 50 µm/day, even at least 600 µm/day, still even at least 1500 µm/day.

(Mineralizing Agent)

In the second invention, preferably used is a mineralizing agent in growth of the nitride crystal according to an ammonothermal process. The mineralizing agent is used for increasing the solubility of the crystal starting material in the nitrogen-containing solvent such as ammonia, etc. Regarding the mineralizing agent, the same as those to be used in the first invention may also be used here, and the preferred embodiments thereof are also the same as those described in the section of the first invention.

For protecting the nitride crystal to be grown according to the production method of the second invention from being contaminated with impurities, preferably, the mineralizing agent is used optionally after purified and dried. The purity of the mineralizing agent is generally at least 95% but preferably at least 99%, more preferably at least 99.99%.

Preferably, the amount of water and oxygen to be contained in the mineralizing agent is as small as possible for reducing the oxygen supply from any other than the nitride starting material, and preferably, the content thereof is at most 1000 ppm, more preferably at most 10 ppm, even more preferably at most 1 ppm.

For removing water and oxygen from the atmosphere in the reactor, there may be taken into consideration a method that comprises sealing up the reactor, then heating it at 200° C. or higher, and removing the moisture having adhered to the member surface in the reactor as a water vapor through degassing with a pump or the like to $1 \times 10^{-7}$ Pa. Also employable is a method of introducing the mineralizing agent as a high-purity gas.

Another method also employable here comprises previously storing the reactor members and the starting material in a dry atmosphere having a dew point of not higher than 0° C. and constructing the reactor and the members to be installed in the reactor and installing the members and the starting material into the reactor in the dry atmosphere.

(Solvent)

A nitrogen-containing solvent may be used in the production method of the second invention. The solvent may be the same as that used in the first invention mentioned above, and the preferred range thereof is also the same as in the first invention.

For reducing oxygen supply from any other than the nitride starting material, preferably, the amount of water and oxygen to be contained in the mineralizing agent is as small as possible, and preferably, the content thereof is at most 1000 ppm, more preferably at most 10 ppm, even more preferably at most 0.1 ppm. In case where ammonia is used as the solvent, its purity is generally at least 99.9%, preferably at least 99.99%, more preferably at least 99.999%, still more preferably at least 99.9999%.

(Reactor and Installation Members)

The growth step for the nitride crystal in the second invention is attained in a reactor. The "reactor" means a vessel in which a crystal nitride is produced in the presence of a solvent in a supercritical and/or subcritical state, and preferred examples thereof include the inner structure itself of a pressure vessel, and a capsule to be installed inside a pressure vessel. The reactor for use in the second invention may be an autoclave provided with a mechanism of controlling the pressure to be applied to the reactor and the contents therein from the outside thereof, as in JP-T 2003-511326 (WO01/024921) or JP-T 2007-509507 (WO2005/043638), or may also be an autoclave not having such a mechanism.

Preferably, the reactor is selected from those resistant to high-temperature and high-pressure conditions for growth of nitride crystals. Preferably, the reactor is composed of a material having high strength at high temperatures and having corrosion resistance, and more preferably used here are those formed of an Ni-based alloy and a Co-based alloy such as Stellite (registered trade mark of Deloro Stellite Company Incorporated) and the like that are excellent in corrosion resistance to solvent such as ammonia, etc. Even more preferred is an Ni-based alloy, concretely including Inconel 625 (Inconel is a registered trade mark of Huntington Alloys Canada Limited—the same shall apply hereinunder), Nimonic 90 (Nimonic is a registered trade mark of Special Metals Wiggin Limited—the same shall apply hereinunder), RENE 41 (registered trade mark of Teledyne Allvac, Inc.), Inconel 718 (Inconel is a registered trade mark of Huntington Alloys Canada Limited), Hastelloy (registered trade mark of Haynes International, Inc.), Waspaloy (registered trade mark of United Technologies, Inc.).

The compositional ratio of these alloys may be suitably selected in accordance with the temperature and pressure conditions of the solvent in the system, and also with the reactivity thereof with the mineralizing agent to be contained in the system or with the reaction products of the agent and/or the oxidation/reduction powder thereof, and the pH condition. Though the corrosion resistance of the alloy to be used for these pressure vessels is high, it is not so high that the alloy does not have any influence at all on the quality of the crystal to be produced. The components of the alloy such as Ni, Cr, Fe and others shall dissolve out in the starting material solution in the supercritical solvent atmosphere, especially in a severer corrosion atmosphere that contains a mineralizing agent, and may be therefore taken in the crystal formed. These components may have some influence on the carrier concentration in the crystal to be formed, and preferably, the intake of these impurities is reduced as much as possible. Accordingly, in the second invention, for preventing the inner surface corrosion of the pressure vessel, preferably, the reactor is formed according to a method of directly lining or coating the inner surface of the pressure vessel with a material more excellent in corrosion resistance, or a method of installing a capsule formed of a material more excellent in corrosion resistance in the pressure vessel.

The reactor has installation members inside it. The installation members are meant to indicate a collective term for the members to be contained in the reactor. The installation members include, for example, structures of a wire, a baffle plate, a supporting frame for supporting a seed crystal supporting frame, a crucible in which the nitride crystal starting material is installed, a basket, a reticulated structure, etc.

Preferably, the reactor and the installation members are so designed that the n-type dopant therein is not exposed out on the surface thereof. In order that the n-type dopant is not exposed out on the surface thereof, the reactor and the installation members may be formed of a constituent material having a small N-type dopant content, or the surface of the reactor and the installation members may be coated or lined with any other material. When the reactor and the installation members are so designed that the n-type dopant therein is not exposed out on the surface thereof, any dopant not derived from the nitride crystal starting material may be prevented from being taken in the nitride crystal in the growth step.

In case where the reactor and the installation members are formed of a constituent material having a small n-type dopant content, preferably, the reactor and the installation members are formed of a constituent material having an n-type dopant content of at most 1000 ppm. The n-type dopant amount in the constituent material may be good to be at most 1000 ppm, more preferably at most 100 ppm, even more preferably at most 10 ppm.

In case where the surface of the reactor and the installation members is coated or lined with any other material, preferably, the surface is coated or lined with a coating material or a lining material having an n-type dopant amount of at most 1000 ppm. The n-type dopant amount in the coating material or the lining material may be good to be at most 1000 ppm, but preferably at most 100 ppm, more preferably at most 10 ppm. When the n-type dopant amount is defined to be not higher than the above-mentioned lower limit, then the condition for obtaining the nitride crystal having a desired carrier concentration can be defined more correctly.

The performance required for the constituent material, the lining material and the coating material for the reactor and the installation members is that the dissolution rate thereof in the crystal growth atmosphere in an ammonothermal process is low. The dissolution rate may be good to be at most $3\times10^{-2}$ wt %/day, but is preferably at most $3\times10^{-3}$ wt %/day.

Preferably, the constituent material and the coating material for the reactor and the installation members include a platinum group element or a platinum group alloy.

The platinum group element includes Pt, Au, Ir, Ru, Rh, Pd and Ag. The platinum group alloy means an alloy comprising the noble metal as the main ingredient thereof. Preferred is use of Pt-containing alloys or Pt and Ir-containing alloys having excellent corrosion resistance of the platinum group alloys.

In case where the inner wall of the reactor is formed of a platinum group metal or a platinum group alloy or where the surface of the reactor and the installation members is coated with a platinum group metal or a platinum group alloy, preferably, Pt and Ga-containing alloys are used for the coating material, and more preferably an Ir-containing alloy is used. The platinum group-metal containing alloys are suitable for coating and provide excellent corrosion resistance.

Preferably, the Ir content in the alloy is at most 30% by weight of the total weight of the alloy, more preferably at most 25% by weight. When the Ir content is controlled to be not more than the above-mentioned uppermost limit, then the reactor can be given excellent corrosion resistance.

As the lining material, usable is at least one metal or element of Pt, Ir, Ag, Pd, Rh, Cu, Au and C, or an alloy or a compound containing at least such metal. For more facilitating lining, more preferred is use of at least one metal or element of Pt, Ag, Cu and C or an alloy or a compound containing at least one such metal. The lining material further includes, for example, a Pt elementary substance, a Pt—Ir alloy, an Ag elementary substance, a Cu elementary substance, graphite, etc.

Preferably, the reactor and the installation members have pressure resistance and corrosion resistance. For further improving the corrosion resistance of the reactor and the installation members, preferably, the excellent corrosion resistance of platinum group metals and platinum group alloys is utilized. The material of the reactor and the installation members themselves may be a platinum group metal or a platinum group alloy, or the inner wall of the reactor may be formed of a platinum group metal or a platinum group alloy.

Further, the reactor is preferably a pressure vessel. In particular, in case where the inner wall of the reactor is formed of a platinum group metal or a platinum group alloy or where the surface of the reactor and the installation members is coated or lined with a platinum group metal or a platinum group alloy, preferably, the pressure resistance is secured by any other material to constitute the reactor.

As the other material than platinum group ones capable of having pressure resistance and corrosion resistance, usable here are Ti, W, Ni, Mo, Ru, Nb and their alloys. Preferred are Mo, W and Ti.

(Production Apparatus)

The crystal production apparatus usable for the production method for a nitride crystal of the second invention may be the same as that for use in the first invention, and the preferred embodiment thereof may also the same as that of the latter.

(Production Method)

One example of the production method for a nitride crystal of the second invention is described. In carrying out the production method for a nitride crystal of the second invention, first, a seed crystal, a nitrogen-containing solvent, a starting material and a mineralizing agent are put into the reactor and sealed up. In this, as the seed crystal, the plane direction of the main plane thereof is not specifically defined, but a crystal grown on the C-plane as the main plane is cut in a desired direction to give a substrate of which the main plane is a non-polar plane or a semipolar plane. Accordingly, a seed crystal having a non-polar plane such as M-plane, or a semipolar plane such as (10-11), (20-21) or the like can be prepared.

Preferably, the production method of the second invention further comprises a dopant source separating step, prior to introduction of the above-mentioned nitride crystal starting material, mineralizing agent, baffle plate, seed crystal and other materials into the reactor. The dopant source separating step means a step of removing oxygen, oxide or water vapor existing in the reactor. The dopant source separating step includes a step of coating or lining the surface of the reactor and also the surface of various members to be installed in the reactor and containing oxygen, oxide or water vapor. Coating or lining the surface of the members makes it possible to prevent the dopant from being exposed out and taken in the formed nitride crystal.

In the second invention, unintentional doping may occur when any other n-type dopant than that derived from the nitride crystal starting material is taken in the formed nitride crystal. In the second invention, the dopant source separating step is provided prior to the growth step to thereby evade the unintentional doping.

For removing oxygen, oxide or water vapor existing in the reactor, there may be employed a method of depressurizing the reactor to be in a vacuum state or introducing an inert gas into the reactor after the nitride crystal starting material has been charged in the reactor. In addition, by drying the reactor or the members contained in the reactor, oxygen, oxide or water vapor may also be removed.

In introducing the materials, an inert gas such as a nitrogen gas may be made to run in the reactor. In general, the seed crystal is installed in the reactor simultaneously with or after charging of the nitride crystal starting material and the mineralizing agent in the reactor. Preferably, the seed crystal is fixed to the tool formed of the same noble metal as that of constituting the inner surface of the reactor. After installation of the seed crystal, if desired, the reactor may be degassed under heat.

In case where the production apparatus shown in FIG. 1 is used, a seed crystal 7, a nitrogen-containing solvent, a starting material and a mineralizing agent are put into the reactor, capsule 20, and sealed up, and then the capsule 20 is installed in the autoclave (pressure vessel) 1, and preferably, the space between the pressure vessel and the reactor is filled with a second solvent, and then the pressure vessel is sealed up.

Subsequently, the whole is heated so as to make the reactor vessel in a supercritical or subcritical state. In a supercritical state, in general, the viscosity of a substance is low and can be more readily diffused than liquid but has the same solvation power as that of liquid. A subcritical state means a state of a liquid that has nearly the same density as the critical density at around the critical temperature thereof. For example, in the starting material charging region, the starting material charged therein is dissolved in a supercritical state, and in the crystal growing region, the temperature is changed so as to provide a subcritical state therein, and accordingly crystal growth is possible in the region by utilizing the solubility difference between the starting material in the supercritical state and that in the subcritical state.

In order to make it in a supercritical state, in general, a reaction mixture is kept at a temperature higher than the critical point of the solvent used. When an ammonia solvent is used, the critical point thereof is a critical temperature of 132° C. under a critical pressure of 11.35 MPa; however, in case where the filling rate to the volume of the reactor is high, the pressure may be much higher than the critical pressure even at a temperature lower than the critical temperature. In the second invention, "supercritical state" includes the state where the pressure is higher than the critical pressure. The reaction mixture is sealed up in the reactor having a given volume, and therefore the temperature elevation increases the pressure of the fluid. In general, when T>Tc (critical temperature of one solvent) and P>Pc (critical pressure of one solvent), then the fluid could be in a supercritical state.

Under the supercritical condition, a nitride crystal can fully grow at a sufficient growth rate. The reaction time depends especially on the reactivity of the mineralizing agent used and on the thermodynamic parameters, or that is, the values of the temperature and the pressure of the system. During production and growth of a nitride crystal, the pressure inside the reactor is preferably not lower than 30 MPa from the viewpoint of the crystallinity and the productivity of the crystal, more preferably not lower than 60 MPa, even more preferably not lower than 100 MPa. Also preferably, the pressure inside the reactor is not higher than 700 MPa from the viewpoint of safety, more preferably not higher than 500 MPa, even more preferably not higher than 350 MPa, still more preferably not higher than 300 MPa. The pressure can be suitably defined depending on the temperature and on the filling rate of the solvent volume relative to the volume of the reactor. Naturally, the pressure in the reactor is indiscriminately defined depending on the temperature and the filling rate therein, but in fact, varies in some degree depending on the starting material, the additives such as the mineralizing agent and others, the temperature unevenness inside the reactor, and the presence of a free volume therein.

Regarding the temperature range in the reactor, the lower limit is preferably 320° C. or higher from the viewpoint of the crystallinity and the productivity of the crystal, more preferably 370° C. or higher, even more preferably 450° C. or higher. The upper limit is preferably 700° C. or lower from the viewpoint of safety, more preferably 650° C. or lower, even more preferably 630° C. or lower. In the production method for a nitride crystal of the second invention, preferably, the temperature in the starting material charging region inside the reactor is higher than the temperature in the crystal growing region therein. Preferably, the temperature difference between the two regions ($|\Delta T|$) is at least 5° C. from the viewpoint of the crystallinity and the productivity of the crystal, more preferably at least 10° C., and also preferably at most 100° C., more preferably at most 90° C., even more preferably at most 80° C. The optimum temperature and pressure inside the reactor may be suitably defined depending on the type and the amount of the mineralizing agent and other additives to be used in crystal growth therein.

The charging ratio, or that is, the filling rate of the solvent in the reactor for attaining the temperature range and the pressure range in the reactor may be generally from 20 to 95% but preferably from 30 to 80%, more preferably from 40 to 70%, based on the free volume of the reactor, or that is, in case where a crystal starting material and a seed crystal are put in the reactor, the liquid density at the boiling point of the residual volume to be obtained by subtracting the volume of the seed crystal and that of the structure to hold the seed crystal from the volume of the reactor, and in case where a baffle plate is installed, that of the residual volume obtained by further subtracting the volume of the baffle plate from the volume of the reactor. In case where the capsule 20 as in FIG. 1 is used as the reactor, preferably, the solvent amount is suitably controlled so as to attain a well-balanced pressure inside and outside the capsule 20 in the supercritical state of the solvent.

The nitride crystal in the reactor may be grown by heating the reactor by the use of an electric furnace having a thermocouple, and by keeping the reactor in a subcritical state or a supercritical state of the solvent such as ammonia or the like therein. The heating method and the heating rate up to the predetermined reaction temperature are not specifically defined, but in general, the reactor may be heated for from a few hours to a few days. If desired, a multi-stage heating mode may be employed, or the heating speed may be changed in the heating temperature range. Also if desired, the reactor may be heated while partially cooled.

The "reaction temperature" may be measured with a thermocouple arranged to be in contact with the outer surface of the reactor and/or a thermocouple inserted into the hole formed in a predetermined depth from the outer surface of the reactor, and from the found data, the internal temperature of the reactor could be estimated. The data measured with these thermocouples may be averaged to be the mean temperature of the reactor. In general, the temperature in the starting material charging region and the temperature in the crystal growing region may be averaged to give the mean temperature inside the reactor.

In the production method for a nitride crystal of the second invention, the seed crystal may be pretreated. The pretreatment includes, for example, melt-back treatment of the seed crystal, polishing the crystal growing surface of the seed crystal, washing the seed crystal, etc.

In heating the autoclave in the production method for a nitride crystal of the second invention, the crystal growing surface of the seed crystal may be given melt-back treatment by keeping the surface at a predetermined temperature. Through the melt-back treatment, the crystal growing surface of the seed crystal and also the crystal nuclei adhering to the members in the apparatus can be melted. Regarding the melt-back treatment condition, the pressure and the treatment time, the same as those given in the section of the first invention hereinabove shall apply thereto.

In the pretreatment, the surface on which a nitride crystal is to grow of the seed crystal may be polished, for example, in a mode of chemical mechanical polishing (CMP) or the like. Regarding the surface roughness of the seed crystal, for example, the root-mean-square roughness (Rms) thereof, as measured with an atomic force microscope, is preferably at most 1.0 nm from the viewpoint of uniformly attaining the melt-back treatment and the subsequent crystal growth, more preferably 0.5 nm, even more preferably 0.3 nm.

The reaction time after having reached the predetermined temperature may vary depending on the type of the nitride crystal, the type of the starting material and the mineralizing agent to be used, and the size and the amount of the crystal to be produced, but may be generally from a few hours to a few hundred days. During the reaction, the reaction temperature may be kept constant or may be gradually elevated or lowered. After the reaction time to form the desired crystal, the system is cooled. The cooling method is not specifically defined. For example, the heating with the heater may be stopped and the reactor may be cooled while left in the furnace, or the reactor may be taken out of the electric furnace and may be cooled in air. If desired, the reactor may be rapidly cooled with a coolant, and the mode is also preferred.

After the temperature of the outer surface of the reactor or the presumed temperature inside the reactor has reached a predetermined temperature, the reactor is opened. In this stage, the predetermined temperature is not specifically defined, but may be generally from −80° C. to 200° C., preferably from −33° C. to 100° C. In this, a duct may be connected to the duct connecting mouth of the valve attached to the reactor, and may be connected to a container filled with water or the like, and the valve may be opened. Further if desired, the system may be kept in vacuum to thereby fully remove the ammonia solvent from the reactor, and then the reactor may be dried and opened to take out the formed nitride crystal and the unreacted starting material and mineralizing agent and other additives.

In case where gallium nitride is produced according to the production method for a nitride crystal of the second invention, JP-A 2009-263229 may be preferably referred to for the other details of the material, the production condition, the production apparatus and the step than those mentioned above. The entire contents of the disclosure in the patent publication are hereby incorporated in this description by reference.

In the production method for a nitride crystal of the second invention, the nitride crystal grown on the seed crystal may be post-treated. The type and the object of the post-treatment are not specifically defined. For example, the crystal surface may be given melt-back treatment in the cooling step after the growing step in order that the crystal defects such as pits, dislocations and the like can be readily detected.

(Nitride Crystal)

The nitride crystal of the second invention can be obtained according to the above-mentioned production method. The oxygen concentration in the nitride crystal obtained in the second invention is from $1.5 \times 10^{18}$ to $2.5 \times 10^{19}$ atoms/cm$^3$, and the dopant activation ratio η obtained according to the formula mentioned below is from 10 to 90%.

The oxygen concentration in the nitride crystal is preferably at least $2 \times 10^{18}$ atoms/cm$^3$, more preferably at least $2.5 \times 10^{18}$ atoms/cm$^3$, but is preferably at most $2 \times 10^{19}$ atoms/cm$^3$, more preferably at most $1.5 \times 10^{19}$ atoms/cm$^3$. The dopant activation ratio η is preferably at least 20%, more preferably at least 30%, but is preferably at most 85%, more preferably at most 80%.

$$\eta(\%) = [CC]/[D] \times 100$$

In the above formula, η means the dopant activation ratio (unit: %); [CC] means the carrier concentration (unit: cm$^{-3}$); and [D] means the dopant concentration (unit: cm$^{-3}$).

The carrier concentration in the nitride crystal obtained in the second invention is from $5 \times 10^{17}$ to $2 \times 10^{19}$ atoms/cm$^3$. When the carrier concentration is from $5 \times 10^{17}$ to $2 \times 10^{19}$ atoms/cm$^3$, then the nitride crystal can have suitable electroconductivity. Preferably, the carrier concentration is at least $8 \times 10^{17}$ atoms/cm$^3$, more preferably at least $1 \times 10^{18}$ atoms/cm$^3$, but is preferably at most $1.5 \times 10^{19}$ atoms/cm$^3$, more preferably at most $1 \times 10^{19}$ atoms/cm$^3$.

The Si concentration in the nitride crystal obtained in the second invention is at most $1.5 \times 10^{16}$ atoms/cm$^3$, preferably at most $1 \times 10^{16}$ atoms/cm$^3$. When the Si concentration in the nitride crystal falls within the above range, the strain of the entire crystal can be retarded and the yield reduction owing to cracking can be evaded. The Si concentration is preferably at most $1 \times 10^{16}$ atoms/cm$^3$, more preferably at most $2 \times 10^{15}$ atoms/cm$^3$.

When the halogen content in the nitride crystal obtained in the second invention increases, the carrier activity decreases, and therefore, the halogen content is preferably so controlled as to have a low concentration. The halogen element includes, for example, F, Cl, Br, I.

The F concentration in the obtained nitride crystal is preferably at most $1 \times 10^{18}$ atoms/cm$^3$, more preferably at most $5\times10^{17}$ atoms/cm$^3$. The Cl concentration is preferably at most $1\times10^{19}$ atoms/cm$^3$, more preferably at most $3\times10^{18}$ atoms/cm$^3$. The Br concentration is preferably at most $1\times10^{17}$ atoms/cm$^3$, more preferably at most $1\times10^{16}$ atoms/cm$^3$. The I concentration is preferably at most $1\times10^{17}$ atoms/cm$^3$, more preferably at most $3\times10^{15}$ atoms/cm$^3$.

In the production method for a nitride crystal of the second invention, when the nitride crystal starting material is completely dissolved under the condition where the temperature and the pressure are kept under the crystal growth condition, then the grown crystal may dissolve; and accordingly, from the viewpoint that a minor amount of the nitride crystal starting material is preferably kept remaining after the crystal growth step, the dissolution rate of the nitride crystal starting material is preferably at least 40%, more preferably from 40% to 96%, even more preferably from 50% to 85%, still more preferably from 70% to 80%. The dissolution rate can be defined as (starting material put in the reactor before the crystal growth step—starting material having remained in the rector after the crystal growth step)/(starting material put in the reactor before the crystal growth step).

<Third Invention>

The production method for a nitride crystal of the third invention (hereinafter this may be referred to the production method of the third invention) comprises charging a nitride crystal starting material having an angle of repose of less than 45° in the starting material charging region of a reactor, followed by nitride crystal growth in the presence of a solvent in a supercritical state and/or a subcritical state in the reactor.

The nitride crystal starting material for use in the third invention and the nitride crystal growing method of using the nitride crystal starting material are described below.

(Nitride Crystal Starting Material)

In the third invention, a nitride crystal starting material having an angle of repose of less than 45° is used. Concretely, of the nitride crystal starting material containing an atom to constitute the nitride crystal to be grown, one having an angle of repose that falls within a specific range is used.

(Angle of repose of Nitride Crystal Starting Material)

Figure 3:
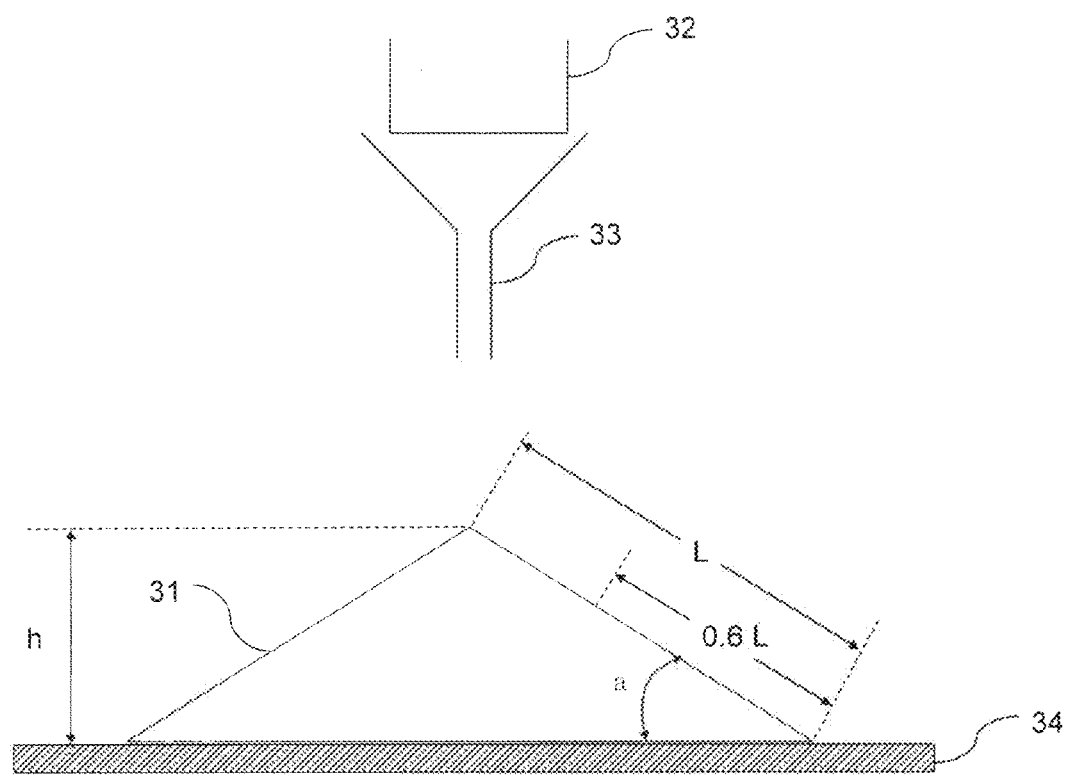
FIG. 3 is a schematic view of a method of measuring an angle of repose usable in the invention.

The "angle of repose" of the nitride crystal starting material for use in the third invention means the angle of the inclination at which the nitride crystal starting material, when piled up, can remain stable not spontaneously breaking down. Concretely, as shown in FIG. 3, the nitride crystal starting material is let to fall down from the above onto a horizontal floor plane to be piled up thereon like a conical sand mound, and the piling up is continued until the conical inclination plane is broken at least once. The angle of repose is the angle of the inclination at that time. The angle of the inclination is measured as the angle between the skirt and the bottom of the conical view on the nearly triangular projection drawing as taken by observing the conical configuration in the horizontal direction. In the third invention, the material was tried in an environment at a relative humidity of at most 50% and at 30.0° C., and the value thus determined in the manner as above is referred to as the angle of repose.

In the third invention, the height from which the nitride crystal starting material is let to fall down is about 20 cm from the floor, and when the nitride crystal starting material has become to be conical, the dropping position is so changed as to be 20 cm from the top of the conical mound. In that manner, the nitride crystal starting material is further kept falling down so as to be piled up like a sand mound, and the data at the time at which the piled up nitride crystal starting material has broken down twice are employed for the value of the angle of repose herein. In case where the angle of repose can be measured by the use of Hosokawa Micron's Powder Tester (Lot Code PT-N), the value measured with the machine may be taken here as the angle of repose.

The angle of repose of the nitride crystal starting material for use in the third invention is preferably less than 45° from the viewpoint of securing a high crystal growth rate, and is more preferably less than 40°. When the angle of repose of the nitride crystal starting material is less than 45°, then it is expected that suitable friction may occur depending on the shape and the size of the starting material, and it is considered that, when the material is charged in a reactor, there could be formed a suitable space between the nitride crystal starting material particles and the material could be readily brought into contact with the solvent therearound. As a result, the dissolution of the starting material in the solvent can be promoted, and in case where the nitride crystal starting material of the type is used for crystal growth, then a high crystal growth rate can be attained.

Also preferably, the angle of repose of the nitride crystal starting material for use in the third invention is at least 15° from the viewpoint of the handleability thereof in charging it in a reactor, and is more preferably at least 20°, even more preferably at least 25°. When the angle of repose of the nitride crystal starting material is too small, then it is expected that the friction of the material may be low in view of the shape and the size thereof and the material may readily diffuse, and accordingly, it is considered that the material may fly up when handled so as to be charged in a reactor, and would be therefore difficult to handle.

The production method for the nitride crystal starting material having an angle of repose of less than 45°, which is used as the nitride crystal starting material in the third invention, is not specifically defined. For example, usable here is a polycrystalline nitride or single-crystal nitride produced through reaction of a metal or its oxide or hydroxide with ammonia in a reactor where ammonia gas is kept running. As a metal compound material having higher reactivity in reaction with ammonia gas, there may be used here halides, amide compounds, imide compounds, covalent-bonding M-N bond-having compounds such as galazan, etc. Also usable here is a polycrystalline nitride or single-crystal nitride produced through reaction of a metal such as Ga or the like with nitrogen at high temperature and under high pressure.

The method for controlling the angle of repose of the nitride crystal starting material to fall within the above-mentioned range is not also specifically defined. For example, herein employable are a method of using a nitride crystal starting material having a specific shape, a method of using a nitride crystal starting material having a specific particle size, a method of grinding the nitride crystal starting material in order that the material could be charged in the reactor for crystal growth to be mentioned below with feedback control to thereby make its angle of repose fall within a specific range, a method of controlling the moisture content and the oxygen content in the nitride crystal starting material, a method of controlling the content of the impurities such as Si, S, Mg and others in the nitride crystal starting material, etc. Of those, the method of controlling the particle size of the nitride crystal starting material and the method of controlling the moisture content in the starting material are especially effective for controlling the angle of repose of the starting material. For example, when the particle size is increased or when the moisture content is increased, then the angle of repose tends to increase since the intergranular friction may increase.

As the method for controlling the moisture amount in the nitride crystal starting material, there is mentioned a method of reducing the particle size of the nitride crystal starting material particles or lowering the relative humidity in the atmosphere in which the nitride crystal starting material is treated. When the particle size of the nitride crystal starting material particles is increased in some degree, the moisture adsorption in air to the particles may be retarded than in the case of a so-called powder having a small particle size.

For controlling the oxygen amount in the nitride crystal starting material, for example, oxygen and oxide may be prevented from coexisting in the atmosphere where the nitride crystal starting material is produced, or a member capable of adsorbing oxygen, such as carbon graphite or the like, is arranged in the atmosphere where the nitride crystal starting material is produced.

As the method of feedback control for making the angle of repose of the nitride crystal starting material fall within the specific range, for example, there is mentioned a method in which, when a nitride crystal starting material having a specific shape is used, the relationship between the particle size of the nitride crystal starting material to be obtained and the angle of repose thereof is previously determined, and the nitride crystal starting material is ground so as to have a particle size falling within the specific range.

The method of grinding the nitride crystal starting material isnot specifically defined. For example, if desired, the method may be divided into multiple steps of a roughly grinding step, a moderately grinding step, a finely grinding step, etc. In this case, the entire grinding process may be attained in one and the same apparatus; however, the apparatus may be changed depending on the step. The roughly grinding step means a step where nearly 90% by mass of the nitride crystal starting material is ground to have a particle size of at most 1 cm, for which, for example, usable is a grinding apparatus such as a jaw crusher, a Gyratory crusher, a crushing roll, an impact crusher, etc. The moderately grinding step is a step where nearly 90% by mass of the nitride crystal starting material is ground to have a particle size of at most 1 mm, for which, for example, usable is a grinding apparatus such as a corn crusher, a crushing roll, a hammer mill, a disk mill, etc. The finely grinding step is a step of further grinding the nitride crystal starting material to have a smaller particle size, for which, for example, usable is a grinding apparatus such as a ball mill, a tube mill, a rod mill, a roller mill, a stamp mill, an edge runner, a shaking mill, a jet mill, etc. From the viewpoint of preventing the material from being contaminated with impurities derived from the grinding apparatus, it is desirable that the nitride crystal particles are made to collide against each other for grinding them.

On the other hand, when the nitride crystal starting material is aggregated into clumps, they may be mechanically ground or sliced into particles having a desired shape. In particular, when the clumps are sliced into tabular ones, then they may be readily ground without using any apparatus. The mode is favorable since the formed starting material is prevented from being contaminated with impurities derived from the grinding apparatus used.

After mechanically ground, sliced or crushed, the nitride crystal starting material may be etched with an acid or alkali solution, and this is favorable as preventing the starting material from being contaminated with the impurities derived from the grinding treatment process.

Preferably, the grinding step is attained in an inert gas atmosphere in order to protect the nitride crystal starting material from being contaminated with oxygen, oxide, hydrate or the like adhering thereto. The type of the inert gas is not specifically defined. In general, a single atmosphere of nitrogen, argon, helium or the like gas, or a mixed atmosphere of two or more of these is employed. Above all, nitrogen is especially preferred from the viewpoint of the economic aspect.

The oxygen concentration in the atmosphere is not specifically defined so far as the nitride crystal starting material can be prevented from being oxidized. In general, the oxygen concentration is at most 10% by volume, preferably at most 5% by volume. The lower limit of the oxygen concentration is generally 10 ppm or so.

During the grinding step, if desired, the system may be cooled in order that the temperature of the nitride crystal starting material does not rise.

(Particle Size of Nitride Crystal Starting Material)

The preferred range of the particle size of the nitride crystal starting material for use in the third invention varies in accordance with the easiness in controlling the angle of repose of the starting material depending on the difference in the shape, the moisture content, the oxygen content, the impurity content and the like thereof. In addition, the preferred range may also vary depending on the size of the reactor to be used from the viewpoint of the easiness in controlling the bulk density of the starting material and the easiness in handling the starting material. Concretely, when the size of the reactor is large, then the particle size of the nitride crystal starting material may be large within a range within which the angle of repose is not too large. For example, in the case where a reactor having a diameter of 26 mm or so is used, then the maximum diameter of the starting material particle is preferably 0.5 μm or more, more preferably 1 μm or more, even more preferably 10 μm or more, but is preferably at most 20 mm, more preferably at most 15 mm, even more preferably at most 10 mm. In the case where a reactor having a diameter of 60 mm or so is used, then the maximum diameter of the starting material particle is preferably 0.5 μm or more, more preferably 1 μm or more, even more preferably 10 μm or more, but is preferably at most 120 mm, more preferably at most 30 mm, even more preferably at most 20 mm. The maximum diameter as referred to herein is the linear distance of the maximum length of the particle.

Preferably, the nitride crystal starting material for use in the third invention has an aggregated structure of nitride crystal starting material particles. Concretely, preferred for use herein are tertiary particles formed through aggregation of secondary particles. Preferably, the particle size of the secondary particles is at least 100 μm, more preferably at least 200 μm, even more preferably at least 300 μm, but is preferably at most 1000 μm, more preferably at most 900 μm, even more preferably at most 800 μm. Preferably, the particle size of the tertiary particles is at least 0.5 mm, more preferably at least 5 mm, even more preferably at least 10 mm, but is preferably at most 120 mm, more preferably at most 50 mm, even more preferably at most 30 mm. The particle size of the secondary particles can be measured with an optical microscope, etc. The tertiary particles of not smaller than 1 mm can be confirmed through visual inspection, and can be therefore measured with a caliper, a ruler or the like.

Of the nitride crystal having a configuration formed through aggregation of the above-mentioned nitride crystal starting material particles, the primary particle means a nano-level single crystal, and multiple single crystals aggregate together and bond to each other to form polycrystalline secondary particles. In general, primary particles bond to each other and are integrated, and they could not be individually differentiated from each other. Further, in case where the shape of the nitride crystal starting material for use in the third invention is a coral-like one as described below, the maximum diameter of the particles thereof is determined to cover the projections on the surface thereof.

Regarding the particle size distribution of the nitride crystal starting material for use in the third invention, preferably, the nitride crystal starting material having a particle diameter of from 0.5 µm to 120 mm accounts for at least 20% by volume of the entire nitride crystal starting material, more preferably at least 30%, since the space between the nitride crystal starting material particles could be sufficient to secure the solvent convection therethrough.

(Shape of Nitride Crystal Starting Material)

The shape of the nitride crystal starting material for use in the third invention may be a spherical one, a granular one of which the cross section is oval, a tabular one, a rectangular one, a triangular one or a coral one. (In this description, the coral shape means a shape having projections of which the length is at least 5% of the maximum diameter thereof, on the surface thereof. Preferably, the shape has irregularities on the entire surface thereof to thereby have an increased surface area.) Preferably, the shape is oval granular, rectangular, triangular or coral, as having a given space between the crystal starting material particles so as not to so much interfere with the convection flow of the solvent therearound, and for the reason that the starting material having the preferred shape can control the angle of repose thereof to a desired angle and that the bulk density of the material of the type is easy to control. The shape of the nitride crystal starting material for use in the third invention may be the same as that in the first invention.

Preferably, the crystal starting material for use in the third invention is so designed that the plane thereof easy to dissolve in solvent appears outside and the plane thereof difficult to dissolve in solvent does not appear outside. For example, in case where a GaN crystal is grown by the use of an ammonia solvent according to an ammonothermal process, the +C-plane (Ga plane) and the M-plane are relatively difficult to dissolve in the ammonia solvent, and therefore it is desirable to use here the starting material of which the other planes than these appear outside.

(Composition of Nitride Crystal Starting Material)

First described is the composition of the nitride crystal starting material. For example, in case where a nitride crystal of a Periodic Table Group 13 metal is desired to be grown, used is a starting material that contains a Periodic Table Group 13 metal. Preferred is use of a polycrystalline starting material or a single-crystal starting material of a Group 13 nitride crystal, and this may be combined with a Group 13 metal (element) to give a starting material for use herein. The polycrystalline starting material is not always required to be a complete nitride but may contain a metal component in which the Group 13 atom is in a state of metal (zero-valent), if possible. For example, for the case where the nitride crystal to be grown is gallium nitride, there is mentioned a mixture of gallium nitride and metal gallium as the nitride crystal starting material. Regarding the type of the Group 13 element nitride crystal, there are mentioned GaN, InN, AlN, InGaN, AlGaN, AlInGaN, etc. Preferred are GaN, AlN, AlGaN, AlInGaN; and more preferred is GaN.

(Other Components of Nitride Crystal Starting Material)

The amount of water and oxygen to be contained in the nitride crystal starting material for use in the third invention is as small as possible. The oxygen content in the nitride crystal starting material is generally at most 1.0% by mass but preferably at most 0.1% by mass, more preferably at most 0.0001% by mass. Oxygen penetrability in the nitride crystal starting material has a relation to the reactivity with water of the material or to the water absorbability thereof. The nitride crystal starting material having a poorer crystallinity may have a larger amount of an active group such as an NH group and the like on the surface thereof, and the group may react with water thereby partially forming oxides or hydroxides. Accordingly, in general, the crystallinity of the nitride crystal starting material to be used here is preferably as high as possible. The crystallinity can be estimated based on the half-value width in X-ray diffractiometry, and the half-value width of the diffraction line at (100) (in hexagonal-type gallium nitride, $2\theta$=about 32.5°) is generally at 0.25° or less, preferably 0.20° or less, more preferably 0.17° or less.

(Bulk Density of Nitride Crystal Starting Material)

In an ammonothermal process, in general, a starting material charging region where a nitride crystal starting material is charged and a crystal growing region where a seed crystal is put are arranged in a reactor, and in the starting material charging region, a nitride crystal starting material is dissolved and in the crystal growing region, a nitride crystal is grown on the seed crystal. In this, a temperature difference is given to the starting material charging region and the crystal growing region, and the reactor is so controlled that the nitride crystal starting material can dissolve more in the starting material charging region and a good nitride crystal can be readily precipitated in the crystal growing region.

The "starting material charging region" in the third invention is meant to indicate the region sandwiched between the horizontal plane including the lowermost edge of the crystal starting material charged in the reactor and the horizontal plane including the uppermost edge of the charged crystal starting material, in case where the reactor before the start of reaction is so installed that its long axis could be in the vertical direction.

The "bulk density" of the crystal nitride crystal starting material in the starting material charging region is the weight per the unit volume of the nitride crystal starting material charged in the starting material charging region, and can be determined by dividing the weight of the nitride crystal starting material by the free volume of the starting material charging region. The free volume of the starting material charging region as referred to herein is the volume as determined by subtracting the volume of the solid except the crystal starting material existing in the starting material charging region from the inner volume of the starting material charging region of the reactor. Examples of the solid include structures such as a baffle plate, a supporting frame for supporting a seed crystal supporting frame, a crucible for keeping a nitride crystal starting material therein, a basket, a reticulated structure, etc. By removing the volume of these structures in the starting material charging region, the free volume can be obtained.

Regarding the concrete calculation example of determining the bulk density of the nitride crystal starting material, the filling rate of the nitride crystal starting material, and the method for controlling the bulk density in the third invention, referred to are those described in the section of the first invention given above.

When the bulk density of the nitride crystal starting material in the starting material charging region is too large, then the volume of the space to be formed between the crystal starting material particles is small and the solvent convection flow is thereby retarded and the melting rate of the starting material may lower. Consequently, a good crystal could hardly be grown with high productivity. On the other hand, when the bulk density of the nitride crystal starting material is too small, then the crystal starting material could be well dissolved but the amount of the starting material to be charged per the volume of the reactor decreases and it would be therefore difficult to efficiently supply a sufficient amount of the dissolved starting material to the crystal growing region and to rapidly grow a nitride crystal having a sufficient size. In the third invention, the bulk density of the crystal starting material in the starting material charging region is controlled to fall within a range of from 0.7 to 4.5 $g/cm^3$ to thereby increase the dissolution speed of the starting material not detracting from the solvent convection flow, and a good-quality crystal can be thereby produced efficiently.

More preferably, the bulk density of the nitride crystal starting material in the starting material charging region is at least 0.8 $g/cm^3$, even more preferably at least 0.9 $g/cm^3$, still more preferably at least 1.0 $g/cm^3$, further more preferably at least 1.1 $g/cm^3$. Also preferably, the bulk density of the nitride crystal starting material in the starting material charging region is at most 4.0 $g/cm^3$, more preferably at most 3.6 $g/cm^3$, even more preferably at most 3.2 $g/cm^3$, still more preferably at most 3.0 $g/cm^3$.

The bulk density of the crystal starting material in the starting material charging region can also be controlled by installing some structures in the starting material charging region. As the structure, for example, a reticulated structure through which a solvent could pass but in which the crystal starting material could not may be favorably employed here. With the reticulated structure of the type, the existing region of the crystal starting material in the starting material charging region can be controlled and the bulk density thereof can be thereby controlled. Specifically, the existing region of the crystal starting material is limited to a narrow region and the region where the crystal starting material could not exist is widely secured, whereby the bulk density can be controlled low. For example, when the crystal starting material is filled in a reticulated structure having a smaller volume than that of the starting material charging region and when this is put in the starting material charging region, then the bulk density can be made low. On the contrary, by installing a hollow reticulated structure not charged with the crystal starting material in the starting material charging region, the bulk density may also be controlled. For example, the reticulated structure of the type is mixed with the crystal starting material and may be charged in the starting material charging region. In this case, by controlling the mixing ratio of the two, the bulk density can be controlled. The reticulated structure may be previously fixed in the starting material charging region. Multiple reticulated structures of those types may be used here. Also employable here is a non-reticulated structure through which the solvent used can pass.

<Crystal Growth>

In the production method of the third invention, the above-mentioned nitride crystal starting material is used to produce a nitride crystal.

In the third invention, the above-mentioned nitride crystal starting material is charged in the starting material charging region to produce a nitride crystal according to an ammonothermal process. The ammonothermal process is a method of producing a desired nitride single crystal using a nitrogen-containing solvent such as ammonia or the like in a super-critical state and/or a subcritical state and utilizing the dissolution-precipitation reaction of the crystal starting material therein. In crystal growth in the method, a super-saturation state is generated through the temperature difference based on the temperature dependence of the solubility of the crystal starting material in the solvent such as ammonia or the like, thereby precipitating a crystal.

According to the production method of the third invention, a high-quality nitride crystal can be produced efficiently, at a rapid growth rate and with good starting material utilization efficiency. According to the third invention, the growth rate in the c-axis direction could reach at least 100 μm/day, even at least 300 μm/day, still even at least 600 μm/day. The growth rate in the m-axis direction could reach at least 30 μm/day, even at least 100 μm/day, still even at least 300 μm/day. The growth rate in the a-axis direction could reach at least 50 μm/day, even at least 600 μm/day, still even at least 1500 μm/day.

In the following, the details of the production method for a nitride crystal according to an ammonothermal process are described.

(Mineralizing Agent)

In the third invention, preferably used is a mineralizing agent in growth of the nitride crystal according to an ammonothermal process. Since the solubility of the crystal starting material in the nitrogen-containing solvent such as ammonia or the like is not high, mineralizing agent is used for increasing the solubility thereof. Regarding the mineralizing agent, the same as those to be used in the first invention may also be used here, and the preferred embodiments thereof are also the same as those described in the section of the first invention.

(Solvent)

A nitrogen-containing solvent may be used in the production method of the third invention. The solvent may be the same as that used in the first invention mentioned above, and the preferred range thereof is also the same as in the first invention.

(Reactor)

The production method for a nitride crystal of the third invention may be carried out in a reactor. The reactor may be the same as that for use in the first invention, and the preferred embodiment thereof may also the same as that of the latter.

(Production Method)

One example of the production method for a nitride crystal of the third invention is described. In carrying out the production method for a nitride crystal of the third invention, first, a seed crystal, a nitrogen-containing solvent, a starting material and a mineralizing agent are put into the reactor and sealed up. In this, as the seed crystal, the plane direction of the main plane thereof is not specifically defined, but a nitride crystal grown on the C-plane as the main plane is cut in a desired direction to give a substrate of which the main plane is a non-polar plane or a semipolar plane. Accordingly, a seed crystal having a non-polar plane such as M-plane, or a semipolar plane such as (10-11), (20-21) or the like can be prepared.

Prior to introducing the materials such as the above-mentioned nitride crystal starting material, the mineralizing agent, the baffle plate, the seed crystal and the like into the reactor, the reactor may be degassed. In introducing the materials, an inert gas such as a nitrogen gas may be made to run in the reactor. In general, the seed crystal is installed in the reactor simultaneously with or after charging of the starting material and the mineralizing agent in the reactor. Preferably, the seed crystal is fixed to the tool formed of the same noble metal as that of constituting the inner surface of the reactor. After installation of the seed crystal, if desired, the reactor may be degassed under heat.

In case where the production apparatus shown in FIG. 1 is used, a seed crystal, a nitrogen-containing solvent, a starting material and a mineralizing agent are put into the reactor, capsule 20, and sealed up, and then the capsule 20 is installed in the pressure vessel (autoclave) 1, and preferably, the space between the pressure vessel and the reactor is filled with a second solvent, and then the pressure vessel is sealed up.

Subsequently, the whole is heated so as to make the reactor vessel in a supercritical or subcritical state. In a supercritical state, in general, the viscosity of a substance is low and can be more readily diffused than liquid but has the same solvation power as that of liquid. A subcritical state means a state of a liquid that has nearly the same density as the critical density at around the critical temperature thereof. For example, in the starting material charging region, the starting material charged therein is dissolved in a supercritical state, and in the crystal growing region, the temperature is changed so as to provide a subcritical state therein, and accordingly crystal growth is possible in the region by utilizing the solubility difference between the starting material in the supercritical state and that in the subcritical state.

In order to make it in a supercritical state, in general, a reaction mixture is kept at a temperature higher than the critical point of the solvent used. When an ammonia solvent is used, the critical point thereof is a critical temperature of 132° C. under a critical pressure of 11.35 MPa; however, in case where the filling rate to the volume of the reactor is high, the pressure may be much higher than the critical pressure even at a temperature lower than the critical temperature. In the third invention, "supercritical state" includes the state where the pressure is higher than the critical pressure. The reaction mixture is sealed up in the reactor having a given volume, and therefore the temperature elevation increases the pressure of the fluid. In general, when T>Tc (critical temperature of one solvent) and P>Pc (critical pressure of one solvent), then the fluid could be in a supercritical state.

Under the supercritical condition, a nitride crystal can fully grow at a sufficient growth rate. The reaction time depends especially on the reactivity of the mineralizing agent used and on the thermodynamic parameters, or that is, the values of the temperature and the pressure of the system. During production and growth of a nitride crystal, the pressure inside the reactor is preferably on the same level as in the first invention, and the preferred embodiment may also be the same as in the first invention.

The temperature range in the reactor may be the same as in the first invention, and the preferred embodiment thereof may also be the same as in the first invention.

The proportion of the solvent to be injected into the reactor for attaining the above-mentioned temperature range and the pressure range in the reactor, or that is, the filling rate thereof may be the same as that in the first invention, and the preferred embodiment thereof may also be the same as in the first invention.

The nitride crystal in the reactor may be grown by heating the reactor by the use of an electric furnace having a thermocouple, and by keeping the reactor in a subcritical state or a supercritical state of the solvent such as ammonia or the like therein. The heating method and the heating rate up to the predetermined reaction temperature are not specifically defined, but in general, the reactor may be heated for from a few hours to a few days. If desired, a multi-stage heating mode may be employed, or the heating speed may be changed in the heating temperature range. Also if desired, the reactor may be heated while partially cooled.

In the production method for a nitride crystal of the third invention, the seed crystal may be pretreated. The pretreatment includes, for example, melt-back treatment of the seed crystal, polishing the crystal growing surface of the seed crystal, washing the seed crystal, etc.

In heating the autoclave in the production method for a nitride crystal of the third invention, the crystal growing surface of the seed crystal may be given melt-back treatment by keeping the surface at a predetermined temperature. Through the melt-back treatment, the crystal growing surface of the seed crystal and also the crystal nuclei adhering to the members in the apparatus can be melted. Regarding the melt-back treatment condition, the pressure and the treatment time, the same as those given in the section of the first invention hereinabove shall apply thereto.

In the pretreatment, the surface on which a nitride crystal is to grow of the seed crystal may be polished, for example, in a mode of chemical mechanical polishing (CMP) or the like. Regarding the surface roughness of the seed crystal, for example, the root-mean-square roughness (Rms) thereof, as measured with an atomic force microscope, is preferably at most 1.0 nm from the viewpoint of uniformly attaining the melt-back treatment and the subsequent crystal growth, more preferably 0.5 nm, even more preferably 0.3 nm.

The reaction time after having reached the predetermined temperature may vary depending on the type of the nitride crystal, the type of the starting material and the mineralizing agent to be used, and the size and the amount of the crystal to be produced, but may be generally from a few hours to a few hundred days. During the reaction, the reaction temperature may be kept constant or may be gradually elevated or lowered. After the reaction time to form the desired crystal, the system is cooled. The cooling method is not specifically defined. For example, the heating with the heater may be stopped and the reactor may be cooled while left in the furnace, or the reactor may be taken out of the electric furnace and may be cooled in air. If desired, the reactor may be rapidly cooled with a coolant, and the mode is also preferred.

After the temperature of the outer surface of the reactor or the presumed temperature inside the reactor has reached a predetermined temperature, the reactor is opened. In this stage, the predetermined temperature is not specifically defined, but may be generally from −80° C. to 200° C., preferably from −33° C. to 100° C. In this, a duct may be connected to the duct connecting mouth of the valve attached to the reactor, and may be connected to a container filled with water or the like, and the valve may be opened. Further if desired, the system may be kept in vacuum to thereby fully remove the ammonia solvent from the reactor, and then the reactor may be dried and opened to take out the formed nitride crystal and the unreacted starting material and mineralizing agent and other additives.

In case where gallium nitride is produced according to the production method for a nitride crystal of the third invention, JP-A 2009-263229 may be preferably referred to for the other details of the material, the production condition, the production apparatus and the step than those mentioned above. The entire contents of the disclosure in the patent publication are hereby incorporated in this description by reference.

In the production method for a nitride crystal of the third invention, the nitride crystal grown on the seed crystal may be post-treated. The type and the object of the post-treatment are not specifically defined. For example, the crystal surface may be given melt-back treatment in the cooling step after the growing step in order that the crystal defects such as pits, dislocations and the like can be readily detected.

In the production method for a nitride crystal of the third invention, when the nitride crystal starting material is completely dissolved under the condition where the temperature and the pressure are kept under the crystal growth condition, then the grown crystal may dissolve; and accordingly, from the viewpoint that a minor amount of the nitride crystal starting material is preferably kept remaining after the crystal growth step, the dissolution rate of the nitride crystal starting material is preferably at least 40%, more preferably from 40% to 96%, even more preferably from 50% to 85%, still more preferably from 70% to 80%. The dissolution rate can be defined as (starting material put in the reactor before the crystal growth step—starting material having remained in the rector after the crystal growth step)/(starting material put in the reactor before the crystal growth step).

<Nitride Crystal>

The nitride crystal of the present invention (the first to third inventions) is characterized in that it is produced according to the nitride crystal production method of the invention.

(Wafer)

Cutting out the nitride crystal layer having been grown according to the production method for a nitride crystal of the present invention (the first to third inventions), in a desired direction gives a wafer having any desired crystal orientation (semiconductor substrate). In case where a nitride crystal having a large-caliber M-plane is produced according to the production method of the invention, a large-caliber M-plane wafer can be obtained by cutting the crystal in the direction vertical to them-axis thereof. In case where a nitride crystal having a large-caliber semipolar plane is produced according to the production method of the invention, a large-caliber semipolar plane wafer can be obtained by cutting the crystal in the direction parallel to the semipolar plane thereof. These wafers are also characterized in that they are homogeneous and have a high quality.

(Device)

The nitride crystal and the wafer of the present invention (the first to third inventions) are favorably used for devices, or that is, for light-emitting devices or electronic devices. The light-emitting devices for which the nitride crystal and the wafer of the invention are favorably used include light-emitting diodes, laser diodes, and other light-emitting devices comprising a combination of the diode and a phosphor. As the electronic devices for which the nitride crystal and the wafer of the invention are usable, further mentioned are high-frequency devices, pressure-resistant high-power devices, etc. Examples of the high-frequency device include transistors (HEMT, HBT); and examples of the pressure-resistant high-power device include thyristors (IGBT). The nitride crystal and the wafer of the invention are characterized in that they are homogeneous and have a high quality, and are therefore suitable for any of the above-mentioned applications. Above all, they are suitable for use for electronic devices that are especially required to have high homogeneousness.

EXAMPLES

The characteristics of the invention are described more concretely with reference to the following Examples and Comparative Examples. In the following Examples, the material used, its amount and ratio, the details of the treatment and the treatment process may be suitably modified or changed not overstepping the spirit and the scope of the invention. Accordingly, the invention should not be limitatively interpreted by the Examples mentioned below.

Preparation Example 1

<Preparation of Nitride Crystal Starting Material for Use in Example 1, Example 2 and Example 6>

The angle of repose and the bulk density of the GaN polycrystalline particles, which is used as the starting material in the production method for a nitride crystal in Example 1, Example 2 and Example 6, were controlled according to the method mentioned below.

Coral-like GaN polycrystalline particles (of which the maximum diameter of the tertiary particle is from 0.5 to 50 mm), as produced according to a hydride vapor phase epitaxial (HVPE) method but not using a seed crystal, were made to collide with each other and were thus ground so that the maximum diameter of the tertiary particles thereof could be from 0.5 mm to 20 mm, whereby the angle of repose and the bulk density of the particles were controlled. In this, the particles were ground according to a method where the GaN polycrystalline particles were made to collide with each other in the atmosphere at a relative humidity of at most 50% and at about 26° C.

The ground GaN polycrystal still kept the coral shape.

30 kg of the ground GaN polycrystal was prepared, and filled in a bucket having a mouth diameter of from 20 to 30 cm in the manner as shown in FIG. 3 but not using a funnel 33. Thus, the GaN polycrystal was let to fall down from the above onto a horizontal floor plane to be piled up thereon like a conical mound. The height from which the particles are let to fall down was about 20 cm from the floor at the start of the falling down, and when the GaN polycrystal began to form a conical mound, the falling position was so changed as to be 20 cm from the top of the conical mound. In that manner, the GaN polycrystal was kept falling down and were thus piled up until the slope of the piled GaN polycrystal mound broke down twice.

The height of the piled GaN polycrystal mound (corresponding to the height of the mound, h, formed of the nitride crystal starting material in FIG. 3) was about 50 cm. The time taken from the start of piling up the GaN polycrystal to the end thereof was about 60 seconds, and the falling speed of the GaN polycrystal in the angle of repose measurement was 500 g/sec. The angle of the inclination of the conical mound of the GaN polycrystal having a gentle slope was measured. Concretely, as shown in FIG. 3, the angle, a, between the skirt (corresponding to the part of 0.6 L of the oblique side having a length L of the mound formed of the nitride crystal starting material in FIG. 3) and the bottom of the conical view on the nearly triangular projection drawing as taken by observing the conical mound in the horizontal direction was measured with a protractor.

The above measurement was repeated three times to give the following results:

First try: 31.7°
Second try: 32.7°
Third try: 31.5°

Accordingly, from the coral-like GaN polycrystal ground under the condition mentioned above, a GaN polycrystalline starting material having an angle of repose of from 31 to 33° was obtained.

Regarding the size of the GaN polycrystal ground under the above-mentioned condition, one side thereof was from 0.5 to 20 mm, and the particles were in the form of coral-like particles. Optical microscopy confirmed that the obtained GaN polycrystal was in the form of tertiary particles having a maximum diameter of from 0.5 to 20 mm, as formed through aggregation of secondary particles thereof having a maximum diameter of from 0.5 to 1 mm. Regarding the particle size distribution of the tertiary particles, particles having a particle size of from 0.1 to 1.0 mm accounted for 1.7% by mass and particles having a particle size of from 1.0 to 20 mm accounted for 98.3% by mass. The bulk density of the obtained GaN polycrystalline starting material was 1.8 g/cm$^3$.

Example 1

A RENE 41-made autoclave 1 (inner volume, about 345 cm$^3$) was used as a pressure vessel, in which a Pt—Ir-made capsule 20 was used as a reactor for crystal growth. The inner diameter of the Pt—Ir-made capsule was 2.5 cm. The capsule was filled in a fully-dried nitrogen atmosphere globe box. As the starting material 8, 130.36 g of GaN polycrystal obtained in preparation example 1 was metered and set in the lower region of the capsule (starting material charging region 9) along with a Pt-made net-like structure (not shown, 30.4 g, volume 1.39 cm$^3$) to support the baffle plate and the seed crystal supporting frame therein. In this, the height from the lowermost edge (capsule lower part) of the region with the GaN polycrystal therein and the uppermost edge thereof was about 15 cm. About ⅔ of the Pt structure was kept buried in the region where the GaN polycrystalline starting material was kept therein. From the above, the bulk density of the GaN polycrystal in the starting material charging region of the reactor was calculated as (weight of the GaN polycrystalline particles 130.36 g)/((circular area inside the capsule 4.9 cm$^2$)×(height 15 cm)−(volume of the Pt structure 1.39 cm$^3$×⅔)), and was about 1.8 g/cm$^3$. Regarding the size thereof, the polycrystal used here had a coral-like form and its one side was from 0.5 to 20 mm.

The oxygen concentration of the GaN polycrystaline starting material used the above was measured through SIMS by using Ims-4f manufactured by CAMECA Instruments, Inc., the oxygen concentration was 4.6×10$^{18}$ cm$^{-3}$.

Next, a platinum-made baffle plate 5 was arranged between the lower starting material charging region 9 and the upper crystal growing region 6. As the seed crystal 7, used were a C-plane wafer and an M-plane wafer of a hexagonal-system GaN single crystal having been grown through HYPE. These seed crystals 7 were hung on a platinum-made seed crystal supporting frame via a metal wire having a diameter of 0.4 mm, and set in the upper crystal growing region 6 of the capsule.

Next, a Pt—Ir-made cap was attached to the top of the capsule 20, and then the weight was measured. A valve similar to the valve 10 in FIG. 1 was connected to the tube attached to the top of the cap, and the valve was so designed as to communicate with the vacuum pump 11, via which the capsule was degassed in vacuum. Next, the valve was operated so as to communicate with the nitrogen cylinder 13, by which the capsule was purged with a nitrogen gas. The degassification in vacuum and the nitrogen purging were attained five times each, and then while kept connected to the vacuum pump, the capsule was heated to remove moisture and adhering gas therefrom. Subsequently, as an acidic mineralizing agent, HCl gas was introduced into the capsule at a liquid nitrogen temperature in such a manner that the concentration thereof could be 3 mol % relative to ammonia based on flow rate control. Next, NH$_3$ was charged, and then the capsule 20 was sealed up.

Subsequently, the capsule was inserted into the autoclave equipped with the valve 10, then the autoclave was closed, and the weight of the autoclave 1 was metered. Next, the valve 10 attached to the autoclave was operated so that the duct could communicate with the vacuum pump 11, and the valve was opened for degassification in vacuum. Like the capsule, this was nitrogen-purged multiple times. Afterwards, while kept in vacuum, the autoclave 1 was cooled with a dry ice/methanol solvent, and the valve 10 was once closed. Next, the valve was again operated so that the duct could communicate with the NH$_3$ cylinder 12, and then the valve 10 was again opened so that the autoclave 1 could be charged with NH$_3$ while continuously protected from being aired out, and then the valve 10 was again closed. The temperature of the autoclave 1 was restored to room temperature, the outer surface thereof was fully dried, and the weight of the autoclave 1 was metered. The amount of charge was confirmed by calculating the weight of NH$_3$ based on the difference from the weight of the autoclave before the charge of NH$_3$.

Subsequently, the autoclave 1 was housed in an electric furnace composed of two-divided upper and lower heater sections. Next, the apparatus was so controlled that the temperature difference ΔT between the crystal growing region 6 and the starting material charging region 9 could be the value shown in Table 1, and at that temperature, the system was kept for 14.7 days. The pressure inside the autoclave was about 260 MPa. While the autoclave was kept as such, the fluctuation in the autoclave outer surface control temperature was not more than ±0.3° C.

Afterwards, this was spontaneously cooled until the outer surface temperature of the autoclave 1 could be restored to room temperature, then the valve 10 attached to the autoclave was opened, and NH$_3$ in the autoclave was removed. Next, the autoclave 1 was weighed, and the NH$_3$ emission was thereby confirmed, and then the cap of the autoclave was opened and the capsule 20 was taken out. A hole was formed in the tube attached to the top of the capsule and NH$_3$ was removed from the capsule. The inside of the capsule was checked. As a result, a gallium nitride crystal was precipitated uniformly on the entire surface of both the C-plane and the M-plane of the seed crystal.

The growth rate in the direction of the m-axis, the c-axis and the a-axis was computed from the grown thickness and the days taken for the growth, and the results are shown in Table 1. The weight of non-dissolution starting material was checked, and was 40.88 g. The dissolution rate of the starting material was calculated and shown in the Table 1. The recovered GaN polycrystalline starting material was analyzed and was confirmed to have been wholly dissolved to be small particles. From this, the convection flow of the solvent was occurred in the starting material charging region 9, therefore it is considered that NH$_3$ could be kept in contact with the entire GaN polycrystalline starting material.

Example 2

In Example 2, NH$_4$I having a purity of 99.999% and GaF$_3$ having a purity of 99.999% were used in place of HCl as acidic mineralizing agents, and the mineralizing agents were so metered and put into the capsule that the total of the I concentration and the F concentration could be 2.25 mol % relative to the charged NH$_3$ amount, and the temperature and the pressure for crystal growth were changed to those shown in Table 1. The bulk density of the starting material and the others in the process were the same as in Example 1, and with that, a gallium nitride crystal was precipitated on the seed crystal in condition of Table 1.

The weight of non-dissolution starting material after the growth step was checked, and was 82.19 g. The dissolution rate of the GaN polycrystalline starting material was calculated and shown in the Table 1. The recovered GaN polycrystalline starting material was analyzed and was confirmed to have been wholly dissolved to be small particles. From this, it is considered that $NH_3$ could be kept in contact with the entire GaN polycrystalline starting material.

Example 3

In Example 3, a gallium nitride crystal was precipitated on the seed crystal in condition of Table 1 according to the same process as in Example 2 except that a tabular GaN polycrystal having a smaller bulk density of 0.8 g/cm$^3$ was used as the starting material as in Table 1.

By the use of the GaN polycrystalline starting material having a small particle size and a small bulk density relatively, the GaN polycrystal was charged in such a manner that the bulk density of the GaN polycrystalline starting material in the starting material charging region 9 could be 0.8 g/cm$^3$, the starting material was reached at around a range of the crystal growth region of the capsule 20. Therefore, the GaN polycrystalline starting material around the crystal growth region was not dissolved fully, undissolved GaN polycrystalline starting material was to be the crystal nuclei, thereby a gallium nitride crystal was precipitated other than a portion of the seed crystal. Accordingly, regarding the growth rate, in considering these spontaneous nucleation growth crystal, expected values are shown in Table 1.

These results, in case of using the GaN polycrystalline starting material having a small bulk density, it is preferable to use the reactor having a feature that the distance between the starting material charging region and the crystal growth region is sufficiently provided.

Example 4

In Example 4, a gallium nitride crystal was precipitated on the seed crystal in condition of Table 1 according to the same process as in Example 2 except that a pellet-form GaN polycrystal having a larger bulk density of 3.2 g/cm$^3$ was used as the starting material as in Table 1.

The weight of non-dissolution starting material after the growth step was measured, and the dissolution rate of the GaN polycrystalline starting material was calculated and shown in the Table 1. The recovered GaN polycrystalline starting material was analyzed and was confirmed to have been wholly dissolved to be small particles. From this, it is considered that $NH_3$ could be kept in contact with the entire GaN polycrystalline starting material. However, by using the starting material having a pellet-form and a small particle size relatively, the convection flow of the solvent was suppressed slightly and therefore, the dissolution rate was low.

Example 5

In Example 5, a mixture prepared by mixing the coral-like formed GaN polycrystal used in Example 1 and a powdery GaN polycrystal was used so as to have a further larger bulk density in the starting material charging region of the reactor as in Table 1. The powdery GaN polycrystal used here had a bulk density of 1.8 g/cm$^3$, as measured alone.

The mixing process in this Example is described. Regarding the starting material charging mode, first the coral-like formed GaN polycrystal having a large bulk density was put into the capsule. Next, the powdery GaN polycrystal was added thereto, and the capsule was then shaken so that the powdery GaN polycrystal could fill up the gap between the coral-like formed GaN polycrystalline particles.

74.2 g of the coral-like formed GaN polycrystal having a bulk density of 1.8 g/cm$^3$ on its own was first put into a Pt—Ir-made capsule having an inner diameter of 2.5 cm, then 55.8 g of the powdery GaN polycrystal having a bulk density of 1.8 g/cm$^3$ on its own was added thereto, and the capsule was shaken so that the powdery GaN polycrystal could fill up the gap between the coral-like formed GaN polycrystalline particles, and the height of the mixture was 8.8 cm. The bulk density of the GaN polycrystal as mentioned above charging mode was (weight of the GaN particles 130 g)/((circular area inside the capsule 4.9 cm$^2$)×(height 8.8 cm)−(volume of the Pt structure 1.39 cm$^3$×⅔))=about 3.0 g/cm$^3$.

The bulk density of the coral-like formed GaN polycrystal is 1.8 g/cm$^3$. From the maximum value of the theoretical bulk density of gallium nitride, about 6.1 g/cm$^3$, the GaN polycrystal could occupy about 30% of the volume, and the powdery GaN polycrystal could fill up the remaining 70% of the space. The bulk density of about 3.0 g/cm$^3$ thus calculated was the same as the above.

A gallium nitride crystal is precipitated on the seed crystal in condition of Table 1 according to the same process as in Example 2 except that the GaN polycrystal was charged as mentioned above. The bulk density in the starting material charging region is larger and therefore, the growth rate on the seed crystal is slightly slow, however, the crystal growth for a long period of time is possible.

Reference Example

In Reference Example, a mixture prepared by mixing a triangular GaN single crystal obtained by crushing a single crystal and a powdery GaN polycrystal used in Example 5 was used so as to have a further larger bulk density in the starting material charging region of the reactor as in Table 1. The triangular GaN single crystal used here had a bulk density of 2.5 g/cm$^3$, as measured alone.

The mixing process in this Example is described. Regarding the starting material charging mode, first the triangular GaN single crystal having a large bulk density was put into the capsule. Next, the powdery GaN polycrystal was added thereto, and the capsule was then shaken so that the powdery GaN polycrystal could fill up the gap between the triangular GaN single crystal particles.

The bulk density of the triangular GaN single crystal alone is 2.5 g/cm$^3$. From the maximum value of the theoretical bulk density of gallium nitride, about 6.1 g/cm$^3$, the triangular GaN single crystal could occupy about 40% of the volume. The powdery GaN polycrystal could fill up 60% of the remaining space, and the calculated bulk density is matched the bulk density of 3.6 g/cm$^3$.

Example 6

(Crystal Growth)

Using a platinum-lined Inconel 625-made autoclave (about 110 ml) having, as the inside dimension, a diameter of 20 mm and a length of 350 mm, 7.23 g of the well-dried GaN polycrystalline starting material prepared in Preparation Example 1 was put into a pBN-made crucible having an inner diameter of 12 mm, a length of 120 mm, and a thickness of 1 to 2 mm. The crucible was installed on the bottom of the autoclave. The bulk density of in the starting material charging region was 0.8 g/cm$^3$. Next, 2.6 g of well-dried NH$_4$Cl having a purity of 99.99% was used as a mineralizing agent, and the mineralizing agent was so metered that the Cl concentration relative to the charged NH$_3$ amount could be 1.92 mol % and put into the reactor, autoclave. Subsequently, a baffle plate and two seed crystals were installed. Of the installed seed crystals, one had the c-plane as the main plane and had a weight of 218.1 mg, and the other had the m-plane as the main plane and had a weight of 28.1 mg. After the seed crystals were installed therein, the valved autoclave was immediately closed, and weighed. Next, the autoclave was so operated that the duct attached thereto could communicate with a vacuum pump via the vale, and the valve was opened and the autoclave was degasified into vacuum. Subsequently, while the vacuum state was kept as such, the autoclave was cooled with a dry ice/methanol solvent, and then the valve was once turned off. Next, the duct was so operated as to communicate with an NH$_3$ cylinder, then the valve was again opened so that NH$_3$ was charged into the autoclave with no exposure to outer air in a series of operation, and thereafter the valve was again turned back. The temperature in the autoclave was restored to room temperature, then the outer surface was fully dried, and the increase in the charged NH$_3$ amount was metered.

Subsequently, the autoclave was housed in an electric furnace formed of a heater divided into two parts, upper and lower parts. The autoclave was heated for 5 hours while given a temperature difference of such that the temperature of the outer surface of the lower part of the autoclave could be 475° C. and the temperature of the outer surface of the upper part thereof could be 425° C.; and when the temperature of the outer surface of the lower part of the autoclave reached 475° C. and the temperature of the outer surface of the upper part thereof reached 425° C., the autoclave was further kept at those temperatures for further 96 hours. The pressure in the autoclave was about 144 MPa. During the heating, the temperature fluctuation was at most ±5° C.

Subsequently, the autoclave was cooled for about 8 hours until the temperature of the outer surface of the lower part thereof could reach 150° C., and then heating with the heater was stopped, and the autoclave was spontaneously left cooled in the electric furnace. After the temperature of the outer surface of the lower part of the autoclave was confirmed to have lowered to room temperature, first, the valve attached to the autoclave was opened and NH$_3$ inside the autoclave was removed.

Subsequently, the autoclave was weighed, and after the NH$_3$ removal was confirmed, the valve was once turned off and the autoclave was then so operated as to communicate with the vacuum pump.

Next, the valve was again opened, and NH$_3$ in the autoclave was almost completely removed. Subsequently, the autoclave was opened and the inside thereof was confirmed.

The weight of the seed crystal having the c-plane as the main plane (c-plane seed) was metered, and was 325.4 mg. Thus, the weight increase of 107.3 mg was confirmed. On the other hand, the weight of the seed crystal having the m-plane as the main plane (m-plane seed) was 34.7 mg, and the weight increase of 6.6 mg was confirmed. These confirmed the precipitation of gallium nitride crystal. In the crucible in which the GaN polycrystalline starting material had been put, 1.10 g of GaN powder crystal remained, as kept undissolved. The dissolution amount of the starting material was 6.13 g, and as shown in Table 1, 85% of the starting material dissolved.

Example 7

In this Example, a nitride crystal was grown using the reaction apparatus shown in FIG. 1.

A RENE 41-made autoclave 1 was used as a pressure vessel, in which a Pt—Ir-made capsule 20 was used as a reactor for crystal growth. As the starting material 8, 130 g of GaN polycrystalline particles having a balk density of 1.8 g/cm$^3$ and an oxygen concentration of 20 ppm, which had been prepared in the same manner as in Preparation Example 1, were metered and set in the lower region of the capsule (starting material charging region 9). Next, as a mineralizing agent, well-dried NH$_4$F having a purity of 99.999% was, as so metered that the F concentration relative to the charged NH$_3$ amount could be 0.5 mol %, put into the capsule. Further, a Pt-made baffle plate 5 was installed between the lower starting material charging region 9 and the upper crystal growing region 6. As the seed crystals 7, used here were 3 sheets of hexagonal GaN single crystal having the m-plane as the main plane thereof, and one sheet of a c-plane wafer. The surface of the seed crystal having the m-plane as the main plane was CMP-finished, and the main plane of the c-plane wafer was LAP-treated. These seed crystals 7 were hung from a platinum-made seed crystal supporting frame via the platinum wire 7 having a diameter of 0.3 mm, and installed in the upper crystal growing region 6 in the capsule.

Next, a Pt—Ir-made cap was attached to the top of the capsule 20. Next, a tube was connected to the HI gas line, and the valve was so operated as to communicate with the vacuum pump for vacuum degassing. Subsequently, the valve was so operated as to communicate with the nitrogen cylinder 13 and the capsule was purged with nitrogen gas. After vacuum degassing, the autoclave was purged with nitrogen, and then left overnight as such while connected to the vacuum pump.

Next, the lower part of the capsule was cooled with liquid nitrogen, and the valve was opened to for HI charging with no exposure to open air. Based on the flow rate control, HI as the mineralizing agent was charged in such an amount that the I concentration relative to the charged NH$_3$ amount could be 1.5 mol %, and then the valve was again turned off. Next, the capsule was removed from the HI line and then connected to the NH$_3$ gas line. The gas line was degassed into vacuum and purged with nitrogen, and then further vacuumed via the vacuum pump. Subsequently, the NH$_3$ gas line was operated, and based on the flow rate control, NH$_3$ was charged in an equimolar amount to the previously-charged HI gas, and thereafter the valve was turned back. Next, the capsule was taken out of the liquid nitrogen, and cooled with a dry ice-ethanol solvent. Subsequently, the valve was again opened and filled with NH$_3$ with no exposure to open air, and then the valve was again turned back. Afterward, the tube at the top of the cap was sealed up by welding with a welder.

Subsequently, the capsule was inserted into the autoclave, and the autoclave was sealed up. The duct was so operated it could communicate with the vacuum pump 11 via the valve 10 attached to the autoclave, and the valve was opened for degassing into vacuum. Like the capsule, the autoclave was purged with nitrogen gas several times. Afterward, while kept in vacuum, the autoclave 1 was cooled with a dry ice-methanol solvent, and the valve 10 was once turned off.

Next, the duct was so operated as to communicate with the NH$_3$ cylinder 12, and then the valve 10 was again opened so that NH$_3$ could be charged into the autoclave 1 with no exposure to open air, and then the valve 10 was again turned back.

Subsequently, the autoclave 1 was housed in an electric furnace formed of a heater divided into two parts, upper and lower parts. The autoclave was heated under control of the autoclave outer surface temperature in such a manner that the mean temperature inside the autoclave could be 600° C. and the temperature fluctuation inside it could be 20° C. After reached the predetermined temperature, the autoclave was kept at the temperature for 16.8 days. The pressure in the autoclave was 215 MPa. During the heating, the fluctuation in the autoclave outer surface control temperature was at most ±3° C.

Subsequently, the autoclave 1 was cooled until the temperature of the outer surface thereof could reach 400° C., the valve 10 attached to the autoclave was opened to remove NH$_3$ from the autoclave. In this state, the capsule was broken by utilizing the pressure difference between the autoclave and the capsule, and NH$_3$ filled in the capsule was also removed.

The autoclave 1 was weighed and removal of NH$_3$ was confirmed. The autoclave was opened and the capsule 20 was taken out. The inside of the capsule was checked, in which a gallium nitride crystal was grown on both the m-plane and c-plane seed crystals. In macroscopic observation, the crystal was a yellow to brown transparent crystal. In particular, any visible defects of cracks or voids were not seen on the m-plane gallium nitride crystal. The gallium nitride crystal having grown on the seed crystal was analyzed through X-ray diffractiometry, which confirmed that the crystal was a hexagonal system crystal and did not contain cubic GaN. The growth rate ((crystal thickness–seed crystal thickness)/day for growth) was 220 μm/day. As shown in Table 1, the dissolution rate was 51%. The recovered GaN polycrystalline starting material was analyzed and was confirmed to have been wholly dissolved to be small particles. From this, it is considered that NH$_3$ could be kept in contact with the entire GaN polycrystalline starting material.

The grown crystal was analyzed through SIMS. The oxygen concentration was $2.20 \times 10^{18}$ atoms/cm$^3$, the Si concentration was $1.14 \times 10^{15}$ atoms/cm$^3$, the F concentration was $1.15 \times 10^{17}$ atoms/cm$^3$, and the I concentration was $2.60 \times 10^{17}$ atoms/cm$^3$.

The obtained gallium nitride crystal was annealed in an atmosphere of 90% nitrogen-10% ammonia at 1060° C. for 24 hours, and then analyzed for Hall measurement. From the results of the Hall measurement of the annealed GaN crystal, it was confirmed that the carrier concentration was $1.90 \times 10^{18}$ atoms/cm$^3$, the mobility was 288 cm$^2$/V·s, and the specific resistivity was $1.08 \times 10^{-2}$ Ωcm.

Example 8

A nitride crystal was grown in condition of Table 1 according to the same process as in Example 7 except that the GaN polycrystalline particles having a balk density of 2.2 g/cm$^3$ and an oxygen concentration of 13 ppm, which had been prepared pursuant to the method in Preparation Example 1, was used as the starting material 8. As shown in Table 1, the dissolution rate was 70%. The recovered GaN polycrystalline starting material was analyzed and was confirmed to have been wholly dissolved to be small particles. From this, it is considered that NH$_3$ could be kept in contact with the entire GaN polycrystalline starting material.

The grown gallium nitride crystal was analyzed through SIMS. The oxygen concentration was $1.50 \times 10^{18}$ atoms/cm$^3$ and the Si concentration was $2.06 \times 10^{14}$ atoms/cm$^3$.

The obtained gallium nitride crystal was annealed in an atmosphere of 90% nitrogen-10% ammonia at 1060° C. for 24 hours, and then analyzed for Hall measurement. From the results of the Hall measurement of the annealed GaN crystal, it was confirmed that the carrier concentration was $6.7 \times 10^{17}$ atoms/cm$^3$, the mobility was 335 cm$^2$/V·s, the specific resistivity was $2.40 \times 10^{-2}$ Ωcm, the F concentration was $4.30 \times 10^{17}$ atoms/cm$^3$, and the I concentration was $2.86 \times 10^{17}$ atoms/cm$^3$.

Example 9

A nitride crystal was grown in condition of Table 1 according to the same process as in Example 7 except that the GaN polycrystalline particles having a balk density of 1.8 g/cm$^3$ and an oxygen concentration of 20 ppm, which had been prepared pursuant to the method in Preparation Example 1, was used as the starting material 8. As shown in Table 1, the dissolution rate was 68%. The recovered GaN polycrystalline starting material was analyzed and was confirmed to have been wholly dissolved to be small particles. From this, it is considered that NH$_3$ could be kept in contact with the entire GaN polycrystalline starting material.

The grown gallium nitride crystal was analyzed through SIMS. The oxygen concentration was $4.80 \times 10^{18}$ atoms/cm$^3$.

The obtained gallium nitride crystal was annealed in an atmosphere of 90% nitrogen-10% ammonia at 1060° C. for 24 hours, and then analyzed for Hall measurement. From the results of the Hall measurement of the annealed GaN crystal, it was confirmed that the carrier concentration was $2.44 \times 10^{18}$ atoms/cm$^3$, the mobility was 343 cm$^2$/V·s, and the specific resistivity was $2.33 \times 10^{-2}$ Ωcm.

Example 10

A nitride crystal was grown in condition of Table 1 according to the same process as in Example 7 except that the GaN polycrystalline particles having a balk density of 1.8 g/cm$^3$ and an oxygen concentration of 20 ppm, which had been prepared pursuant to the method in Preparation Example 1, was used as the starting material 8. As shown in Table 1, the dissolution rate was 64%. The recovered GaN polycrystalline starting material was analyzed and was confirmed to have been wholly dissolved to be small particles. From this, it is considered that NH$_3$ could be kept in contact with the entire GaN polycrystalline starting material.

The grown gallium nitride crystal was analyzed through SIMS. The oxygen concentration was $6.90 \times 10^{18}$ atoms/cm$^3$ and the Si concentration was $1.5 \times 10^{16}$ atoms/cm$^3$.

The obtained gallium nitride crystal was annealed in an atmosphere of 90% nitrogen-10% ammonia at 1060° C. for 24 hours, and then analyzed for Hall measurement. From the results of the Hall measurement of the annealed GaN crystal, it was confirmed that the carrier concentration was $1.69 \times 10^{18}$ atoms/cm$^3$, the mobility was 330 cm$^2$/V·s, the specific resistivity was $2.11 \times 10^{-2}$ Ωcm, the F concentration was $2.7 \times 10^{17}$ atoms/cm$^3$, the I concentration was $2.5 \times 10^{15}$ atoms/cm$^3$ or less, and the Cl concentration was $1.5 \times 10^{15}$ atoms/cm$^3$ or less.

Example 11

A nitride crystal was grown in condition of Table 1 according to the same process as in Example 7 except that the GaN polycrystalline particles having a balk density of 2.6 g/cm$^3$ and an oxygen concentration of 61 ppm, which had been prepared pursuant to the method in Preparation Example 1, was used as the starting material 8. As shown in Table 1, the dissolution rate was 46%. The recovered GaN polycrystalline starting material was analyzed and was confirmed to have been wholly dissolved to be small particles. From this, it is considered that NH$_3$ could be kept in contact with the entire GaN polycrystalline starting material.

The obtained gallium nitride crystal was annealed in an atmosphere of 90% nitrogen-10% ammonia at 1060° C. for 24 hours, and then analyzed for Hall measurement. From the results of the Hall measurement of the annealed GaN crystal, it was confirmed that the carrier concentration was 1.70×10$^{18}$ atoms/cm$^3$.

Example 12

A nitride crystal was grown in condition of Table 1 according to the same process as in Example 7 except that the GaN polycrystalline particles having a balk density of 1.9 g/cm$^3$ and an oxygen concentration of 78 ppm, which had been prepared pursuant to the method in Preparation Example 1, was used as the starting material 8. As shown in Table 1, the dissolution rate was 84%. The recovered GaN polycrystalline starting material was analyzed and was confirmed to have been wholly dissolved to be small particles. From this, it is considered that NH$_3$ could be kept in contact with the entire GaN polycrystalline starting material.

The grown gallium nitride crystal was analyzed through SIMS. The oxygen concentration was 9.9×10$^{18}$ atoms/cm$^3$ and the Si concentration was 7.4×10$^{14}$ atoms/cm$^3$.

The obtained gallium nitride crystal was annealed in an atmosphere of 90% nitrogen-10% ammonia at 1060° C. for 24 hours, and then analyzed for Hall measurement. From the results of the Hall measurement of the annealed GaN crystal, it was confirmed that the carrier concentration was 3.09×10$^{18}$ atoms/cm$^3$, the mobility was 226 cm$^2$/V·s, the specific resistivity was 0.90×10$^{-2}$ Ωcm, the F concentration was 2.94×10$^{17}$ atoms/cm$^3$, the I concentration was 2.35×10$^{15}$ atoms/cm$^3$ or less.

Example 13

A nitride crystal was grown in condition of Table 1 according to the same process as in Example 7 except that the GaN polycrystalline particles having a balk density of 1.8 g/cm$^3$, which had been prepared pursuant to the method in Preparation Example 1, was used as the starting material 8. As shown in Table 1, the dissolution rate was 61%. The recovered GaN polycrystalline starting material was analyzed and was confirmed to have been wholly dissolved to be small particles. From this, it is considered that NH$_3$ could be kept in contact with the entire GaN polycrystalline starting material.

The grown gallium nitride crystal was analyzed through SIMS. The oxygen concentration was 9.00×10$^{18}$ atoms/cm$^3$ and the Si concentration was 3.00×10$^{14}$ atoms/cm$^3$.

The obtained gallium nitride crystal was annealed in an atmosphere of 90% nitrogen-10% ammonia at 1060° C. for 24 hours, and then analyzed for Hall measurement. From the results of the Hall measurement of the annealed GaN crystal, it was confirmed that the carrier concentration was 3.90×10$^{18}$ atoms/cm$^3$, the mobility was 181 cm$^2$/V·s, the specific resistivity was 8.86×10$^{-3}$ Ωcm.

Example 14

A nitride crystal was grown in condition of Table 1 according to the same process as in Example 7 except that the GaN polycrystalline particles having a balk density of 1.8 g/cm$^3$, which had been prepared pursuant to the method in Preparation Example 1, was used as the starting material 8.

The grown gallium nitride crystal was analyzed through SIMS. The oxygen concentration was 2.00×10$^{19}$ atoms/cm$^3$ and the Si concentration was 5.00×10$^{14}$ atoms/cm$^3$.

The obtained gallium nitride crystal was annealed in an atmosphere of 90% nitrogen-10% ammonia at 1060° C. for 24 hours, and then analyzed for Hall measurement. From the results of the Hall measurement of the annealed GaN crystal, it was confirmed that the carrier concentration was 9.54×10$^{18}$ atoms/cm$^3$, the mobility was 158 cm$^2$/V·s, the specific resistivity was 4.09×10$^{-3}$ Ωcm.

Example 15

A nitride crystal was grown in condition of Table 1 according to the same process as in Example 7 except that the GaN polycrystalline particles having a balk density of 1.8 g/cm$^3$ and an oxygen concentration of 148 ppm, which had been prepared pursuant to the method in Preparation Example 1, was used as the starting material 8. The gallium nitride crystal was obtained. The obtained gallium nitride crystal was colored wholly black.

Comparative Example 1

In Comparative Example 1, gallium nitride was precipitated on the seed crystal according to the same process as in Example 2 except that a fumed GaN polycrystal having a smallest bulk density (as aggregated in the state where powdery GaN particles having a size of from 20 to 30 µm are spaced from each other, thereby having a size of from 0.1 to 20 mm) was used as the starting material as in Table 1. The bulk density of the GaN polycrystal in the starting material charging region is 0.62 g/cm$^3$.

Comparative Example 2

In Comparative Example 2, gallium nitride was precipitated on the seed crystal according to the same process as in Example 2 except that wafer-like single-crystal GaN particles having a largest bulk density were piled up and used as the starting material as in Table 1.

The bulk density of the GaN crystal in the starting material charging region is estimated as follows: Disc-like GaN single crystals having a diameter of 0.4 cm and a thickness of 0.5 cm are piled up, as spaced by 0.1 cm from each other, and 100 kg of the starting material is put into the capsule having an inner diameter of 24 cm. With that, the bulk density of the starting material is calculated as 4.9 g/cm$^3$ Preparation Example 2

<Preparation of Nitride Crystal Starting Material for Use in Comparative Examples 3 and 4>

According to the same method as the production method in JP-A 2006-083055, a powdery GaN polycrystal (of which the tertiary particles have a maximum diameter of from 1 to 5 µm) was produced.

4.00 g of 6N metal gallium was charged in a pBN-made cylindrical container (volume 70 cc) having a length of 100 mm and a diameter of 30 mm. In this stage, the ratio of the starting metal volume to the container volume was at most 0.02, and the ratio of the area of the bottom and the wall of the container with which the starting metal was kept in contact to the sum total area of the bottom and the wall of the container was at most 0.02. The area in which the metal gallium charged in the container could be kept in contact with the gas therein was at least 0.7 cm$^2$/g. The container was immediately installed in the center part of the reactor of a horizontal cylindrical quartz tube having an inner diameter of 32 mm and a length of 700 mm, and high-purity (5N) nitrogen was led to run therethrough at a flow rate of 200 Nml/min by which the inside of the reactor and the pipeline part was fully purged with nitrogen.

Subsequently, while high-purity (5N) nitrogen was kept running therethrough at 50 Nml/min, the reactor was heated up to 300° C. with the heater attached thereto, and then the running gas was changed to a mixed gas of 5N ammonia at 500 Nml/min and 5N nitrogen at 50 Nml/min. In this stage, the volume/sec of the supplied ammonia to the sum total of the volume of the starting metal was at least 12 times, and the gas flow rate nearly above the top of the starting metal was at least 1 cm/sec. While the gas supply was kept as such, the reactor was heated from 300° C. up to 1050° C. at 10° C./min. In this stage, the temperature of the outer surface at the center part of the reactor was 1050° C. With the mixed gas still kept introduced thereinto, the reaction was continued for 3 hours in the container. After reacted for 3 hours at 1050° C., the heater was stopped and the reactor was kept spontaneously cooled. The time taken until cooling to 300° C. was about 4 hours. After the reactor was cooled to 300° C. or lower, the running gas was changed to 5N nitrogen alone (flow rate, 100 Nml/min). After cooled to room temperature, the quartz tube was opened, and the container was taken out into an inert gas box having a moisture concentration of at most 5 ppm at an oxygen concentration of at most 5 ppm, and the product therein was fully ground to have a size of at most 100 mesh, thereby giving a gallium nitride polycrystalline powder. The obtained gallium nitride polycrystalline powder had a tertiary particle diameter of from 1 to 5 μm.

As calculated from the weight change before and after the reaction including the container weight, the obtained gallium nitride polycrystalline powder was 4.798 g; and as calculated from the theoretical value of the weight increase in the case where metal gallium could be all converted into gallium nitride. The conversion ratio was 99% or more. The surface area of the gallium nitride polycrystalline powder was measured according to a one-point BET surface area measuring method using Okura Riken's AMS-1000. After pretreatment of degassing at 200° C. for 15 minutes, the relative surface area of the powder was obtained from the nitrogen absorption thereof at a liquid nitrogen temperature, and was 0.5 m$^2$/g or less.

The thus-prepared powdery GaN polycrystalline powder (the tertiary particles were at most from 1 to 5 μm) was analyzed with Hosokawa Micron's Powder Tester (Lot Code PT-N), and the angle of repose thereof was measured.

The powdery GaN polycrystalline powder was put in a standard sieve and let to fall down onto a table through a funnel while the standard sieve was kept shaken, as in FIG. 3. In this stage, the sieve frequency was 50 Hz and the sieve vibration amplitude was 2 mm. Regarding the funnel size, the inner diameter of the mouth thereof was 4.5 mm and the outer diameter was 8.0 mm. The powdery GaN polycrystal was kept falling down until the mound of the GaN polycrystalline powder having fallen from the funnel broke a few times and thereafter the slope of the mound could reach about 5 cm. Based on the slope part of up to 0.6 times the length L from the bottom to the top of the conical mound formed of the GaN polycrystalline powder in the slope direction thereof (the side of about 3 cm of the slope length from the base of the mound), the angle, a, between the bottom and the top of the mound was measure using an angle measuring arm. Thus measured, the angle, a, is the angle of repose of the powder. The mount nearly at the top thereof was omitted in measurement, as not providing the angle of repose.

The above measurement was repeated three times to give the following results:
First try: 46.0°
Second try: 46.9°
Third try: 48.9°

Accordingly, the angle of repose of the GaN polycrystalline powder obtained herein was from 46 to 49°. The bulk density of the obtained GaN polycrystalline starting material was 1.8 g/cm$^3$.

Comparative Example 3

(Crystal Growth)

A crystal was grown using the same apparatus and under the same condition as in Example 6, except that 7.23 g of the GaN polycrystalline powder prepared in Preparation Example 2 was used as the GaN polycrystalline starting material and the concentration of the mineralizing agent was changed as in the following Table 1. The bulk density and the oxygen concentration of the GaN polycrystalline powder used in Comparative Example 3 were measured in the same manner as in Example 1. The results are shown in the following Table 1. Two seed crystals were installed herein; one had the c-plane as the main plane and the weight thereof was 138.1 mg, and the other had the m-plane as the main plane thereof and the weight thereof was 3.9 mg. The bulk density of in the starting material charging region was 0.8 g/cm$^3$.

After crystal growth, the weight of the seed crystal having the c-plane as the main plane was measured, and was 151.0 mg, from which the weight increase of 12.9 mg was confirmed. The weight of the seed crystal having the m-plane as the main plane was 4.3 mg, from which the weight increase of 0.4 mg was confirmed. Accordingly, gallium nitride crystal precipitation was confirmed, but as compared with that in Example 6, the amount of the crystal was only slight. In the crucible in which the starting material had been put, 5.72 g of GaN powder crystal remained, as kept undissolved. The dissolution amount of the starting material was 1.52 g, and as shown in Table 1, 21% of the starting material dissolved. Since the formed crystal was small, the growth rate was not determined, and the crystal formation was indicated by the weight increase.

The recovered undissolved powder starting material was analyzed through SEM, which, however, did not show any remarkable change before and after the crystal growth. From this, it is considered that NH$_3$ could not be kept in full contact with the GaN polycrystalline powder used herein, and the dissolution of the starting material would be therefore insufficient.

Comparative Example 4

(Crystal Growth)

A crystal was grown using the same apparatus and under the same condition as in Example 6, except that 20 g of the GaN polycrystalline powder prepared in Preparation Example 2 was used as the GaN polycrystalline starting material and the concentration of the mineralizing agent was changed as in the following Table 1. The bulk density and the oxygen concentration of the GaN polycrystalline starting material used in Comparative Example 4 were measured in the same manner as in Example 1. The results are shown in the following Table 1. The seed crystal installed herein had the c-plane as the main plane and the weight thereof was 65.4 mg. The bulk density of in the starting material charging region was 0.8 g/cm$^3$.

After crystal growth, the weight of the seed crystal was measured, and was 68.0 mg, from which the weight increase of 2.6 mg was confirmed. Accordingly, gallium nitride crystal precipitation was confirmed, but as compared with that in Example 6, the amount of the crystal was only slight. In the crucible in which the starting material had been put, 13.63 g of GaN powder crystal remained, as kept undissolved. The dissolution amount of the starting material was 6.37 g, and as shown in Table 1, 32% of the starting material dissolved. Since the formed crystal was small, the growth rate was not determined, and the crystal formation was indicated by the weight increase.

TABLE 1

| | GaN Crystal Starting Material | | | | | | Mineralizing Agent | | bulk density of starting material charging region (g/cm³) | Growth Temperature Difference Δt (starting material charging region - crystal growing region) (°C) |
|---|---|---|---|---|---|---|---|---|---|---|
| | bulk density (g/cm³) | angle of repose (°) | particle diameter (mm) | maximum diameter of secondary particles (mm) | shape | oxygen concentration (cm⁻³) / concentration (wtppm) | type | concentration (mol %) | | |
| Example 1 | 1.8 | 31~33 | 0.5~20 | 0.5-1 | coral | $4.6 \times 10^{18}$ / 20 | HCl | 3 | 1.8 | 30 |
| Example 2 | 1.8 | 31~33 | 0.5~20 | 0.5-1 | coral | $4.6 \times 10^{18}$ / 20 | NH₄I, GaF₃ | 2.25 | 1.8 | 15 |
| Example 3 | 0.8 | | 0.1~5.0 | 0.01-0.5 | tabular | $3.4 \times 10^{19}$ / 130 | NH₄I, GaF₃ | 2.25 | 0.8 | 15 |
| Example 4 | 3.2 | | 0.5~10 | 0.5-1 | small granular | | NH₄I, GaF₃ | 2.25 | 3.2 | 15 |
| Example 5 | 1.8, 1.8 | | 0.5~20, $1 \times 10^{-3}$ | 0.5-1 | coral powdery | | NH₄I, GaF₃ | 2.25 | 3.0* | 15 |
| Reference Example | 2.5, 1.8 | | 10-15, $1 \times 10^{-3}$ | No secondary particles | triangular powdery | | NH₄I, GaF₃ | 2.25 | 3.6* | 15 |
| Example 6 | 1.8 | 31~33 | 0.5~20 | 0.5-1 | coral | $4.6 \times 10^{18}$ / 20 | NH₄Cl | 1.92 | 0.8 | 50 |
| Example 7 | 1.8 | 31~33 | 0.5~20 | 0.5-1 | coral | $4.6 \times 10^{18}$ / 20 | HI NH₄F | 2 | 1.8 | 10 |
| Example 8 | 2.2 | | 0.5~20 | 0.5-1 | coral | $3.0 \times 10^{18}$ / 13 | HI NH₄F | 2 | 2.2 | 9 |
| Example 9 | 1.8 | 31~33 | 0.5~20 | 0.5-1 | coral | $4.6 \times 10^{18}$ / 20 | NH₄I, GaF₃ | 2.75 | 1.8 | 15 |
| Example 10 | 1.8 | 31~33 | 0.5~20 | 0.5-1 | coral | $4.6 \times 10^{18}$ / 20 | NH₄I, GaF₃ | 1.125 | 1.8 | 5 |
| Example 11 | 2.6 | | 0.5~20 | 0.005-1 | coral | $1.4 \times 10^{19}$ / 61 | HI NH₄F | 2 | 2.6 | 12 |
| Example 12 | 1.9 | | 0.5~20 | 0.005-1 | coral | $1.8 \times 10^{19}$ / 78 (mol %) | HI NH₄F | 2 | 1.9 | 16 |
| Example 13 | 1.8 | | 0.5~20 | 0.5-1 | coral | | HI NH₄F | 2 | 1.8 | 7 |
| Example 14 | 1.8 | | 0.5~20 | 0.5-1 | coral | | HI | 2.25 | 1.8 | 15 |
| Example 15 | 1.8 | 31~33 | 0.5~20 | 0.5-1 | coral | $3.0 \times 10^{19}$ / 148 | HF | 2.25 | 1.8 | 15 |
| Comparative Example 1 | 0.6 | | 0.1~20 | 0.02-0.03 | fumed | $1.7 \times 10^{20}$ / 760 | NH₄I, GaF₃ | 2.25 | 0.62 | 15 |
| Comparative Example 2 | 4.9 | | | No secondary particles | wafer | | NH₄I, GaF₃ | 2.25 | 4.9 | 15 |
| Comparative Example 3 | 1.8 | 46~49 | $1{\sim}5 \times 10^{-3}$ | | powdery | $1.0 \times 10^{21}$ / 4356 | NH₄Cl | 1.96 | 0.8 | 50 |
| Comparative Example 4 | 1.8 | 46~49 | $1{\sim}5 \times 10^{-3}$ | | powdery | $1.0 \times 10^{21}$ / 4356 | NH₄Cl | 1.96 | 0.8 | 50 |

TABLE 1-continued

| | Growth Pressure (MPa) | Time for Growth (day) | Growth Rate (μm/day) | | | Weight Increase by Growth (%) | | | discoloration | Grown Crystal | | | Dissolution Rate of Starting Material (%) |
|---|---|---|---|---|---|---|---|---|---|---|---|---|---|
| | | | m-axis | c-axis | a-axis | m-plane seed | c-plane seed | growth | | carrier concentration (atoms/cm$^3$) | oxygen concentration (atoms/cm$^3$) | Si concentration (atoms/cm$^3$) | |
| Example 1 | 260 | 14.7 | 37 | 325 | 73 | | | A (good) | A (only slightly) | | 1.26 × 10$^{18}$ | 5.47 × 10$^{17}$ | 69 |
| Example 2 | 210 | 9.8 | 320 | 660 | 1640 | | | A (good) | A (only slightly) | 1.5 × 10$^{19}$ (estimated) | | | 41 |
| Example 3 | 210 | 3< | 100–300 | 150–600 | 600–1500 | | | A (good) | B (discolored) | | | | |
| Example 4 | 210 | 11 | 115 | 155 | 636 | | | A (good) | A (only slightly) | | | | 36 |
| Example 5 | 210 | 3< | 100–300 | 150–600 | 600–1500 | | | A (good) | | | | | |
| Reference Example | 210 | 3< | 30–110 | 50–150 | 100–600 | | | A (good) | | | | | |
| Example 6 | 144 | 4 | 220 | 60 | 297 | 23 | 49 | A (good) | A (only slightly) | 1.90 × 10$^{18}$ | 2.20 × 10$^{18}$ | 1.14 × 10$^{15}$ | 85 |
| Example 7 | 215 | 16.8 | 230–550 | 550 | 550 | | | A (good) | A (only slightly) | 6.70 × 10$^{17}$ | 1.50 × 10$^{18}$ | 2.06 × 10$^{14}$ | 51 |
| Example 8 | 215 | 8 | 400 | 680 | 1860 | | | A (good) | A (only slightly) | 2.44 × 10$^{18}$ | 4.80 × 10$^{18}$ | — | 70 |
| Example 9 | 210 | 10 | 300 | 500 | 1300 | | | A (good) | A (only slightly) | 1.69 × 10$^{18}$ | 6.90 × 10$^{18}$ | 1.50 × 10$^{16}$ | 68 |
| Example 10 | 210 | 10.5 | 276 | 75 | 82 | | | A (good) | A (only slightly) | 1.70 × 10$^{18}$ | | | 64 |
| Example 11 | 215 | 15.8 | 245 | 138 | 138 | | | A (good) | B (discolored) | 3.09 × 10$^{18}$ | 9.90 × 10$^{18}$ | 7.40 × 10$^{14}$ | 46 |
| Example 12 | 215 | 15.7 | 350 | 290 | 318 | | | A (good) | A (only slightly) | 3.90 × 10$^{18}$ | 9.00 × 10$^{18}$ | 3.00 × 10$^{14}$ | 84 |
| Example 13 | 219 | 22.4 | 290 | 400 | 1000 | | | A (good) | B (discolored) | 9.54 × 10$^{18}$ | 2.00 × 10$^{19}$ | 5.00 × 10$^{14}$ | 61 |
| Example 14 | 208 | 23 | 320 | 660 | 1640 | | | A (good) | C (black) | 2.5 × 10$^{19}$ (estimated) | | | 33 |
| Example 15 | 210 | 9.8 | | | | | | A (good) | A (only slightly) | | | | |
| Comparative Example 1 | 210 | 3< | grew slightly (growth rate difficult to measure) | | | | | B (not good) | | | | | |
| Comparative Example 2 | 210 | 3< | grew slightly (growth rate difficult to measure) | | | | | B (not good) | | | | | |
| Comparative Example 3 | 139 | 4 | | | | 10 | 9 | B (not good) | C (black) | | | | 21 |
| Comparative Example 4 | 139 | 4 | | | | | 4 | B (not good) | C (black) | | | | 32 |

"*" in Table 1, two types of starting materials were mixed.

Example 2 and Example 4 where a fluorine or iodine-based mineralizing agent was used are compared. The growth rate in Example 4 where the GaN polycrystalline particle starting material having a larger bulk density was about ⅓ in the m-axis direction, about ¼ in the c-axis direction, and about ½.5 in the a-axis direction, and was lower in some degree. The reason would be because the bulk density of the starting material was large and therefore the convection flow of the ammonia solvent would be retarded, and because the dissolution of the starting material in the ammonia solvent would reduce. In addition, when the bulk density of the starting material is large as in Reference Example, the growth rate may lower; however, in this, the growth rate value is on the level fully satisfying the productivity. Further, when the bulk density of the starting material increases up to 4.9 g/cm$^3$ as in Comparative Example 2, the GaN crystal could grow little.

On the other hand, when the bulk density of the starting material is small as in Example 3, the amount of the charged starting material may be limited and therefore, the starting material would run out in the course of long-term crystal growth, and the apparent crystal growth rate would thereby lower. Further, when the bulk density of the starting material lowers to 0.6 g/cm$^3$ as in Comparative Example 1, the starting material runs out within a short period of time and therefore it would be difficult to produce a GaN crystal.

The case of using the GaN polycrystalline starting material having an angle of repose of from 31 to 33° confirmed a higher dissolution rate of the starting material after crystal growth and an increased crystal growth rate, as compared with the case of using the GaN powder crystal having an angle of repose of from 46 to 49°.

In Examples 7 to 10 and, the crystal was grown, using the GaN crystal starting material having a bulk density of from 1.8 to 2.2 g/cm$^3$ and an oxygen concentration of from 13 to 22 ppm. In Examples 7 to 10, the grown crystal had a carrier concentration of from $6.70\times10^{17}$ to $2.44\times10^{18}$ atoms/cm$^3$. In Examples 7 to 10, the activation ratio was within a range of from 22 to 86%.

In Example 15, the crystal was grown, using the GaN crystal starting material having a bulk density of 1.8 g/cm$^3$ and an oxygen concentration of 148 ppm. It could be gathered from the relationship between the oxygen concentration in the nitride crystal starting material and the carrier concentration in the grown crystal in Examples 7 to 10 as shown in FIG. 4, that a gallium nitride crystal having a carrier concentration of about $2.50\times10^{19}$ atoms/cm$^3$ would be formed in Example 15.

In Example 3, the crystal was grown, using the GaN crystal starting material having a bulk density of 0.8 g/cm$^3$ and an oxygen concentration of 130 ppm. It could be gathered from the relationship between the oxygen concentration in the nitride crystal starting material and the carrier concentration in the grown crystal in Examples 7 to 10 as shown in FIG. 4, that a gallium nitride crystal having a carrier concentration of about $1.50\times10^{19}$ atoms/cm$^3$ would be formed in Example 3.

Figure 5:
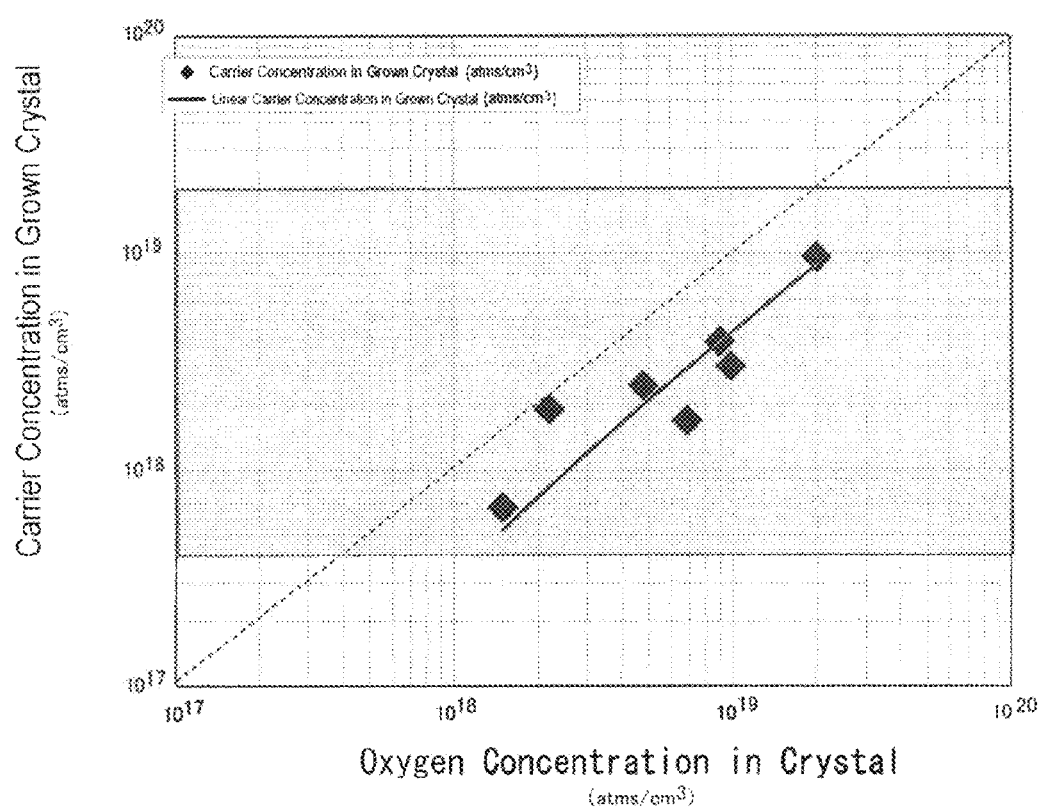
FIG. 5 is a graph showing a relationship between an oxygen concentration and a carrier concentration in a grown nitride crystal.

The results in Table 1 are shown in FIG. 4 and FIG. 5.

FIG. 4 is a graph showing the relationship between the oxygen concentration in the nitride crystal starting material and the carrier concentration in the grown gallium nitride crystal. The rhombic dots are the results in Examples 7 to 10 and 12; and the square dots are the results in Example 15 and Example 3. As shown by the approximate line in FIG. 4, it is known that the oxygen concentration in the starting material and the carrier concentration in the grown crystal bear a correlative relationship therebetween.

FIG. 5 is a graph showing the relationship between the oxygen concentration and the carrier concentration in the grown gallium nitride crystal. The each dot in FIG. 5 show the results in Examples 7 to 10 and 12 to 14. From FIG. 5, it is known that the mean value of the activation ratio is 45%.

For calculating the dopant activation ratio in the GaN crystal obtained according to an ammonothermal process, the carrier concentration and the oxygen concentration in the GaN crystal obtained according to the method in Example 9. In Example 13, the carrier concentration in the obtained crystal was $3.90\times10^{18}$ atoms/cm$^3$, and the oxygen concentration in the obtained crystal was $9.00\times10^{18}$ atoms/cm$^3$. In Example 14, the carrier concentration in the obtained crystal was $9.54\times10^{18}$ atoms/cm$^3$, and the oxygen concentration in the obtained crystal was $2.00\times10^{19}$ atoms/cm$^3$.

According to the second invention, a nitride crystal starting material having an oxygen concentration that falls within a specific range gives a nitride crystal having a desired carrier concentration. The oxygen doping condition in the second invention enables accurate oxygen doping. Accordingly, the production method of the second invention can be utilized for production of a nitride crystal according to an ammonothermal process, and the industrial applicability thereof is therefore on a high level.

While the present invention has been described in detail and with reference to specific embodiments thereof, it will be apparent to one skilled in the art that various changes and modifications can be made therein without departing from the spirit and scope thereof.

The present disclosure relates to the subject matter contained in U.S. Provisional Patent Application No. 61/552,801 filed Oct. 28, 2011, Japanese Patent Application No. 25711/2012 filed Feb. 9, 2012 and Japanese Patent Application No. 188099/2012 filed on Aug. 28, 2012, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

The invention claimed is:

1. A GaN starting material for producing a GaN crystal, comprising:
   a material having an angle of repose and comprising a plurality of polycrystalline GaN particles having a maximum diameter of from 0.5 to 1 mm,
   wherein the material has a bulk density of from 0.7 to 4.5 g/cm$^3$.

2. The GaN starting material according to claim 1, wherein the material comprises a plurality of particles formed through aggregation of the polycrystalline GaN particles having the maximum diameter of from 0.5 to 1 mm.

3. The GaN starting material according to claim 2, wherein the particles formed through aggregation have a maximum diameter of not smaller than 1 mm.

4. The GaN starting material according to claim 1, wherein the angle of repose is less than 45°.

5. The GaN starting material according to claim 1, wherein the bulk density is from 0.8 to 3.6 g/cm$^3$.

6. The GaN starting material according to claim 1, wherein the material has an oxygen concentration in a crystal of from 10 to 500 ppm.

7. The GaN starting material according to claim 1, wherein the bulk density is from 0.9 to 3.2 g/cm$^3$.

8. The GaN starting material according to claim 1, wherein the bulk density is from 1.0 to 3.0 g/cm$^3$.

9. The GaN starting material according to claim 1, wherein the bulk density is from 1.1 to 3.0 g/cm$^3$.

10. The GaN starting material according to claim 1, wherein the angle of repose is not smaller than 15°.

11. The GaN starting material according to claim 1, wherein the angle of repose is not smaller than 25°.

12. A method for producing a GaN crystal, comprising:
growing a GaN crystal in the presence of nitrogen in a supercritical state and/or a subcritical state and a GaN starting material which comprises a material having an angle of repose, having a bulk density of from 0.7 to 4.5 g/cm$^3$ and comprising a plurality of polycrystalline GaN particles having a maximum diameter of from 0.5 to 1 mm.

13. The method according to claim 12, wherein the material comprises a plurality of particles formed through aggregation of the polycrystalline GaN particles having the maximum diameter of from 0.5 to 1 mm.

14. The method according to claim 12, wherein the particles formed through aggregation have a maximum diameter of not smaller than 1 mm.

15. The method according to claim 12, wherein the angle of repose is less than 45°.

16. The method according to claim 12, wherein the bulk density is from 0.8 to 3.6 g/cm$^3$.

17. The method according to claim 12, wherein the material has an oxygen concentration in a crystal of from 10 to 500 ppm.

18. The method according to claim 12, wherein the bulk density is from 0.9 to 3.2 g/cm$^3$.

19. The method according to claim 12, wherein the bulk density is from 1.0 to 3.0 g/cm$^3$.

20. The method according to claim 12, wherein the bulk density is from 1.1 to 3.0 g/cm$^3$.

* * * * *